(12) United States Patent
Hirano et al.

(10) Patent No.: US 8,343,822 B2
(45) Date of Patent: *Jan. 1, 2013

(54) FLEXIBLE SEMICONDUCTOR DEVICE AND METHOD FOR MANUFACTURING SAME

(75) Inventors: Koichi Hirano, Osaka (JP); Seiichi Nakatani, Osaka (JP); Tatsuo Ogawa, Osaka (JP); Takashi Ichiryu, Osaka (JP); Takeshi Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 235 days.

This patent is subject to a terminal disclaimer.

(21) Appl. No.: 12/681,445

(22) PCT Filed: Jul. 30, 2009

(86) PCT No.: PCT/JP2009/003616
§ 371 (c)(1),
(2), (4) Date: Jun. 9, 2010

(87) PCT Pub. No.: WO2010/016207
PCT Pub. Date: Feb. 11, 2010

(65) Prior Publication Data
US 2010/0283054 A1  Nov. 11, 2010

(30) Foreign Application Priority Data
Aug. 4, 2008 (JP) .................. 2008-200766
Aug. 4, 2008 (JP) .................. 2008-200767

(51) Int. Cl.
*H01L 21/84* (2006.01)
*H01L 21/00* (2006.01)
(52) U.S. Cl. ........ 438/161; 438/149; 438/158; 438/159; 257/43; 257/57; 257/59; 257/E21.414; 257/E33.053
(58) Field of Classification Search ................. None
See application file for complete search history.

(56) References Cited

U.S. PATENT DOCUMENTS
2005/0162421 A1  7/2005  Yamazaki et al.
(Continued)

FOREIGN PATENT DOCUMENTS
JP    2003-258264    9/2003
(Continued)

OTHER PUBLICATIONS

Machine English Translation of Japanese Patent Kokai Publication No. 2003-258264, Sep. 2003.
Machine English Translation of Japanese Patent Kokai Publication No. 2005-123290, May 2005.
Machine English Translation of Japanese Patent Kokai Publication No. 2005-166742, Jun. 2005.

(Continued)

*Primary Examiner* — Zandra Smith
*Assistant Examiner* — Khanh Duong
(74) *Attorney, Agent, or Firm* — Wenderoth, Lind & Ponack, L.L.P.

(57) ABSTRACT

A method for manufacturing a flexible semiconductor device includes (i) forming an insulating film on the upper surface of metal foil, (ii) forming an extraction electrode pattern on the upper surface of the metal foil, (iii) forming a semiconductor layer on the insulating film such that the semiconductor layer is in contact with the extraction electrode pattern, (iv) forming a sealing resin layer on the upper surface of the metal foil such that the sealing resin layer covers the semiconductor layer and the extraction electrode pattern, and (v) forming electrodes by etching the metal foil, the metal foil being used as a support for the insulating film, the extraction electrode pattern, the semiconductor layer, and the sealing resin layer formed in (i) to (iv) and used as a constituent material for the electrodes in (v). The metal foil need not be stripped, and a high-temperature process can be used.

12 Claims, 37 Drawing Sheets

U.S. PATENT DOCUMENTS

| | | |
|---|---|---|
| 2005/0162578 A1 | 7/2005 | Yamazaki et al. |
| 2010/0012936 A1 | 1/2010 | Hirano et al. |
| 2011/0042677 A1* | 2/2011 | Suzuki et al. .................. 257/59 |

FOREIGN PATENT DOCUMENTS

| | | |
|---|---|---|
| JP | 2004-297084 | 10/2004 |
| JP | 2005-123290 | 5/2005 |
| JP | 2005-166742 | 6/2005 |
| JP | 2006-269475 | 10/2006 |
| JP | 2007-67263 | 3/2007 |
| JP | 2007-73857 | 3/2007 |
| WO | 2009/063583 | 5/2009 |
| WO | 2009/069248 | 6/2009 |

OTHER PUBLICATIONS

Machine English Translation of Japanese Patent Kokai Publication No. 2006-269475, Oct. 2006.
Machine English Translation of Japanese Patent Kokai Publication No. 2007-073857, Mar. 2007.
Machine English Translation of Japanese Patent Kokai Publication No. 2007-067263, Mar. 2007.
English translation of International Preliminary Report on Patentability (Chapter II) (in English), issued Apr. 21, 2011 in PCT/JP2009/003616.
International Search Report issued Sep. 1, 2009 in International (PCT) Application No. PCT/JP2009/003616.

* cited by examiner

Direction of electrode thickness

FLEXIBLE SEMICONDUCTOR DEVICE AND METHOD FOR MANUFACTURING SAME

TECHNICAL FIELD

The present invention relates to a flexible semiconductor device and a method for manufacturing the same. In particular, the present invention relates to a flexible semiconductor device which is capable to be used as a TFT (thin-film transistor), and a method for manufacturing the same.

BACKGROUND OF THE INVENTION

There is a growing need for a flat-panel display as an image display device with the wide spreading use of information terminals. In addition, there are increasing opportunities, in which information, which has been conventionally provided by paper medium, is digitized with further advancement of informatization. Particularly, the needs for an electronic paper or a digital paper as a thin and light weight mobile display media, which can be easily held and carried, are recently increased (see Patent document 1).

Generally, in a flat panel display device, its display medium is formed by using an element such as a liquid crystal, an organic EL (organic electroluminescence), and an electrophoresis. In such display media, a technology which uses an active drive element (TFT element) as an image drive element has become a mainstream in order to secure the homogeneity of screen luminosity and screen rewriting speed and so forth. In the conventional display device, such TFT elements are formed on a glass substrate, thereafter a liquid crystal element or an organic EL element and so forth is sealed.

As a TFT element, semiconductors including a-Si (amorphous silicon) and p-Si (polysilicon) can be mainly used. These Si semiconductors (together with metal films, as necessary) are multilayered, and each of a source electrode, a drain electrode and a gate electrode is sequentially stacked on a substrate, thereby a TFT element is manufactured.

In the conventional process of manufacturing a TFT element using Si materials includes one or more steps using a high temperature, so that an additional restriction that the material of the substrate should resists a high process temperature comes to be added. For this reason, there is no way to select a glass as the material of the substrate in practice. In the meanwhile, it is possible to use a quartz substrate. However a quartz substrate is so expensive that an economical problem arises in scaling up of the display panels using a quartz substrate. Therefore, a glass substrate is generally used as a substrate for forming such TFT elements.

However, when the thin display panel described above is constituted using the conventionally known glass substrate, there is a possibility that such a display panel has a heavy weight, lacks a flexibility and breaks due to a shock when it would be fallen down. These problems, which arose from the formation of a TFT element on a glass substrate, are not desirable to meet the needs for a portable thin display having light weight with the advancement of informatization.

From the standpoint of a substrate having flexibility and light weight so as to meet the needs for a portable thin display having light weight, development of a flexible semiconductor device wherein TFT elements are formed on a resin substrate (plastic substrate) has been carried out. For example, Patent document 2 discloses a technique in which a TFT element is formed on a substrate (for example, glass substrate) by a process which is almost the same as conventional process, and then the TFT element is peeled from the glass substrate and transferred onto a resin substrate. In this technique, a TFT element is formed on a glass substrate and is adhered to a resin substrate via a sealing layer using such as an acrylic resin, and then the glass substrate is peeled off and the TFT element is transferred onto the resin substrate, thereby a semiconductor device is obtained.

PATENT DOCUMENTS

[Patent document 1] Japanese Unexamined Patent Publication (Kokai) No. 2007-67263,
[Patent document 2] Japanese Unexamined Patent Publication (Kokai) No. 2004-297084,

SUMMARY OF THE INVENTION

Problems to be Solved by the Invention

However, in the method for manufacturing a TFT element using such a transference process, there is a problem in the peeling process of the substrate (for example, glass substrate). That is, it is necessary to perform a treatment to decrease the adhesion between the substrate and a TFT element in the process of peeling the substrate from the resin substrate. Additionally, it is necessitated to perform a treatment to form a peel layer between the substrate and the TFT element and to physically or chemically remove the peel layer. Thus, the method has a complicated processes, so that another problem relating to productivity is resulted therefrom.

As a method for forming a TFT element on a resin substrate, other than the above mentioned transference process, for example, there is a method wherein a TFT element is directly formed on a resin substrate. However, since the resin substrate has an inferior heat resistance, it is necessary to limit the process temperature to a low temperature. Therefore, the TFT element directly formed on the resin substrate comes to have inferior properties compared with the TFT element formed on the glass substrate. That is, it is difficult to obtain a desired TFT properties and reliability in the actual condition.

The inventors of the present application tried to dissolve such problems not by following up the conventional way, but by focusing on a new way. The present invention has been accomplished in view of the above matters, and a main object of the present invention is to provide a flexible semiconductor device which is excellent in productivity and has high properties and a method for manufacturing the same.

Means for Solving the Problem

In order to solve the above-mentioned problems, the present invention provides a method for manufacturing flexible semiconductor device comprising the steps of:

(i) forming an insulating film on the upper surface of a metal foil, (ii) forming one or more patterns of source/drain extraction electrodes on the upper surface of the metal foil, (iii) forming a semiconductor layer on the insulating film so that the semiconductor layer contacts with the patterns of extraction electrodes, and (iv) forming a sealing resin layer on the upper surface of the sealing resin film so that the sealing resin layer covers the semiconductor layer and the patterns of extraction electrodes, (v) forming an electrode from the metal foil by etching the metal foil wherein the above metal foil is not only used as a substrate for the insulation film, the extraction electrode pattern, the semiconductor layer and the sealing resin layer each of which is formed by any of the steps (i) to (iv), but also used as the constituent material of the above electrode in the step (v).

The present invention is characterized in that a metal foil, which functioned as a support during the forming steps of the flexible semiconductor device, is used for an electrode constituent material which is a constituent element of the flexible semiconductor device.

The term "flexible" of the "flexible semiconductor device" used in the present description substantially means that the semiconductor device has a flexibility in which the semiconductor device can be inflected. The "flexible semiconductor device" in the present invention may be mentioned as a "flexible semiconductor device" or a "flexible semiconductor element", in view of the structure of the invention.

The phrase "electrode constituent material" used in the present description substantially means a material of a member which can form electrodes (for example, a "source electrode", a "drain electrode" and a "gate electrode" and so forth, which are mentioned later) that constitute a TFT element by subjecting to a treatment such as an etching treatment.

Since the present invention uses a metal foil, the forming step of the semiconductor layer is capable to be carried out through a high temperature process at a temperature not less than 180° C., preferably a temperature range of from about 400° C. to 1000° C. It is also capable to subject the produced semiconductor layer to a heat-treatment since a metal foil is used therein. In this case, it is preferred to perform a thermal annealing treatment and/or a laser annealing treatment as the heat-treatment. Crystallization of the semiconductor material is promoted by such a heat-treatment.

In one preferred embodiment, the source electrode and a drain electrode used as a component of a TFT element are formed by etching of metal foil of process (v). In this case, a gate electrode may be formed by etching of metal foil in the same way as the formation of the source electrode and the drain electrode. Thereby, each of the source electrode, the drain electrode and the gate electrode can be formed to be located on a surface plane flush with each other, which is specifically the lower surface plane of the sealing resin layer which seals the insulating film, the semiconductor layer, and the patterns of extraction electrodes therein. Alternatively, the gate electrode can be formed so that it is located on a surface plane which is not flush with the surface plane of the source electrode and the drain electrode. In such a case, the gate electrode is preferably formed by forming another metal foil on the upper surface of the sealing resin layer, followed by etching the metal foil. Not only the source electrode, the drain electrode and the gate electrode, but also an electrode layer of a capacitor may be additionally formed by etching the metal foil.

In another preferred embodiment, the present method for manufacturing the flexible semiconductor device may comprise, instead of the steps (ii) and (iii), (ii)' forming a semiconductor layer on the insulating film, and (iii)' forming one or more patterns of source/drain extraction electrodes on the upper surface of the metal foil so that the patterns of extraction electrodes contact with the semiconductor layer.

The present invention also provides a method for manufacturing a flexible semiconductor device which has a plurality of TFT elements. Such a method relates to a method for manufacturing a flexible semiconductor device comprising least two TFT elements each of which comprises an insulating film, a semiconductor layer, a gate electrode, a source electrode, a drain electrode and one or more patterns of source/drain extraction electrodes, comprising the steps of:

(a) supplying a first metal foil having a TFT element formation side on which a semiconductor layer and an insulating film and one or more patterns of source/drain extraction electrodes constituting a first TFT element are formed wherein the semiconductor layer is provided on the insulating film so that the semiconductor layer is in contact with the extraction electrodes, a second metal foil having a TFT element formation side on which a semiconductor layer, an insulating film and one or more patterns of source/drain extraction electrodes constituting a second TFT element are formed wherein the semiconductor layer is provided on the insulating film so that the semiconductor layer is in contact with the extraction electrodes, and a sealing resin film;

(b) laminating the TFT element formation side of the first metal foil onto one side of the sealing resin film, thereby embedding the semiconductor layer, the insulating film and the extraction electrodes constituting the first TFT element into the sealing resin film from one side thereof;

(c) laminating the TFT element formation side of the second metal foil onto the other side of the sealing resin film, thereby embedding the semiconductor layer, the insulating film and the extraction electrodes constituting the second TFT element into the sealing resin film from the other side thereof; and (d) etching the first metal foil and the second metal foil, thereby forming an electrode of the first TFT element and an electrode of the second TFT element;

wherein the first metal foil is used as a substrate of the semiconductor layer, the insulating film and the extraction electrodes constituting the first TFT element during the above steps (a) to (c) and also used as a constituent material for the electrode of the first TFT element during the above step (d); and wherein the second metal foil is used as a substrate the semiconductor layer, the insulating film and the extraction electrodes constituting the second TFT element during the above steps (a) to (c) and also used as a constituent material for the electrode of the second TFT element during the above step (d).

The method for manufacturing such a flexible semiconductor device comprising a plurality of TFT elements is characterized in that the method uses the metal foil which functioned as a substrate during the forming steps of the flexible semiconductor device, is used for an electrode constituent material which is a constituent element of the flexible semiconductor device.

In one preferred embodiment, in the step (d), a drain electrode and a source electrode constituting the first TFT element and a gate electrode constituting the second TFT element are formed by etching the first metal foil, and a gate electrode constituting the first TFT element and a drain electrode and a source electrode constituting the second TFT element are formed by etching the second metal foil.

In another suitable embodiment, in the step (d), each of a drain electrode, a source electrode and a gate electrode constituting the first TFT element is formed by etching the first metal foil, and each of a drain electrode, a source electrode and a gate electrode constituting the second TFT element is formed by etching the second metal foil.

The present invention also provides a flexible semiconductor device produced by the above manufacturing method. The flexible semiconductor device of this present invention produced by the above method comprises an insulating film,
a semiconductor layer which is formed on the upper surface of the insulating film,
one or more electrodes located at the lower surface side of the insulating film,
one or more patterns of source/drain extraction electrodes which electrically connect the electrode with the semiconductor layer, and
a sealing resin layer which seals the patterns of extraction electrodes and the semiconductor layer
wherein the electrode is provided by etching the metal foil which functioned as a substrate for each of the insulating film, the semiconductor layer, the patterns of extraction electrodes and the sealing resin layer.

The flexible semiconductor device of the present invention is characterized by having one or more electrodes which are formed by etching a metal foil, which foil functioned as a substrate during the forming steps of the flexible semiconductor device. Due to having such a feature, the flexible semiconductor device of the present invention preferably has one or more electrodes having a tapered shape in the direction of thickness thereof. In addition, the electrode preferably has a thickness, which is larger than that of the electrodes produced by the conventional method of forming electrodes (for example, vapor deposition and sputtering), for example in a range from 4 μm to about 20 μm.

In one preferred embodiment of the flexible semiconductor device of the present invention, electrodes formed by etching metal foil are the source electrode, the drain electrode and the gate electrode, and the source electrode, the drain electrode and the gate electrode are located on a surface plane flush with each other. That is, the source electrode and the drain electrode are located on a surface plane flush with the gate electrode. In another suitable embodiment, a gate electrode is located on a surface plane which is not flush with the surface plane of the source electrode and the drain electrode. In such an embodiment, preferably, the electrodes, which are formed by etching the metal foil located on the lower surface of the insulating film, are the source electrode and the drain electrode, while the electrode, which is formed by etching another metal foil located on the upper surface of the sealing resin layer so as to oppose to the semiconductor layer across the sealing resin layer, is the gate electrode.

In the case where the electrodes, which are formed by etching the metal foil, are the source electrode and the drain electrode, the lower surface of the circumferential portion of the semiconductor layer may contact with the upper surface of the circumferential portion of the patterns of the source extraction electrodes, and the lower surface of the circumferential portion of the semiconductor layer may contact with the upper surface of the circumferential portion of the patterns of the drain extraction electrodes, In a suitable embodiment of the flexible semiconductor device of the present invention, the device has at least two TFT elements each of which comprise an insulating film, a semiconductor layer, a gate electrode, a source electrode and a drain electrode. That is, with reference to the above-mentioned manufacturing method, a "flexible semiconductor device which has at least two TFT elements" may be equivalent to the semiconductor device which has at least the first TFT element and the second TFT element, each of which comprises an insulating film, a semiconductor layer, a gate electrode, a source electrode, and a drain electrode.

Effect of the Invention

According to the manufacturing method of the flexible semiconductor device of the present invention, an insulating film and a semiconductor layer are formed on a metal foil, a sealing resin layer is formed on the metal foil so as to cover the semiconductor layer, and then the metal foil is subjected to etching thereby obtaining one or more electrodes of a TFT element. Thus, the metal foil, which functions as a substrate (i.e. a support), can be used as each of electrodes (i.e. the source electrode, the drain electrode and the gate electrode). This means that there is no need to finally peel the metal foil which is the substrate. Consequently, the TFT element can be produced in a simple process and thus an improved productivity can be achieved.

In addition, since the insulating film and the semiconductor layer are formed on the metal foil and then the sealing resin layer can be formed on the metal foil, a high temperature process can be positively introduced into the production of the insulating film and the semiconductor layer. As a result, for example, a heat-treatment can be performed during or after the forming process of the semiconductor layer, and thereby the TFT properties (e.g. carrier mobility in a semiconductor) can be preferably improved.

DETAILED DESCRIPTION OF THE INVENTION

Figure 1A:
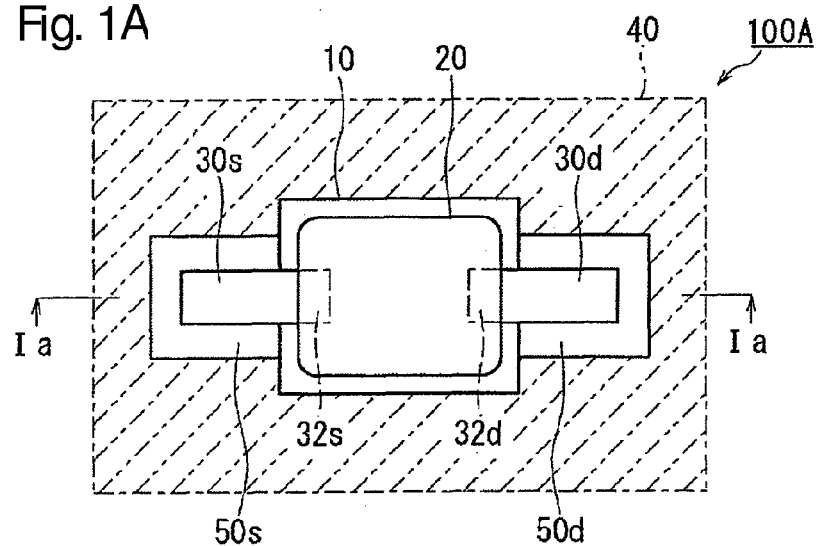
FIG. 1(a) shows a top plan view of the flexible semiconductor device 100A.

Hereinafter, some embodiments of the present invention are illustrated with reference to Figures. In the following Figures, the same reference numeral indicates the element which has substantially the same function for simplified explanation. The dimensional relationship (length, width, thickness and so forth) in each Figure does not reflect a practical relationship thereof.

Each "direction" referred to in the present description means the direction based on the spatial relationship between the metal foil 50 and the semiconductor layer 20, in which each of upward direction and downward direction is mentioned relating to the direction in the figures for convenience. Specifically, each of upward direction and downward direction corresponds to the upward direction and downward direction in each figure. The side on which the insulating film 10 or the semiconductor layer 20 is formed based on the metal foil 50 is referred to as "upward direction" and the side on which the semiconductor layer 20 is not formed based on the metal foil 50 is referred to as "downward direction."

Flexible Semiconductor Device Obtained from the Manufacturing Method of the Present Invention At first, a typical example of the flexible semiconductor device of the present invention, which is obtained from the manufacturing method of the present invention, will be briefly described with reference to FIGS. 1 and 2. FIG. 1 schematically shows a flexible semiconductor device 100A, in which the source electrode 50s, the drain electrode 50d and the gate electrode 50g are located on the same plane (i.e. located on a surface plane flush with each other). FIG. 2 schematically shows a flexible semiconductor device 100B, in which the gate electrode 50g is located on a surface plane which is not flush with the surface plane of the source electrode 50s and the drain electrode 50d.

Figure 1B:
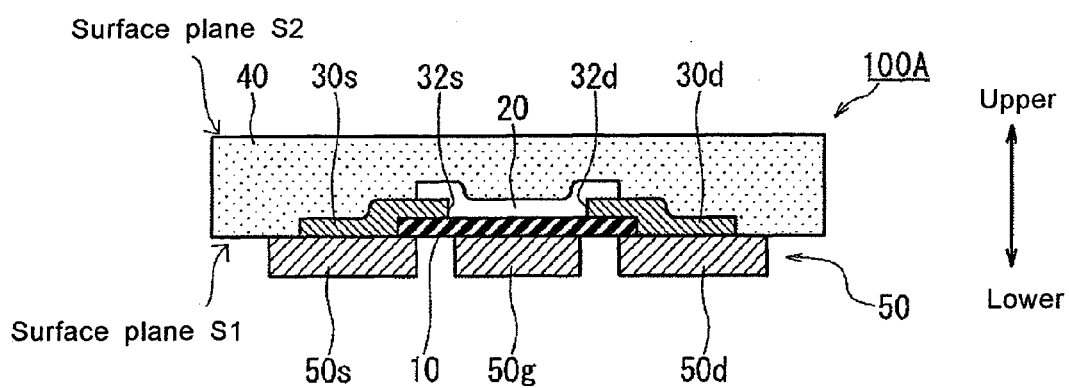
FIG. 1(b) shows a cross sectional view taken along line Ia-Ia in FIG. 1(a).
Figure 2A:
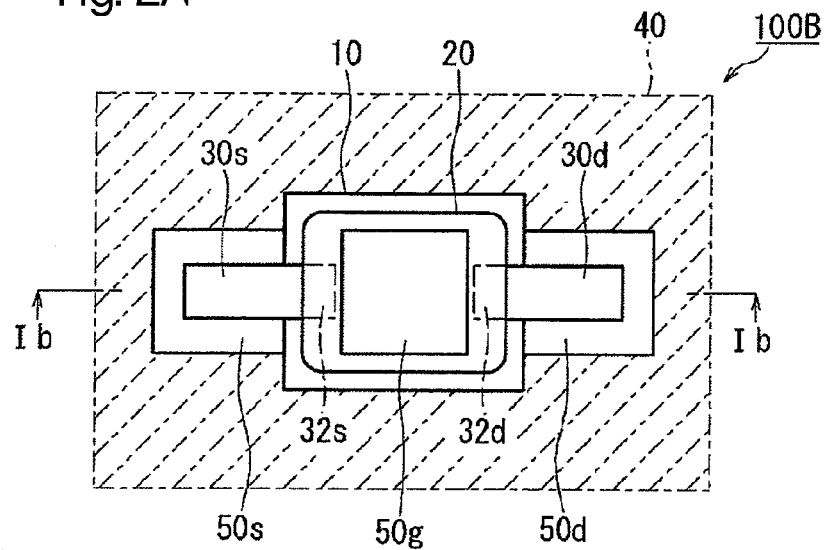
FIG. 2(a) shows a top plan view of the flexible semiconductor device 100B.
Figure 2B:
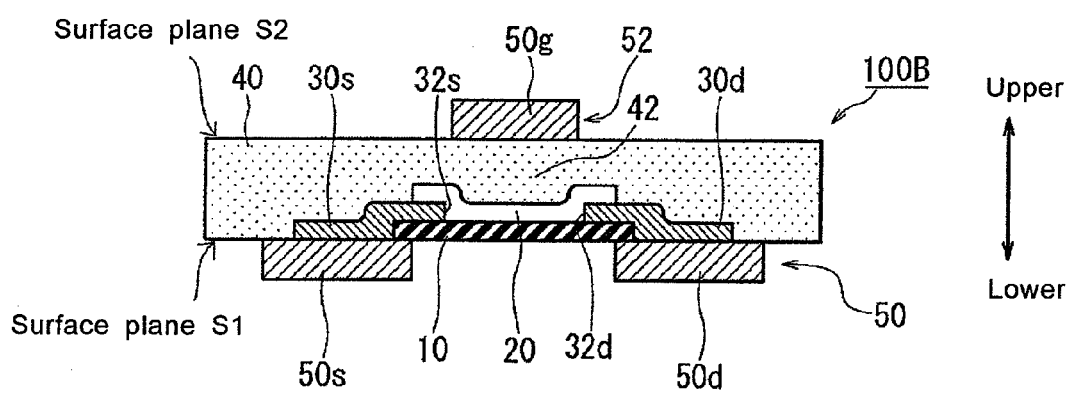
FIG. 2(b) shows a cross sectional view taken along line Ib-Ib in FIG. 2(a).

As shown in FIGS. 1(b) and 2(b), each of the flexible semiconductor devices 100A and 100B comprises a semiconductor layer 20, an insulating film (protection layer) 10, a source electrode 50s, a drain electrode 50d, a source extraction electrode 30s, a drain extraction electrode 30d and a gate electrode 50g, which constitute a TFT. These various elements are stacked on each other, and the insulating film, the semiconductor layer and the patterns of extraction electrodes (10, 20, 30s, 30d) are sealed by the sealing resin layer 40.

More specifically, each of the flexible semiconductor devices 100A and 100B shown in FIG. 1 and FIG. 2 comprises the insulating film 10, the source electrode 50s and the drain electrode 50d which were formed by etching the metal foil 50 located on the lower surface of the insulating film 10, the semiconductor layer 20 partially formed on the upper surface of the insulating film 10, and each of the patterns of extraction electrodes 30s and 30d for the source electrode 50s and the drain electrode 50d. The sealing resin layer 40 is provided so that it seals each of the patterns of the source/drain extraction electrodes 30s and 30d, the semiconductor layer 20 and the insulating film 10. Herein, in the flexible semiconductor devices 100A shown in FIG. 1, the gate electrode 50g is formed on the surface of the sealing resin layer 40, the surface being flush with the surface plane S1 whereon both of the source electrode 50s and the drain electrode 50d are formed. On the other hand, in the flexible semiconductor devices 100B shown in FIG. 2, the gate electrode 50g is formed on the surface plane S2 of the sealing resin layer 40, which is not flush with the surface plane S1 whereon both of the source electrode 50s and the drain electrode 50d are formed.

Each of component elements is explained in sequence. The insulating film 10 functions as a protection layer to protect the semiconductor layer 20. As the insulating film 10, a film based on an inorganic insulator or based on a resin having an insulating property is used. An example of the inorganic insulator includes a tantalic oxides. An example of the resin having an insulating property includes a polyphenylene ether resin.

The semiconductor layer 20 is formed on the insulating film 10. As illustrated, for example shown in FIG. 1(b) or 2(b), the semiconductor layer 20 is partially formed (at the center in FIG. 1) on the upper surface of the insulating film 10, so that the semiconductor layer 20 covers each of the extended parts 32s and 32d of the extraction electrodes 30s and 30d. In other word, the semiconductor layer 20 stacked on the insulating film 10 has a lower surface at the circumferential portion thereof, which partially contacts with the upper surface at the circumferential portion of the patterns of the source/drain extraction electrodes 30s and 30d for the source electrode and the drain electrode. Examples of the semiconductor layer 20 include the semiconductor layer comprising silicon (e.g., amorphous silicon) and an oxide semiconductor layer (e.g., oxide semiconductor layer comprising a zinc oxide).

Each of the patterns of extraction electrodes 30s and 30d contact with the semiconductor layer 20. That is, each of a part 32s of the extraction electrode 30s and a part 32d of the extraction electrode 30d extends over the upper surface of the insulating film 10 so that it contacts with the semiconductor layer 20. It is capable to actuate the flexible semiconductor device 100, even if these extended parts 32s and 32d are absent. However, it becomes possible to shorten the channel length (i.e. the distance between the extraction electrode 30s and the extraction electrode 30d) by providing the extended parts 32s and 32d, and thereby an improvement of the performance speed of the device is achieved. Meanwhile, as the material of the patterns of extraction electrodes 30s and 30d, various suitable materials such as a metallic material and an electrically-conductive oxide (e.g. $RuO_2$) may be used.

The sealing resin layer 40 is formed such that it covers the semiconductor layer 20, the insulating film 10, and the patterns of extraction electrodes 30s and 30d. The sealing resin layer 40 has a flexibility so that it is capable to "seal" the underneath layers as the name suggests. As the material for the sealing resin layer 40, a resin material having flexibility after being cured is preferable. Examples of such a resin material include polyphenylene ether resin and polyethylene naphthalate resin.

Each of the source electrode 50S and the drain electrode 50d is formed below the insulating film 10. In other word, each of the source electrode 50S and the drain electrode 50d is formed on the lower surface S1 of the sealing resin layer 40 which seals the insulating film 10, the semiconductor layer 20 and the patterns of extraction electrodes 30s and 30d. Each of the source electrode 50S and the drain electrode 50d is formed by etching the metal foil which functioned as a substrate for supporting layers (10, 20, 30s, 30d, 40) which constitute a TFT during the manufacturing steps of the flexible semiconductor device. Example of the constituent material of such electrodes includes a metal material with a good electric conductivity, for example copper (Cu).

The electrode which constitutes a TFT element, includes, in addition to the source electrode 50S and the drain electrode 50d, the gate electrode. As illustrated in FIG. 1, the gate electrode 50g of the flexible semiconductor device 100A is formed on the surface plane S1 whereon both of the source electrode 50s and the drain electrode 50d are formed. In other words, the gate electrode 50g is flush with the source electrode 50s and the drain electrode 50d in the flexible semiconductor device 100A. Such a gate electrode 50g can be formed by etching the same metal foil as the metal foil used for formation of the source electrode 50S and the drain electrode 50. On the other hand, the gate electrode 50g of the flexible semiconductor device 100B shown in FIG. 2 is formed on the surface plane which is not flush with the surface plane whereon both of the source electrode 50s and the drain electrode 50d are formed. Specifically, the gate electrode 50g of the flexible semiconductor device 100B is formed on the sealing resin layer 40 such that the gate electrode 50g is located above the semiconductor layer 20. In other words, the gate electrode 50g shown in FIG. 2 is located so as to oppose to the semiconductor layer across the sealing resin layer 40. The gate electrode 50g shown in FIG. 2 can be formed by etching the metal foil which has been additionally provided on the upper surface of the sealing resin layer 40. It is preferred that the constituent material of the gate electrode 50g has a good electric conductivity. Thus, examples of the constituent material of the gate electrode 50g include copper (Cu) and suitable material similar to those of the source electrode 50s and the drain electrode 50d.

Figure 3A:
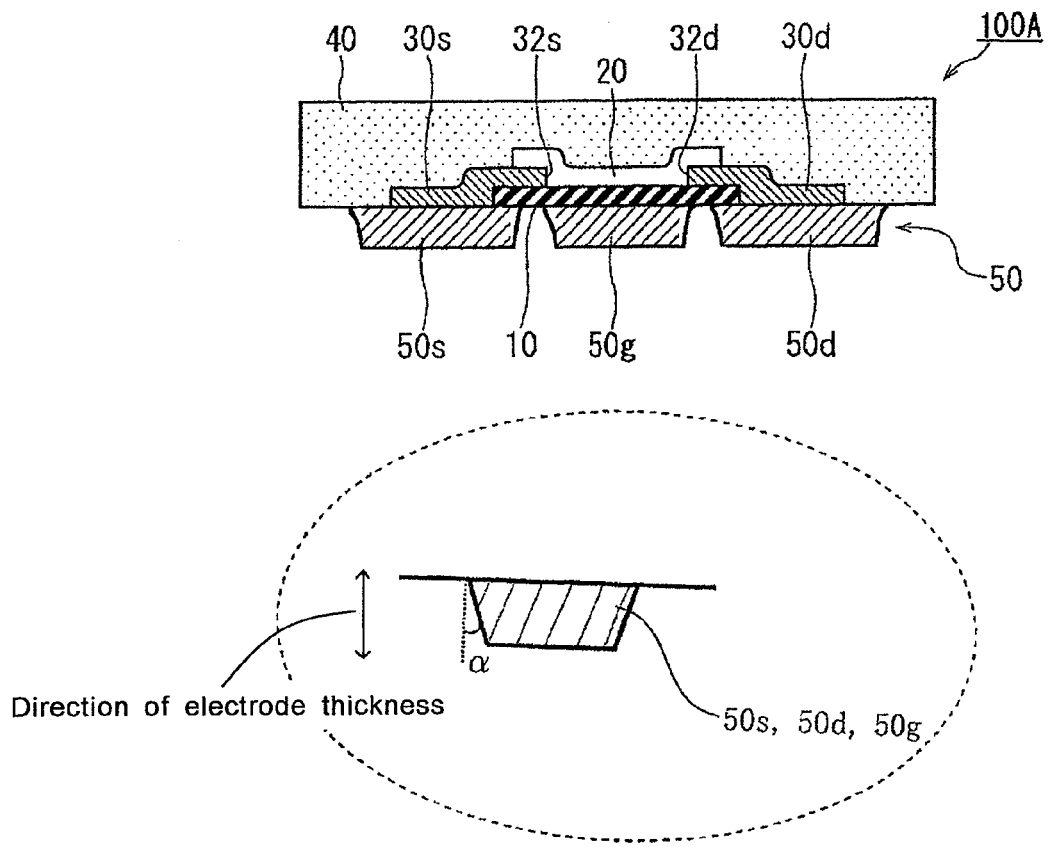
FIG. 3 schematically shows an electrode which has a tapered shape.
Figure 3B:
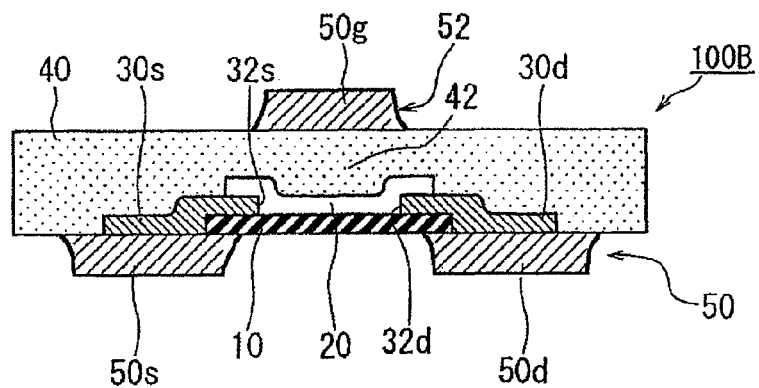

Each of the electrodes constituting a TFT element (i.e. the source electrode 50s, the drain electrodes 50d and the gate electrode) may have a tapered shape in the direction of thickness thereof since they are obtained by subjecting a metal foil to an etching process (see FIG. 3). As for the electrode with a tapered shape in the direction of thickness thereof, the taper angle α (see FIG. 3) may be in the range of from about 1 degree to about 60 degrees, for example, from about 5 degrees to about 30 degrees. In such a case where the electrodes of a TFT element have a tapered shape, a pattern step coverage can be improved upon sealing and protecting the electrodes and the wiring pattern by an insulating film, and thus a high reliability can be achieved. Each electrode of the flexible semiconductor device of the present invention has a thickness which is larger than that of the electrodes produced by the conventional method of forming electrodes (i.e. vapor deposition and sputtering), the thickness of the conventional electrode being for example about 0.1 micrometer. The reason for this is that each electrode of the flexible semiconductor device of the present invention (i.e. the source electrode 50s, the drain electrodes 50d and the gate electrode) is provided by subjecting a metal foil to an etching process. For example, each electrode of the flexible semiconductor device of the present invention is in the range of from 4 μm to about 20 μm. As a result, the resistance of the electrodes would be easily decreased according to the present invention. In addition, a desirable thickness of each electrode can be easily provided by changing the thickness of the metal foil to be used. As a result, the degree of freedom of electrode designing is increased, so that desired TFT properties can be more easily obtained.

A Manufacturing Method of the Present Invention

Next, with reference to the drawings, the method of manufacturing the flexible semiconductor device of the present invention will be explained. In addition, the flexible semiconductor device will be also explained together with the explanation of the manufacturing method.

Embodiment 1

Figure 4A:
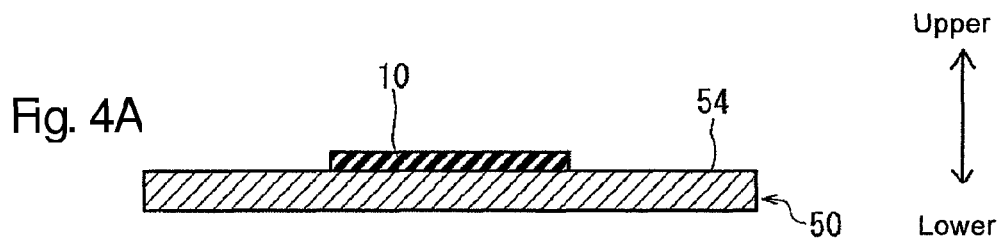
FIGS. 4(a) to 4(e) show a process sectional view, which schematically shows each of manufacturing steps of the flexible semiconductor device 100A of the present invention.

As Embodiment 1, the manufacturing method of the flexible semiconductor device 100A will be described with reference to FIGS. 4(a) to 4(e). In the manufacturing method of the present invention, the step (i) is carried out at first. That is, as shown in FIG. 4(a), the insulating film 10 is formed on the upper surface 54 of the metal foil 50. As mentioned above, the metal foil 50 not only serves as a substrate for supporting the insulating film, the patterns of extraction electrodes, the semiconductor layer and/or the sealing resin layer during the manufacturing steps, but also serves as the constituent material of the electrodes of the TFT element. From this viewpoint, it is preferred that the metal which constitutes the metal foil 50 is a metal with an electric conductivity and relatively high melting point. For example, copper (Cu, melting point: 1083° C.), nickel (Ni, melting point: 1453° C.), aluminum (Al, melting point: 660° C.) and stainless steel (SUS) may be used. It is also preferred that the metal foil 50 has a thickness of from about 4 µm to about 20 µm, more preferably from about 8 µm to about 16 µm, for example, about 12 µm.

The insulating film 10 to be formed on the metal foil 50 is an insulating film 10 based on an inorganic insulator, for example. As an example of the insulating film 10 based on an inorganic insulator, a film may be formed of metal oxides, for example, tantalic oxide (e.g. $Ta_2O_5$), aluminum oxide (e.g. $Al_2O_3$), silicon oxide (e.g. $SiO_2$), zeolite oxide (e.g. $ZrO_2$), titanium oxide (e.g. $TiO_2$), yttrium oxide (e.g. $Y_2O_3$), lanthanum oxide (e.g. $La_2O_3$) and hafnium oxide (e.g. $HfO_2$) or nitride of those metals and so forth. A film which comprises dielectric materials such as barium titanate ($BaTiO_3$), strontium titanate ($SrTiO_3$), or calcium titanate ($CaTiO_3$) may also be used. Moreover, the insulating film 10 may also be an insulating film based on a resin. As an example of the insulating film 10 based on a resin, a film may be formed of an epoxy resin, polyimide (PI) resin, polyphenylene ether (PPE) resin, polyphenylene oxide resin (PPO), polyvinyl pyrrolidone (PVP) resin and so forth. Considering that the inorganic insulator has a dielectric constant higher than that of the insulating resin, the inorganic insulator is preferably used as the material of the gate dielectric film of the flexible semiconductor device.

Formation of the insulating film 10 onto the upper surface of the metal foil 50 is not particularly restricted. In this regard, since the metal foil 50 (for example, copper foil) with a high melting point is used as the substrate, the insulating film 10 can be formed through an elevated-temperature process according to the present invention. For example, the insulating film 10 which consists of metal oxides can be formed by applying precursor material (e.g. an organic metal) to the desired position of the metal foil (copper foil) 50, followed by calcinating it at a high temperature of 800° C. Alternatively, for the purpose of providing the insulating film 10, an inorganic insulator can be formed on the desired position of the metal foil 50 by a thin film forming process such as the sputtering process using a mask. The insulating film 10 preferably has a thickness, which may vary depending on the required TFT properties and so forth, of about 2 µm or less, preferably from about 0.1 µm to about 2 µm, more preferably from about 0.2 µm to about 1 µm. Just as an example, tantalic oxide ($Ta_2O_5$) with a thickness of 0.3 µm may be formed on the desired position of the metal foil 50 by the sputtering process.

The step (i) is followed by the step (ii). That is, as shown in FIG. 4(b), one or more patterns of the source extraction electrode 30s and one or more patterns of the drain extraction electrode 30d are formed on the upper surface 54 of the metal foil 50.

Examples of the material of the extraction electrodes 30s and 30d include a metal material such as gold (Au), silver (Ag), copper (Cu), nickel (Ni), chromium (Cr), cobalt (Co), magnesium (Mg), calcium (Ca), platinum (Pt), molybdenum (Mo), iron (Fe), zinc (Zn), titanium (Ti) and tungsten (W), and a electrically-conductive oxides such as tin oxide ($SnO_2$), indium tin oxide (ITO), fluorine doped tin oxide (FTO), ruthenium oxide ($RuO_2$), iridium oxide ($IrO_2$) and platinum oxide ($PtO_2$) and so forth.

The process of forming the patterns of extraction electrodes 30s and 30d is not particularly restricted. In this regard, since the metal foil 50 (for example, copper foil) with a high melting point is used as the substrate according to the present invention, the patterns of extraction electrodes 30s and 30d can be formed through an elevated-temperature process. For the purpose of forming the patterns of extraction electrodes 30s and 30d, a vacuum deposition process or a sputtering process can be easily carried out, for example. Instead of the vacuum deposition process or sputtering process, another process may also be carried out. For example, the process of printing an organic metal paste followed by hardening thereof or a process of printing nano metal-particles ink with an inkjet technique, followed by calcinating thereof can be employed.

Figure 4B:
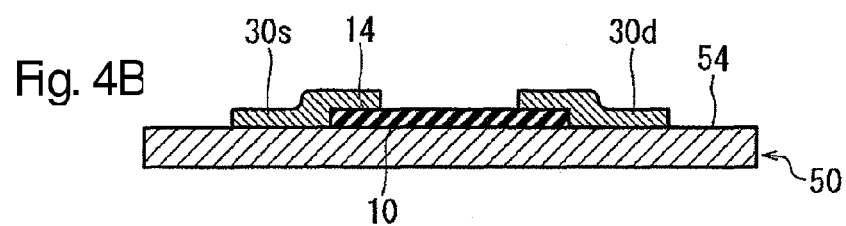

Each of the patterns of extraction electrodes 30s and 30d is preferably stacked on the upper surface 54 of the metal foil 50, so that the patterns of extraction electrodes may partially overlap with the insulating film 10 as shown in FIG. 4(b). That is, it is preferable to form the patterns of the source/drain extraction electrodes 30s and 30d over the metal foil 50 such that any part of the patterns of extraction electrodes extends onto the upper surface of the metal foil 50. Each of the patterns of extraction electrodes 30s and 30d has a thickness of preferably from about 50 nm to about 150 nm, more preferably from about 80 nm to about 120 nm. Just as an example, the patterns of extraction electrodes 30s and 30d may be formed by a performance of a sputtering process, and thereby by stacking a layer of $RuO_2$ with a thickness of 100 nm onto the insulating film 10 so that a part of film is covered with the layer of $RuO_2$.

Figure 4C:
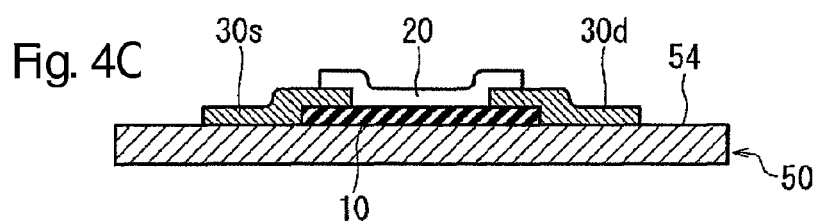

The step (ii) is followed by the step (iii). That is, as shown in FIG. 4(c), the semiconductor layer 20 is formed on the insulating film 10. In this regard, the semiconductor layer 20 is formed so that the semiconductor layer 20 contacts with the patterns of the source/drain extraction electrodes 30s and 30d. As the semiconductor which constitutes the semiconductor layer 20, suitable various materials may be used. For example, semiconductors made of such as silicon (e.g. Si) and germanium (Ge), or an oxide semiconductor may be used. Examples of the oxide semiconductor to be used includes oxides of an elementary substance such as zinc oxide (ZnO), tin oxide ($SnO_2$), indium oxide ($In_2O_3$) and titanium oxide ($TiO_2$), and a composite oxides such as InGaZnO, InSnO, InZnO and ZnMgO. Alternatively, a compound semiconductor (e.g. GaN, SiC, ZnSe, CdS or GaAs semiconductor), or an organic semiconductor (e.g. pentacene, poly-3-hexylthiophene, a porphyrin derivative, copper phthalocyanine or C60 semiconductor) may also be used as needed.

Formation of the semiconductor layer 20 can be performed for example by depositing a semiconductor material onto a desired position of the insulating film 10. The deposition of the semiconductor material can be suitably performed for example by a vacuum deposition process, the sputtering process, a plasma CVD process and so forth. Just as an example, a silicon film is deposited to the desired position of the insulating film 10 which was formed on the metal foil 50 that was heated up to a temperature of 350° C. by the plasma CVD process, and thereafter the deposited silicon film is subjected to a thermal annealing treatment at a temperature of 600° C. in an inert atmosphere (typically in non-oxidizing atmosphere) to produce a polysilicon.

Thus, according to the present invention, since the metal foil 50 (for example, copper foil) with a high melting point is used as a substrate, the semiconductor layer 20 can be formed by an elevated-temperature process. To put it in another way, in a case where a substrate made of resin (plastic) is used and a semiconductor layer is directly formed on the resin substrate, the heat resistance of the resin substrate is low, and thus a process temperature is required to be low. However, according to the manufacturing method of present invention concerning this embodiment, in spite of using the sealing resin layer 40 with a low heat resistance as a substrate, the semiconductor layer 20 can be formed at an elevated process temperature beyond the heat-resistant temperature of the sealing resin layer 40. For example, even if it is a case where a PEN resin film (heat-resistant temperature of 180° C.) is used, the elevated-temperature process (preferably elevated-temperature of 400° C. to 1000° C.) exceeding 180° C. can be positively employed upon forming the semiconductor layer 20.

That is, the formation process of the semiconductor layer can be carried out at a temperature of not less than 180° C., preferably through an elevated-temperature process with a temperature range of from 400° C. to about 1000° C. It is also capable to positively subject the obtained semiconductor layer to a heat treatment since the metal foil is used in the manufacturing method of the flexible semiconductor device of the present invention.

For example, after the deposition of the semiconductor material onto the insulating film 10, the heating treatment of the deposited semiconductor material can be performed. The process of the heat treatment is not particularly limited. For example, the heat treatment may be a thermal annealing treatment (atmosphere heating) or may be a laser annealing treatment. The combination of the thermal annealing and laser annealing treatments may also be adopted as the heat treatment. Just as an example, the semiconductor layer comprising an amorphous silicon is formed on a desired position on the insulating film 10, and thereafter the semiconductor layer may be annealed by laser. By subjecting the semiconductor layer to such a heat treatment, a crystallization of the semiconductor proceeds and thus the semiconductor properties (e.g. carrier mobility) can be improved. For example, as for the carrier mobility of a silicon semiconductor, the value of 1 or less may be increased to a value of 100 or more by the above heat treatment. The term "annealing treatment" used in the present description substantially means a heat treatment intended to improve a mobility or stabilize the properties.

As to the heat treatment, organosilicone compounds (e.g. cyclopentasilane) may be applied onto a desired position of the insulating film 10, followed by heating the applied organosilicone compounds to change it to a silicone. Alternatively, a mixture of an organic metals may be applied onto a desired position of the insulating film 10, followed by heating the applied mixture (for example by heating the mixture at a temperature not less than 600° C.) to allowing it to be sintered, and thereby a production of an oxide semiconductor can be achieved. Thus, according to the present invention, it is capable to employ various processes for forming the semiconductor layer.

Incidentally, it is preferred that the semiconductor layer 20 is formed on the insulating film 10 without extending out from the upper surface of insulating film 10. In a case where a sealing resin layer 40 is used as an element of TFT, there is a possibility that the semiconductor layer 20 may be deteriorated due to the presence of steam and oxygen included in the sealing resin layer 40. For this reason, the insulating film 10 can suitably serve as a protection layer protecting the semiconductor layer 20 when the semiconductor layer 20 is provided without extending out from the upper surface of insulating film 10. The formed semiconductor layer 20 has a thickness of preferably from about 10 nm to about 150 nm, more preferably from about 20 nm to about 80 nm.

Figure 4D:
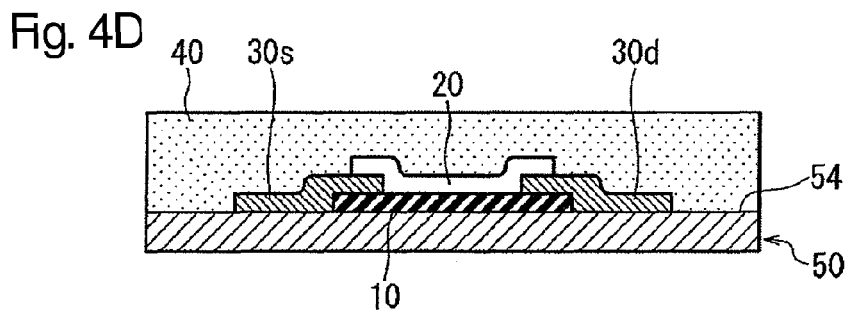
Figure 4E:
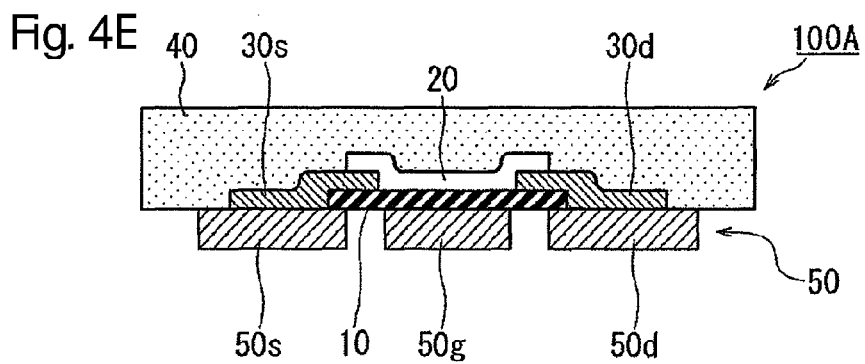

The step (iii) is followed by the step (iv). That is, as shown in FIG. 4(d), the sealing resin layer 40 is formed over the upper surface 54 of the metal foil 50 so that the sealing resin layer 40 covers the semiconductor layer 20 and the patterns of extraction electrodes 30s and 30d.

As a resin material of the sealing resin layer 40, a material with a flexibility after being cured is preferable. Examples of such a resin material include an epoxy resin, a polyimide (PI) resin, an acrylic resin, a polyethylene terephthalate (PET) resin, a polyethylenenaphthalate (PEN) resin, a polyphenylene sulfide (PPS) resin, a polyphenylene ether (PPE) resin and a combination thereof. Those resin materials are excellent in terms of dimensional stability, and thus can be preferably used for the manufacturing method of the present invention.

The method of forming the sealing resin layer 40 is not particularly limited. Any suitable method may be employed if it can form a sealing resin layer on the upper surface of the metal foil, covering the semiconductor layer and the patterns of extraction electrodes. For example, the sealing resin layer 40 can be formed by applying an uncured resin material in a liquid form (for example, a coating agent which was obtained by mixing a resin material with a liquid medium) on the upper surface of the metal foil 50 by spin coating, followed by drying it. The sealing resin layer 40 thus formed can suitably seal the semiconductor layer 20.

The sealing resin layer 40 can be formed by a process wherein an uncured resin which was preliminarily shaped into a film form is stacked on the upper surface 54 of the metal foil 50, followed by a curing of the resin. Alternatively, it is possible to employ another process wherein an adhesive material is applied onto the upper surface of the resin which was preliminarily shaped into a film form, and thereafter the side to which the adhesive material is stacked is laminated onto the upper surface 54 of the metal foil 50. As a method of laminating the sealing resin layer 40 onto the metal foil 50, any suitable method may be employed. For example, a roll lamination process, a vacuum lamination process or a press by pressurizing may be suitably employed. After such laminating step, the semiconductor layer 20 and the extraction electrodes 30s and 30d are embedded into the sealing resin layer 40 from the lower surface thereof, and thereby the semiconductor layer 20 is sealed by the sealing resin layer 40. Just as an example, an adhesive epoxy resin may be applied onto the lower surface of a polyethylenenaphthalate (PEN) resin film, followed by stacking the applied epoxy resin onto the upper surface of the metal foil 50.

The sealing resin layer 40, which is obtained from the step (iv), has a thickness of preferably from about 1 μm to about 7 μm, more preferably from about 2 μm to about 5 μm. Since the sealing resin layer 40 may serve as a gate insulating film, it is preferred that the sealing resin layer 40 has a thin thickness from the standpoint of reducing the gate voltage. In this regard, a suitable thickness of the sealing resin layer 40 may be 5 μm or less. However, the thickness of the sealing resin layer 40 may be suitably adjusted depending on the required TFT properties.

The step (iv) is followed by the step (v). That is, as shown in FIG. 4(*e*), the electrodes are formed by etching the metal foil 50. Specifically, each of the source electrode 50*s* and the drain electrode 50*d* is formed by etching of the metal foil 50. Particularly in the illustrated embodiment, the gate electrode 50*g* is also formed by etching the metal foil 50.

The etching process is not particularly limited, but may use a conventionally known process. Typically, an etching process using the photolithographic approach may be employed. As the illustrated embodiment, by patterning the metal foil 50, the source electrode 50*s* is formed such that the source electrode 50*s* is in contact with the patterns of source extraction electrode 30*s* whereas the drain electrode 50*d* is formed such that the drain electrode 50*d* is in contact with the patterns of drain extraction electrode 30*d*.

By performing the steps (i) to (v) as described above, the flexible semiconductor device 100A can be finally obtained as a TFT element wherein the semiconductor layer 20, the insulating film 10, the gate electrode 50*g*, the source electrode 50*s* and the drain electrode 50*d* are provided.

According to the manufacturing method of the present invention, as described above, the insulating film 10 and the semiconductor layer 20 are formed on the metal foil 50. Subsequently, the sealing resin layer 40 is formed over the metal foil 50 so that the sealing resin layer 40 covers the semiconductor layer 20. Thereafter, the source electrode 50*s*, the drain electrode 50*d*, and the gate electrode 50*g* are formed by etching the metal foil 50. Therefore, the metal foil 50 serving as a substrate can be utilized as the electrodes of a TFT (i.e. source electrode, drain electrode and gate electrode). This means that it is not necessary to finally peel the metal foil 50 which has served as the substrate. As a result, a TFT element can be produced by simple processes so that an excellent productivity of the flexible semiconductor device is achieved.

The effect of the invention will now be described in more detail. In the prior art using a typical transference process, it is necessary to eventually peel the supporting substrate (e.g. a glass substrate) in the producing process of a TFT. For this reason, for example, it is required to perform a treatment to decrease the adhesion between the supporting substrate and a TFT element in the prior art. Alternatively, it is required to perform some complicated treatments such as treatment of forming a peel layer between the supporting substrate and the TFT element and a subsequent treatment of removing physically or chemically the peel layer. That is, in the TFT manufacturing process using typical transferrence process, there still remains problems relating to the productivity. On the other hand, according to the manufacturing method of the present invention, it is not necessary to peel eventually the metal foil 50 which functions as the supporting substrate, and thereby the complicatedness of the processes is reduced.

In addition, according to the manufacturing method of the present invention, after forming the insulating film 10 and the semiconductor layer 20 on the metal foil 50, the sealing resin layer 40 is formed over the metal foil 50. Thus, the production process of the insulating film 10 and the semiconductor layer 20 can be performed with an elevated-temperature process, which leads to a production of a desired TFT with an improved performance. That is, in a case where the constituent elements of TFT are directly onto a resin substrate without using a transferrence process, the substrate has a decreased heat resistance. In this case, it is necessitated to restrict the process temperature to lower range, so that the obtained TFT tends to have inferior properties. However, according to the manufacturing method of the present invention, in spite of using the sealing resin layer having low heat resistance (e.g. polyethylene naphthalate (PEN) resin film having a heat resistant temperature of 180° C.), an elevated-temperature process (for example, heat-treatment of annealing) with a temperature of 400° C. or more can be introduced into a formation step of the semiconductor layer 20. Therefore, according to the present invention, the TFT properties (for example, carrier mobility of the semiconductor and so forth) can be preferably improved.

In other words, according to the manufacturing method of the present invention, it is capable to obtain a flexible semiconductor device having higher performance with sufficient productivity.

Embodiment 2

Hereinafter, another embodiment of the manufacturing method of the present invention and the flexible semiconductor device obtained thereby will be explained. The same reference numeral or symbol is given to the respective same member as in the flexible semiconductor device 100A. In addition, explanations relating to the same matter are omitted or simplified.

Embodiment 2 relates to a manufacturing method of the flexible semiconductor device 100B. That is, the manufacturing method of Embodiment 2 provides a manufacturing method of the flexible semiconductor device wherein the gate electrode 50*g* is located on a surface plane which is not flush with the surface plane of the source electrode 50*s* and the drain electrode 50*d*.

Figure 5A:
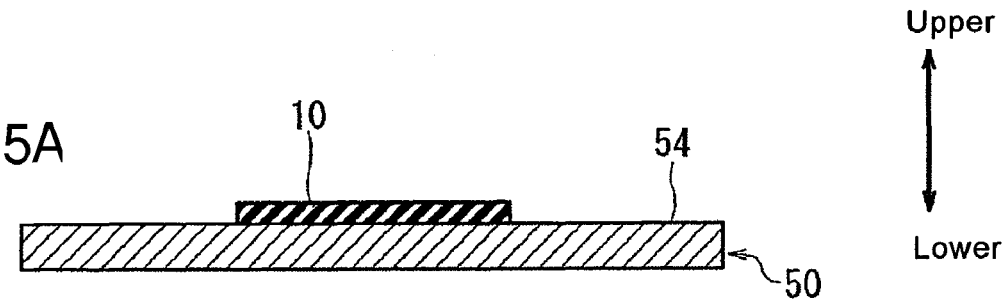
FIGS. 5(a) to 5(c) show a process sectional view, which schematically shows each of manufacturing steps of the flexible semiconductor device 100B of the present invention.
Figure 5B:
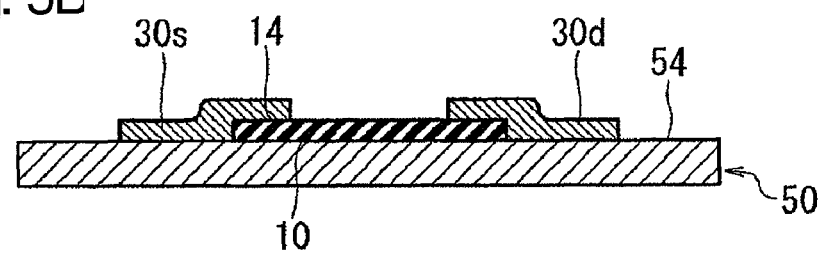
Figure 5C:
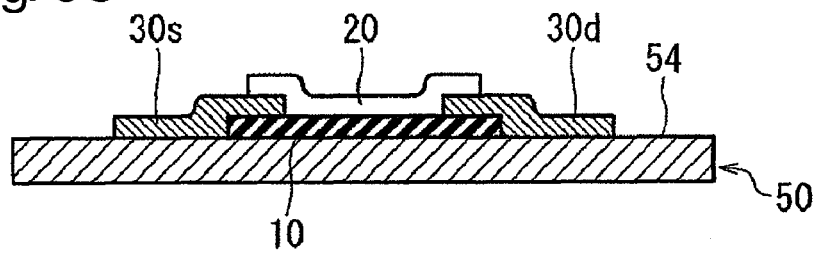
Figure 6A:
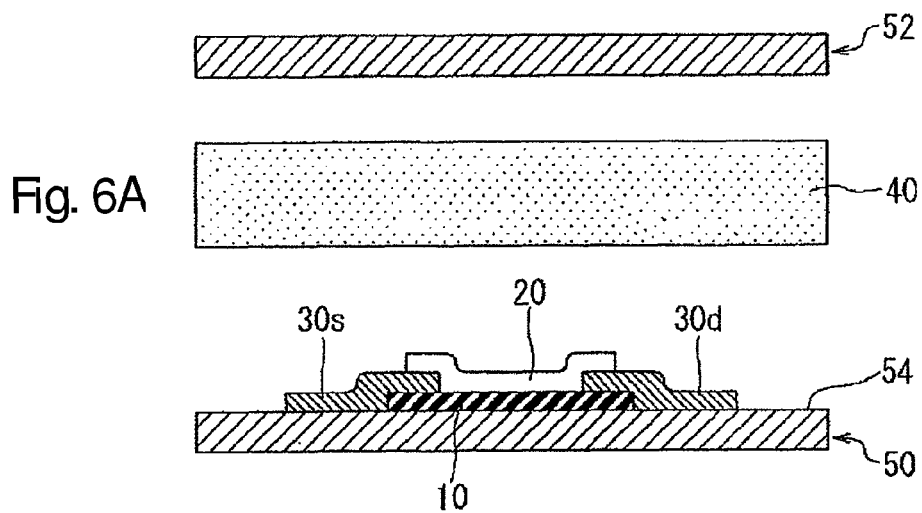
FIGS. 6(a) to 6(c) show a process sectional view, which schematically shows each of manufacturing steps of the flexible semiconductor device 100B of the present invention.
Figure 6B:
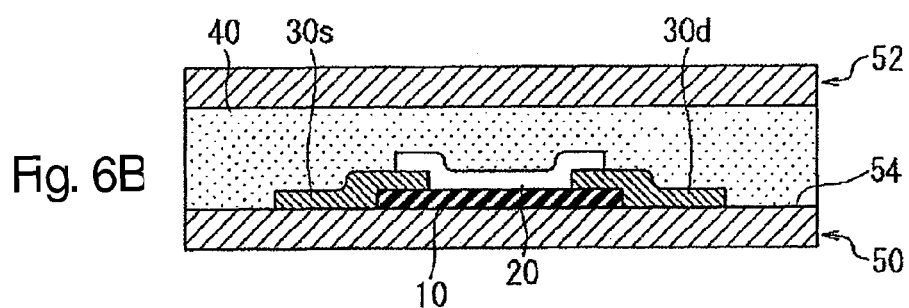

The typical steps in the manufacturing process of the flexible semiconductor device 100B are shown in FIGS. 5(*a*) to 5(*c*) and FIGS. 6(*a*) to 6(*c*). First, as shown in FIG. 5(*a*), the insulating film 10 is formed in the upper surface 54 of the metal foil 50 in the step (i). As mentioned above, the metal foil 50 not only serves as a substrate for the insulating film, the patterns of extraction electrodes, the semiconductor layer and/or the sealing resin layer during the manufacturing steps, but also finally serves as the constituent material of the various electrodes of the TFT element. Then, as shown in FIG. 5(*b*), the patterns of source extraction electrode 30*s* and the patterns of drain extraction electrode 30*d* are formed on the upper surface 54 of the metal foil 50 in the step (ii). Subsequently, as shown in FIG. 5(*c*), the semiconductor layer 20 is formed on the insulating film 10 so that the semiconductor layer 20 contacts with each of the patterns of extraction electrodes 30*s* and 30*d* in the step (iii), Subsequently, as shown in FIG. 6(*a*), the sealing resin layer 40 is formed over the metal foil 50 so that the sealing resin layer 40 covers the semiconductor layer 20 and each of the patterns of extraction electrodes 30*s* and 30*d* in the step (iv). In the illustrated embodiment, the sealing resin layer 40 is formed by applying an adhesive epoxy resin to the lower surface of a resin film (e.g. a polyethylenenaphthalate resin film with a thickness of about 3 μm), followed by laminating the lower surface of the resin film onto the upper surface of the metal foil 50. Particularly as for the present Embodiment 2, a further metal foil 52 is formed on the sealing resin layer 40 (see FIGS. 6(*a*) and 6(*b*)). For example, a further metal foil 52 is provided separately and stacked onto the upper surface of the sealing resin layer 40. The constituent metal of the metal foil 52 preferably has an electric conductivity and also has a relatively high melting point. Examples of such constituent metal include copper (Cu, melting point: 1083° C.), nickel (Ni, melting point: 1453° C.), aluminum (Al, melting point:

660° C.), and stainless steel (SUS). The metal foil has a thickness of preferably from about 4 µm to about 20 µm, more preferably from about 8 µm to about 16 µm, for example about 12 µm. The metal foil 52 can be provided by applying an adhesive epoxy resin to the upper surface of the sealing resin layer 40, followed by laminating the lower surface of the further metal foil 52 onto the upper surface of the sealing resin layer 40. In this way, the sealing resin layer 40 and the further metal foil 52 are suitably integrated. Meanwhile, the stacking of the metal foil 50 and the stacking of the further metal foil 52 may be performed in the same process or each of them may be performed in a separate process.

Figure 6C:
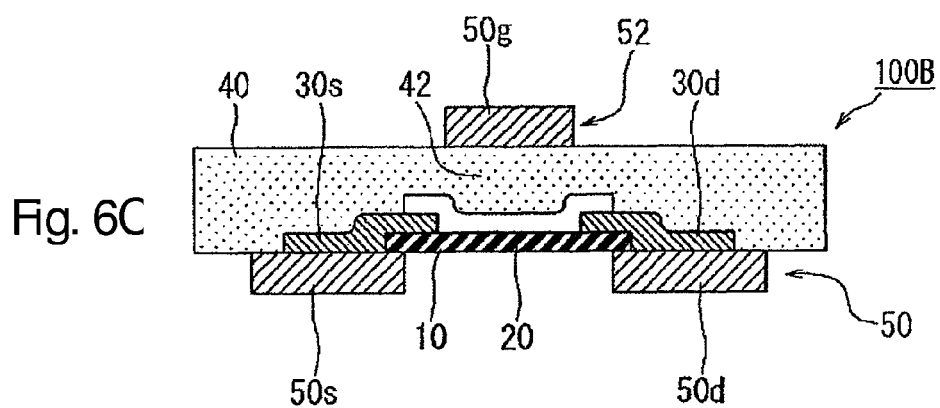

After a provision of the sealing resin layer 40 and the further metal foil 52, each of the source electrode 50s and the drain electrode 50d is formed by etching the metal foil 50 which served as the substrate, and also the gate electrode 50g is formed by etching the metal foil 52, as shown in FIG. 6(c).

Through the above steps, the flexible semiconductor device 100B can be obtained as a TFT element wherein the semiconductor layer 20, the insulating film 10, the gate electrode 50g, the source electrode 50s and the drain electrode 50d are provided. In the semiconductor device 100B in which the gate electrode 50g is arranged so that it opposes to the semiconductor layer 20 across the sealing resin layer 40, the part of the sealing resin layer 40 which is sandwiched between the semiconductor layer 20 and the gate electrode 50g can function as the gate insulating film 42.

Embodiment 3

Figure 7A:
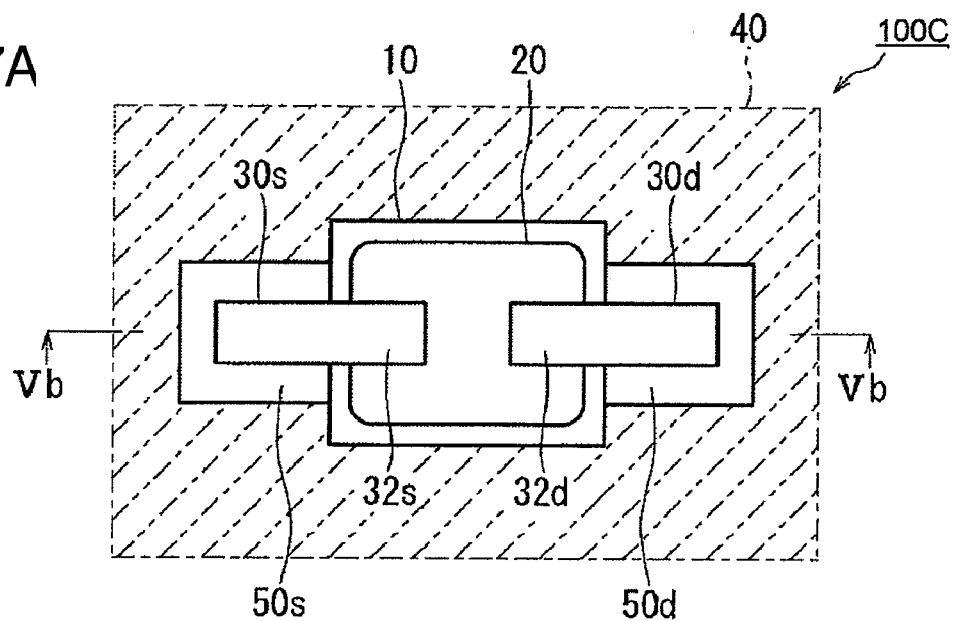
FIG. 7(a) shows a top plan view of the flexible semiconductor device 100C.
Figure 7B:
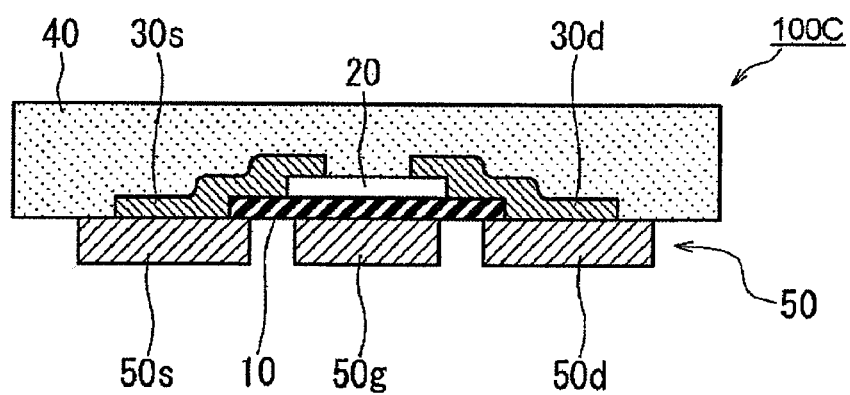
FIG. 7(b) shows a cross sectional view taken along line Vb-Vb in FIG. 7(a).

In the embodiment illustrated with reference to FIGS. 4 and 5, the semiconductor layer 20 is applied to the patterns of extraction electrodes 30s and 30d from the upward direction thereof, and thus the peripheral portions of the semiconductor layer 20 covers each of the extended parts 32s and 32d of the extraction electrodes 30s and 30d. The form and the sequence may be reversed. For example, as shown in FIGS. 7(a) and 7(b), the patterns of extraction electrodes 30s and 30d may be formed so that a part of each pattern is stacked on the semiconductor layer 20 from the upward direction thereof. More specifically, in the flexible semiconductor device 100C shown in FIGS. 7(a) and 7(b), each pattern of extraction electrodes 30s and 30d is arranged so that each extended part 32s and 32d of each pattern of extraction electrodes 30s and 30d covers parts of the semiconductor layer 20. In other words, in regard to the semiconductor layer 20 which is formed on the insulating film 10, the peripheral portions of the upper surface of the semiconductor layer 20 are partially in contact with the peripheral portions of the lower surface of each of the patterns of source/drain extraction electrodes 30s and 30d. The flexible semiconductor device 100C shown in FIGS. 7(a) and 7(b) is a semiconductor device in which the gate electrode 50g, the source electrode 50s and the drain electrode 50d are flush with each other on the same surface plane.

An example of the manufacturing method of the flexible semiconductor device 100C will be explained with reference to FIGS. 8(a) to 8(e). Explanations relating to the same matter as those of the flexible semiconductor devices 100A, 100B are omitted.

Figure 8A:
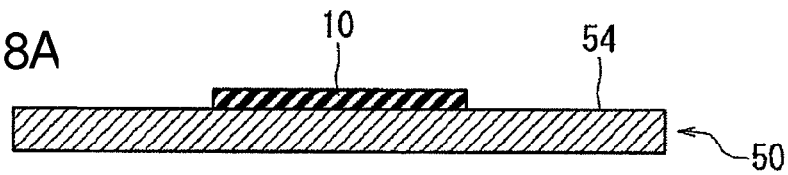
FIGS. 8(a) to 8(e) show a process sectional view, which schematically shows each of manufacturing steps of the flexible semiconductor device 100C of the present invention.
Figure 8B:
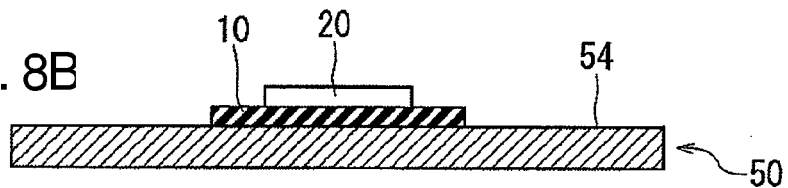

First, the gate insulating film 10 is formed on the upper surface 54 of the metal foil 50 as shown in FIG. 8(a), and then the semiconductor layer 20 is formed on the upper surface of the gate insulating film 10 as shown in FIG. 8(b). The method of forming the semiconductor layer 20 is not particularly limited, and thus the layer 20 may be formed in the same method as mentioned in Embodiment 1.

Figure 8C:
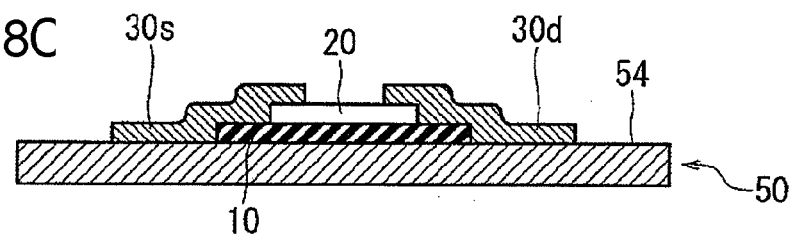

After the semiconductor layer 20 is formed on the gate insulating film 10, as shown in FIG. 8(c), at least two patterns of extraction electrodes 30s and 30d are formed on a part of upper surface of the metal foil 50, so that the patterns of extraction electrodes contact with the semiconductor layer 20. As illustrated, the patterns of source extraction electrode 30s is formed so that it covers the left end portion of the semiconductor layer 20 and the left end portion of the gate insulating film 10. Similarly, the patterns of drain extraction electrode 30d is formed so that it covers the right end portion of the semiconductor layer 20 and the right end portion of the gate insulating film 10.

Figure 8D:
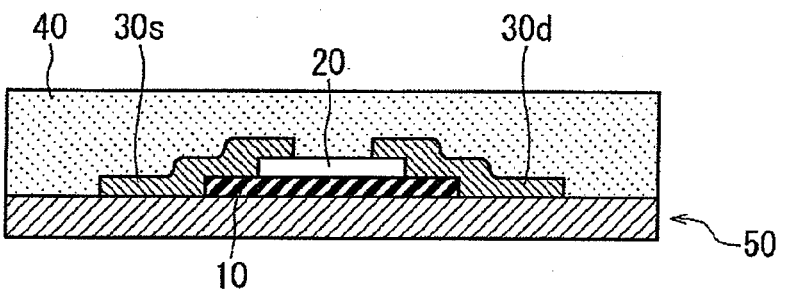
Figure 8E:
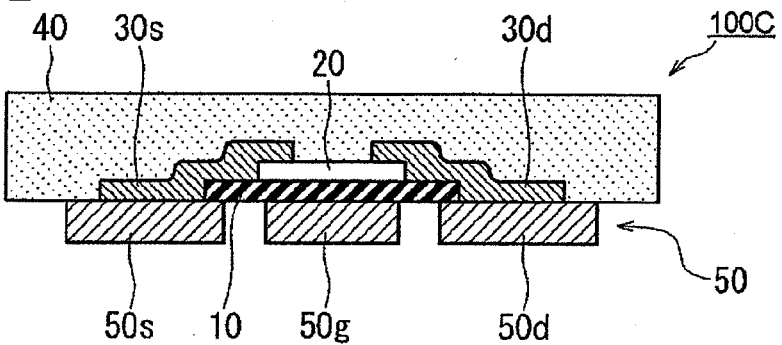

Subsequently, as shown in FIG. 8(d), the sealing resin layer 40 is formed over the upper surface 54 of the metal foil 50 so that it covers each of the semiconductor layer 20 and the patterns of extraction electrodes 30s and 30d. Then, as shown in FIG. 8(e), each of the gate electrode 50g, the source electrode 50s and the drain electrode 50d is formed by etching the metal foil 50. Thus, the flexible semiconductor device 100C as shown in FIGS. 7(a) and 7(b) can be obtained in a simple and stable way.

Embodiment 4

Figure 9A:
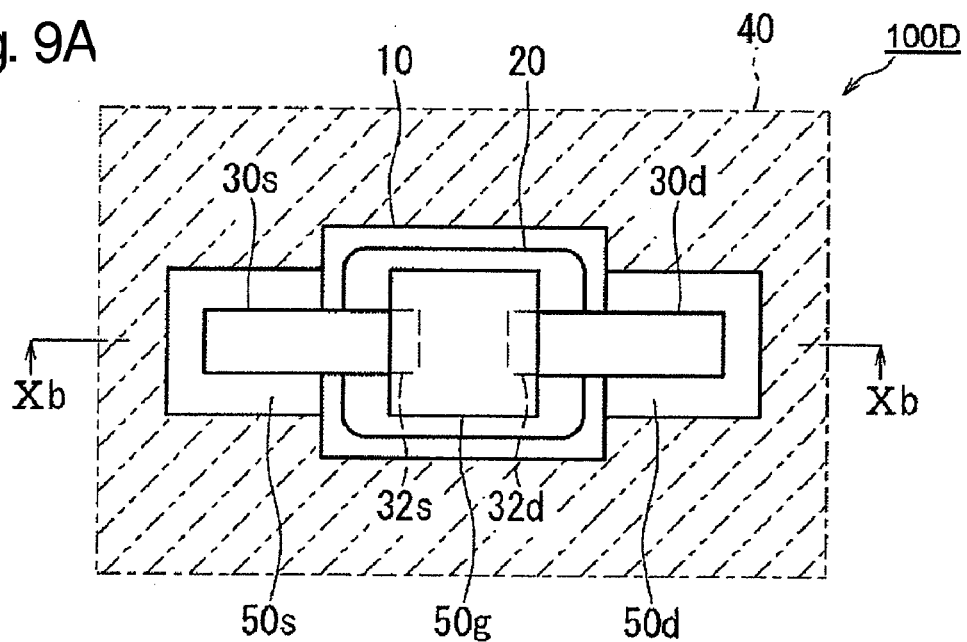
FIG. 9(a) shows a top plan view of the flexible semiconductor device 100D.
Figure 9B:
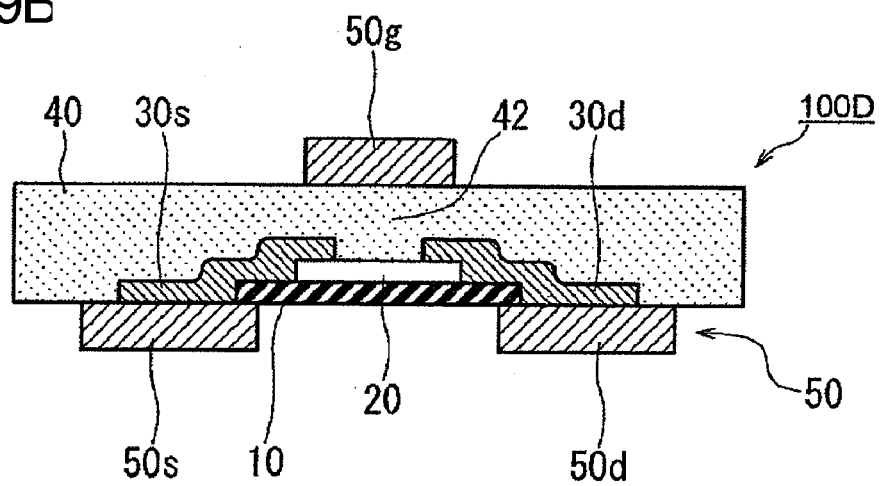
FIG. 9(b) shows a cross sectional view taken along line Xb-Xb in FIG. 9(a).

Similar to the above Embodiment 3, each pattern of extraction electrodes 30s and 30d is stacked on the semiconductor layer 20 from the upward direction thereof in the flexible semiconductor device 100D shown in FIGS. 9(a) and 9(b). That is, each pattern of extraction electrodes 30s and 30d is arranged so that each extended part 32s and 32d of each pattern of extraction electrodes 30s and 30d partially covers the semiconductor layer 20. The different point of this Embodiment 4 from the flexible semiconductor device 100C of Embodiment 3 is that the gate electrode 50g is located on a surface plane which is not flush with the surface plane on which the source electrode and the drain electrode are located in the flexible semiconductor device 100D shown in FIGS. 9(a) and 9(b).

An example of the manufacturing method of the flexible semiconductor device 100D will be explained with reference to FIGS. 10(a) to 10(c) and FIGS. 11(a) to 11(c).

Figure 10A:
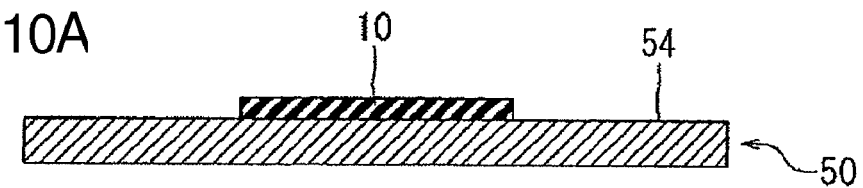
FIGS. 10(a) to 10(c) show a process sectional view, which schematically shows each of manufacturing steps of the flexible semiconductor device 100D of the present invention.
Figure 10B:
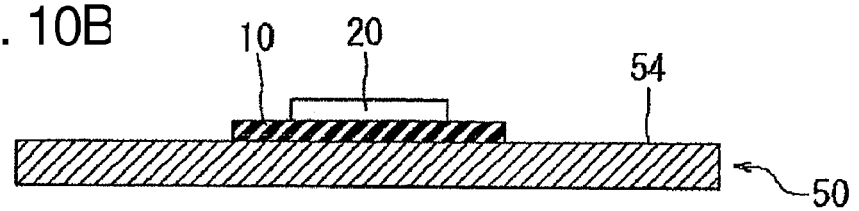
Figure 10C:
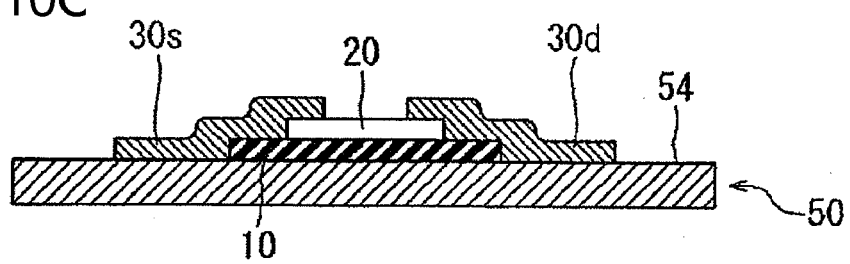

First, the insulating film 10 is formed on the upper surface 54 of the metal foil 50 as shown in FIG. 10(a), and then the semiconductor layer 20 is formed on the insulating film 10 as shown in FIG. 10(b). Subsequently, at least two patterns of extraction electrodes 30s and 30d are stacked on the metal foil 50, so that a part of each pattern contacts with the semiconductor layer 20 as shown in FIG. 10 (c). As illustrated, the pattern of source extraction electrode 30s and the pattern of drain extraction electrode 30d are formed, so that a part of each patter covers a part of the peripheral portion of the semiconductor layer 20 and a part of the peripheral portion of the insulating film 10.

Figure 11A:
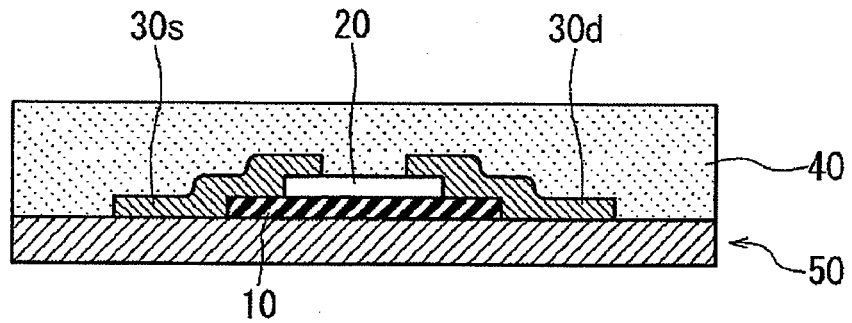
FIGS. 11(a) to 11(c) show a process sectional view, which schematically shows each of manufacturing steps of the flexible semiconductor device 100D of the present invention.
Figure 11B:
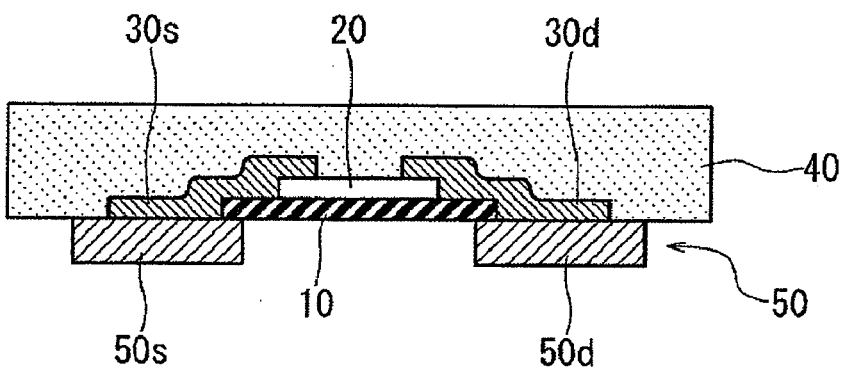
Figure 11C:
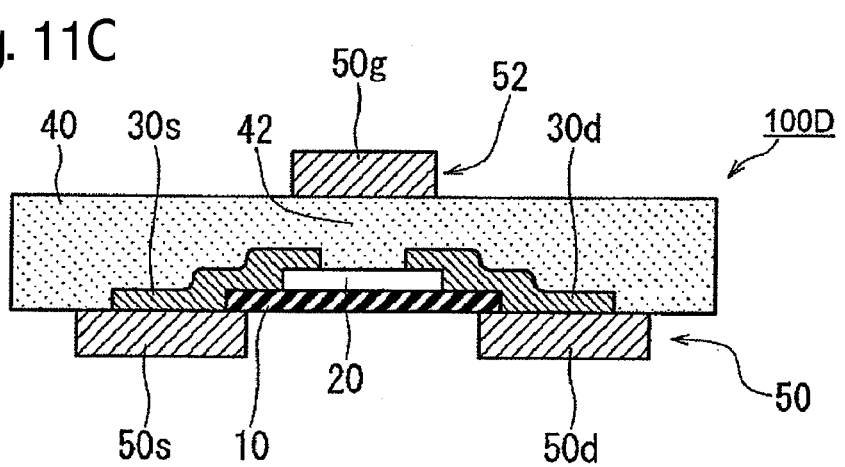

Subsequently, as shown in FIG. 11(a), the sealing resin layer 40 is stacked on the metal foil 50 so that the sealing resin layer 40 covers the insulating film 10, the semiconductor layer 20, the patterns of extraction electrodes 30s and 30d. After the sealing resin layer 40 is formed as shown in FIG. 11(b), the source electrode 50s and the drain electrode 50d are formed by etching the metal foil 50. Then, as shown in FIG. 11(c), the process for forming the gate electrode 50g is carried out, so that the gate electrode 50g is provided on the surface (i.e. upper surface in FIG. 11(c)) of the sealing resin layer 40, such surface being opposed to the surface (i.e. lower surface in FIG. 11(c)) of the sealing resin layer 40 on which the source electrode 50s and the drain electrode 50d are formed. According to this Embodiment 4, the gate electrode 50g is directly formed on the sealing resin layer 40.

The method of forming the gate electrode 50g directly on the sealing resin layer 40 is not particularly limited. For example, the sputtering process or a vacuum evaporation process using a mask may be employed. Alternatively, a method of printing an organic metal by an ink jet process followed by calcinating thereof may be used. Through the above steps, the flexible semiconductor device 100D can be finally obtained.

Embodiment 5

For example, in the flexible semiconductor devices 100A and 100C as shown in FIG. 1 and FIG. 7, the insulating film which constitutes the gate insulating film 10 is stacked only on the lower surface of the semiconductor layer 20. However, it is not limited thereto. For example, the insulating film (namely, insulating film 12) may be stacked on the portion other than below the lower surface of the semiconductor layer 20 as in the flexible semiconductor device 100E shown in FIG. 12.

Figure 12:
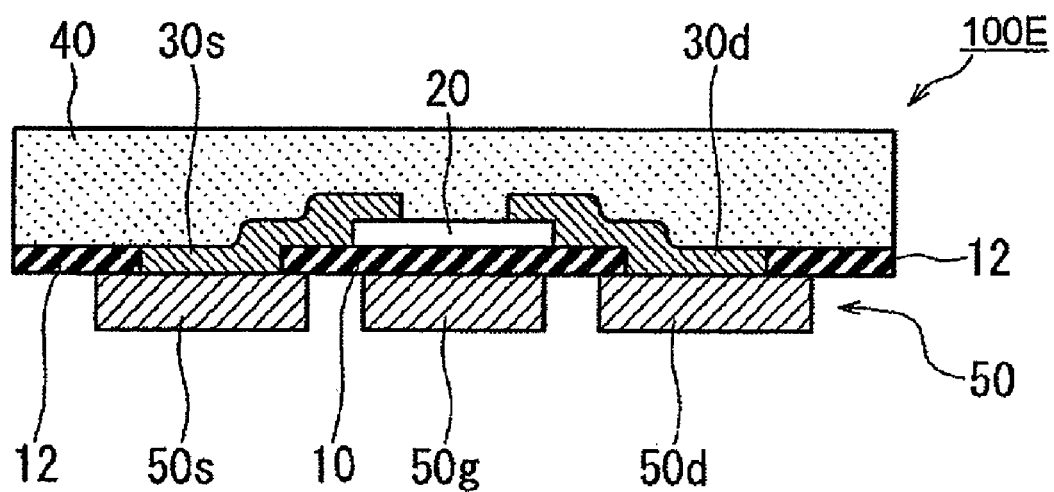
FIG. 12 shows a cross sectional view of the flexible semiconductor device 100E of the present invention.

In the flexible semiconductor device 100E, the insulating film 12 is arranged so that it covers the whole lower surface of the sealing resin layer 40 (except for the formation positions of the patterns of extraction electrodes 30s and 30d). The flexible semiconductor device 100E shown in FIG. 12 is a semiconductor device in which in which the gate electrode 50g is located on the same surface plane which is flush with the surface plane where both of the source electrode 50s and the drain electrode 50d are formed.

An example of the manufacturing method of the flexible semiconductor device 100E is explained with reference to FIGS. 13(a) to 13(e).

First, as shown in FIG. 13 (a), the metal foil 50, upper surface or which is beforehand covered with the insulating film 12 is provided. The metal foil 50 may be, for example, made of stainless steel (SUS) foil. The insulating film 12 can be formed in a similar way as that of Embodiment 1. Next, the semiconductor layer 20 is formed on a part of upper surface of the insulating film 12. The semiconductor layer 20 can be formed in a similar way as that of Embodiment 1.

Figure 13A:
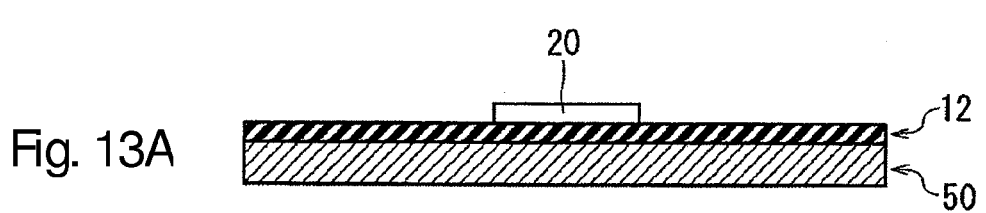
FIGS. 13(a) to 13(e) show a process sectional view, which schematically shows each of manufacturing steps of the flexible semiconductor device 100E of the present invention.
Figure 13B:
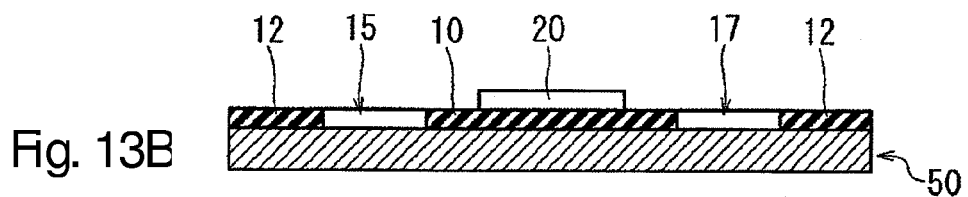

Subsequently, as shown in FIG. 13(b), some portions of the whole surface insulating films 12 are removed selectively. Thus, the openings 15 and 17, through which the metal foil 50 located below is exposed, are formed. Each of the openings 15 and 17 is a through-hole, which penetrates the whole surface insulating film 12 from the upper surface to the lower surface and which functions as a contact point for electrical connection with the patterns of extraction electrodes 30s and 30d as described later. The shape of the openings 15 and 17 is not particularly restricted and may be, for example, a circular configuration.

Partial removal of the insulating film 12 can be performed using, for example, laser radiation, etching, lift-off process and so forth.

Figure 13C:
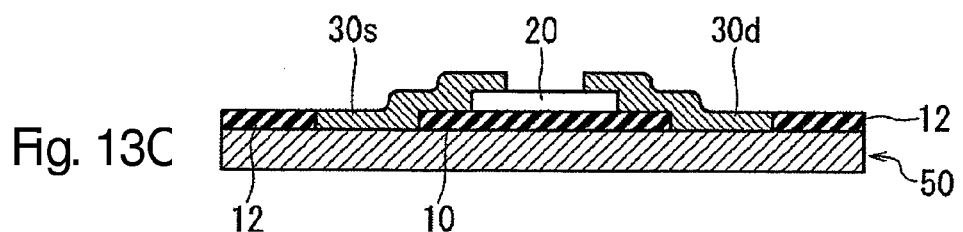
Figure 13D:
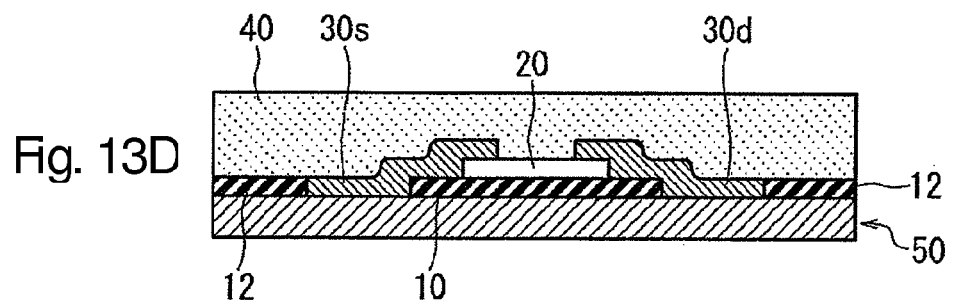

Next, as shown in FIG. 13(c), the patterns of extraction electrodes 30s and 30d are formed on the upper surface of the metal foil 50, where the openings 15 and 17 are exposed, so that the patterns contact with the semiconductor layer 20. In the illustrated embodiment, the patterns of source extraction electrode 30s is formed on the upper surface of the metal foil 50 exposed through the left-hand side opening 15, and the patterns of drain extraction electrode 30d is formed on the upper surface of the metal foil 50 exposed through the right-hand side opening 17. Formation of these patterns of extraction electrodes 30s and 30d can be formed in a similar way as that of Embodiment 1.

Figure 13E:
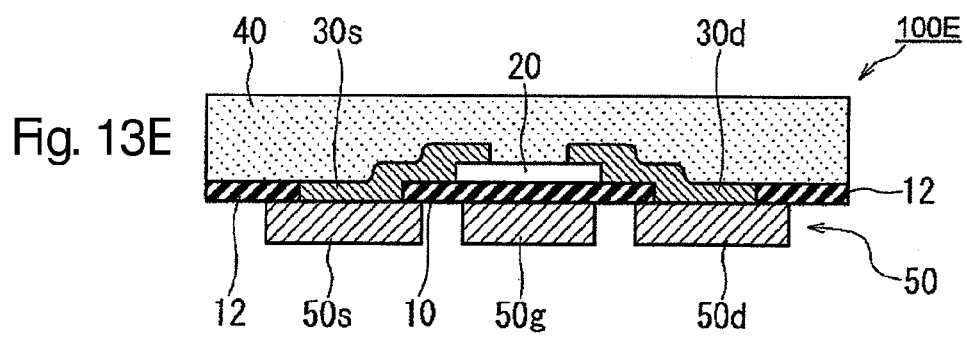

Subsequently, the sealing resin layer 40 is formed on the upper surface of the metal foil 50 so that the sealing resin layer 40 covers the semiconductor layer 20 and the patterns of extraction electrodes 30s and 30d. And then, as shown in FIG. 13(e), each of the gate electrode 50g, the source electrode 50s, and drain electrode 50d is formed by etching the metal foil 50. Thus, the flexible semiconductor device 100E as shown in FIG. 12 can be stably obtained in a simple way.

Embodiment 6

Similar to Embodiment 5, the insulating film is formed on the portion other than below the lower surface of the semiconductor layer 20 as in the flexible semiconductor device 100F shown in FIG. 14. The different point of this Embodiment from the flexible semiconductor device 100E in Embodiment 5 is that the gate electrode 50g is located on a surface plane which is not flush with the surface plane where the source electrode and the drain electrode are located in the flexible semiconductor device 100F shown in FIG. 14.

Figure 14:
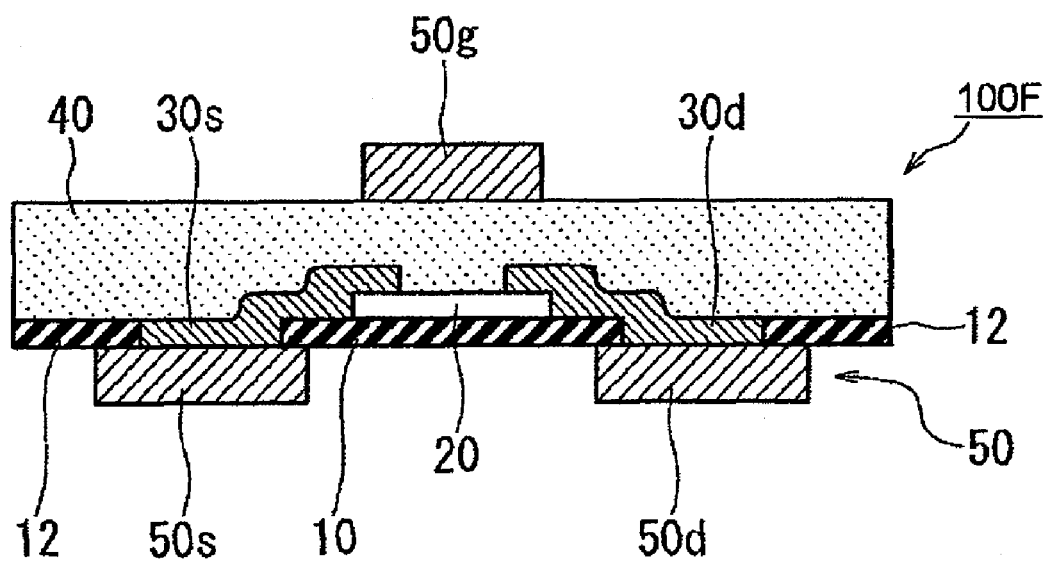
FIG. 14 shows a cross sectional view of the flexible semiconductor device 100F of the present invention.

The flexible semiconductor device 100F as shown in FIG. 14 can be produced through the manufacturing steps shown, for example, in FIGS. 15(a) to 15(e).

Figure 15A:
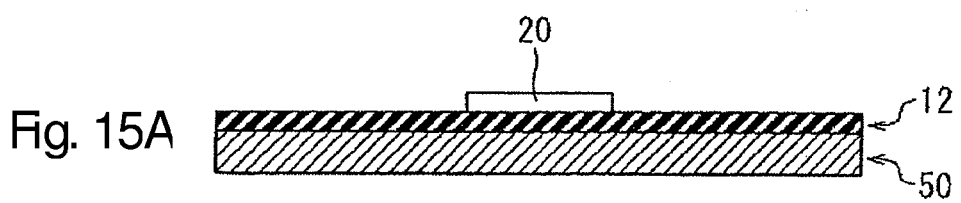
FIGS. 15(a) to 15(e) show a process sectional view, which schematically shows each of manufacturing steps of the flexible semiconductor device 100F of the present invention.
Figure 15B:
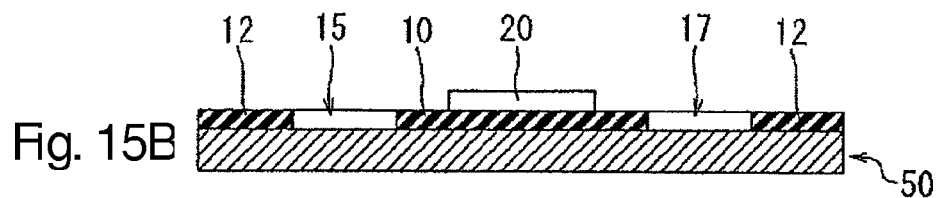
Figure 15C:
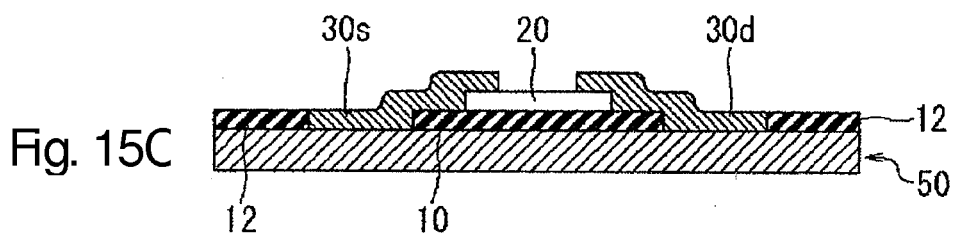
Figure 15D:
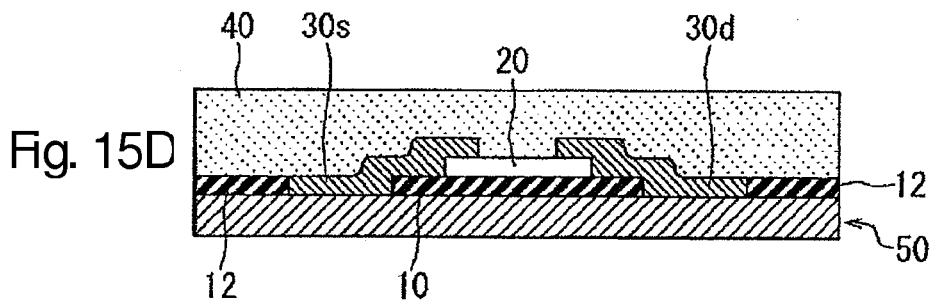

First, as shown in FIG. 15(a), the metal foil 50, upper surface or which is beforehand covered with the insulating film 12 is provided. Next, the semiconductor layer 20 is formed in a part of upper surface of the insulating film 12. Subsequently, as shown in FIG. 15(b), some portions of the insulating films 12 are selectively removed, thereby forming some metal foil 50 located under the lower surface of the insulating film 12 is exposed, and the openings 15 and 17. Then as shown in FIG. 15(c), the patterns of extraction electrodes 30s and 30d are formed on the upper surface of the metal foil 50 exposed through the openings 15 and 17, so that the patterns contact with the semiconductor layer 20.

Figure 15E:
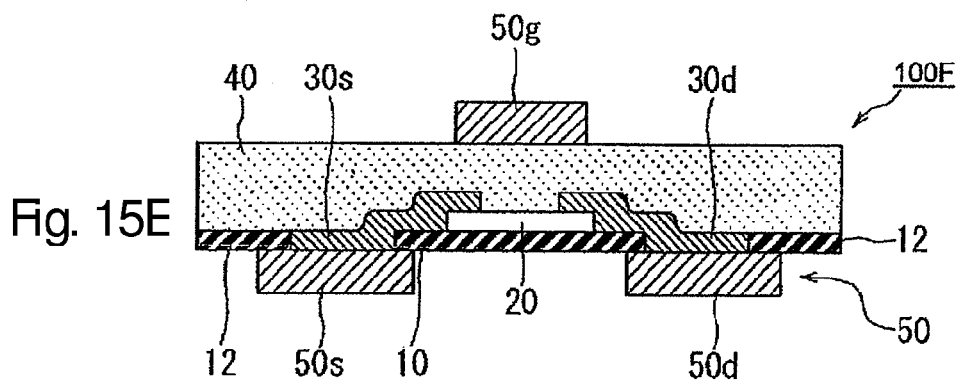

Subsequently, the sealing resin layer 40 is formed on the upper surface of the metal foil 50 so that the sealing resin layer 40 covers the semiconductor layer 20 and the patterns of extraction electrodes 30s and 30d. And then, as shown in FIG. 15(e), each of the source electrode 50s and drain electrode 50d is formed by etching the metal foil 50. Especially in this Embodiment 6, the gate electrode 50g is formed on the surface of the sealing resin layer 40, which surface is opposite to the surface where both the source electrode 50s and the drain electrode 50d are formed across the sealing resin layer 40. Formation of the gate electrode 50g can be formed in a similar way as that of Embodiments 2 and 4. Thus, the flexible semiconductor device 100F as shown in FIG. 14 can be stably obtained in a simple way.

Embodiment 7

Figure 16A:
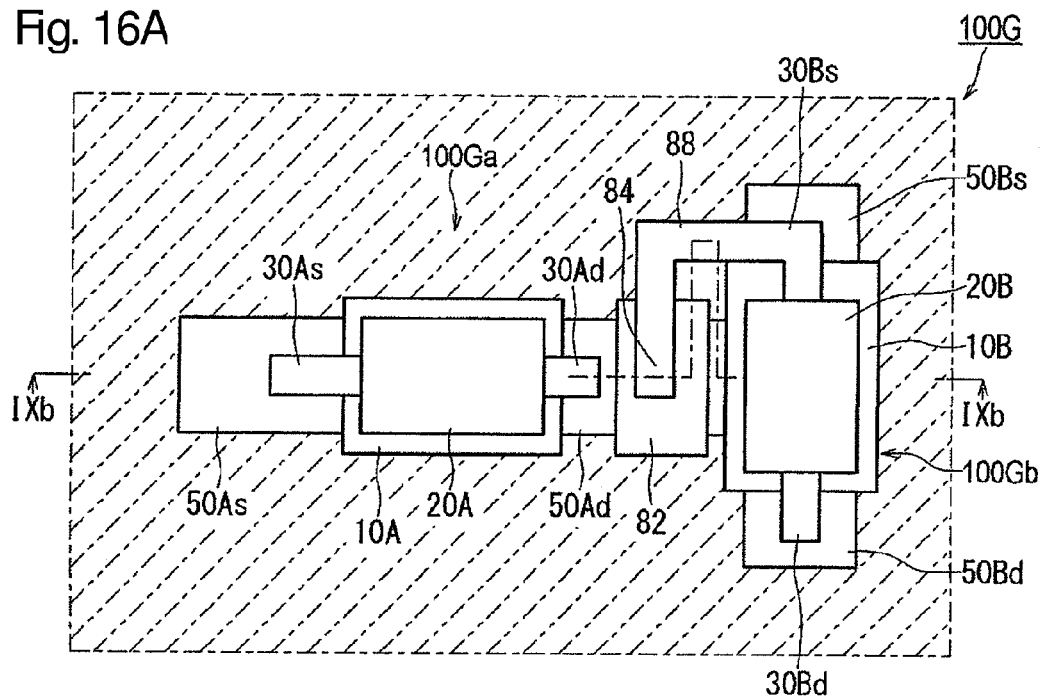
FIG. 16(a) shows a top plan view of the flexible semiconductor device 100G.
Figure 16B:
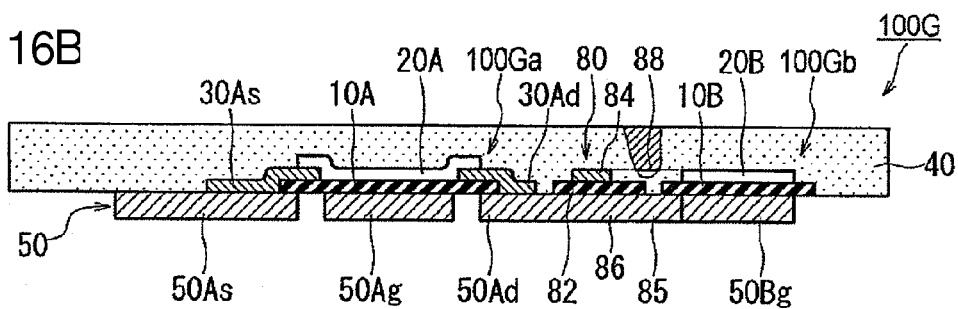
FIG. 16(b) shows a cross sectional view taken along line IXb-IXb in FIG. 16(a).

Next, an example of the flexible semiconductor device 100G which is preferably mounted on an image display device is explained with reference to FIGS. 16(a) to 16(b). FIG. 16(a) shows a top plan view of the flexible semiconductor device 100G and FIG. 16(b) shows a cross sectional view taken along line IXb-IXb in FIG. 16(a).

The flexible semiconductor device 100G, which is mounted on an image display device (here, an organic EL display) has at least two TFT elements which comprise a semiconductor layer, a gate insulating film, a gate electrode, a source electrode and a drain electrode. Here, the number of TFTs per pixel is two pieces, and a flexible semiconductor device has a first TFT element 100Ga and a second TFT element 100Gb.

In Embodiment 7, the gate electrode 50Ag, the source electrode 50As and the drain electrode 50Ad which constitute the first TFT element 100Ga are located on a surface plane which is flush with the surface plane of the sealing resin layer 40 (i.e. the lower surface plane in FIG. 16(*b*)) where the gate electrode 50Bg, the source electrode 50Bs and the drain electrode 50Bd which constitute the second TFT element 100Gb are located. That is, the first TFT element 100Ga and the second TFT element 100Gb are located alongside each other on the same surface plane of the sealing resin layer 40. The first TFT element 100Ga is electrically connected with the second TFT element 100Gb via the wiring 85.

In the illustrated embodiment, the first TFT element 100Ga is a switching transistor and the second TFT element 100Gb is a drive transistor. In this case, for example, it is preferred to electrically connect the drain electrode 50Ad of the first TFT element (for switch) 100Ga with the gate electrode 50Bg of the second TFT element (for drive) 100Gb via the wiring 85. The wiring 85 can be formed by etching of the metal foil 50 in the way similar to the formation of the gate electrode, the source electrode and the drain electrode each of which constitutes each component.

The flexible semiconductor device 100G as illustrated comprises a capacitor 80. The capacitor 80 holds capacitance for driving the driving TFT element 100Gb. In the illustrated embodiment, the capacitor 80 comprises the dielectric layer 82, the top electrode layer 84, and the lower electrode layer 86.

The capacitor 80 of the flexible semiconductor device 100G is explained in detail. The dielectric layer 82 of the capacitor 80 comprises same material as the gate insulating film 10A and 10B which constitutes each component and is arranged in parallel with them. That is, the lower surface of the dielectric layer 82 and the lower surfaces of the gate insulating films 10A and 10B are located on the same surface plane. The top electrode layer of the capacitor 80 comprises same material as the patterns of extraction electrodes 30As, 30Ad, 30Bs and 30Bd which constitutes each component, and is arranged in parallel with them. The lower electrode layer 86 of the capacitor 80 comprises same material as the gate electrodes, the source electrodes and the drain electrodes 50Ag, 50As, 50Ad, 50Bg, 50Bs and 50Bd which constitutes each component, and is arranged in parallel with them. That is, the lower electrode layer 86 of the capacitor 80 can be formed by etching of the metal foil 50 the same as the electrodes which constitute each component.

The lower electrode layer 86 of the capacitor 80 is connected with the drain electrode 50Ad for switch and the gate electrode 50Bg for drive. The top electrode layer 84 of the capacitor 80 is connected with the source electrode 50Bs for drive via the wiring 88. In such structure, an electric charge is held for the period which is selected by the switching TFT element 100Ga, and the voltage produced by the electric charge is impressed to the gate of driving TFT element 100Gb. Then, the drain current corresponding to the voltage flows into an organic EL device, thereby causing corresponding pixel to emit light.

In the TFT element for driving a display, which is an important use of a flexible semiconductor device, the capacitor which has a capacitance is needed for driving the element. In this regard, the capacitor 80 can be directly formed on the sealing resin layer 40, and it is not necessary to arrange a capacitor separately to the exterior of a flexible semiconductor device in the present invention. Therefore, the present invention is capable to attain an image display device comprising a small and a high density mounting.

Further saying, the dielectric layer 82 of the capacitor 80 can be formed by the same materials as the gate insulating films 10A and 10B. The top electrode layer 84 of the capacitor 80 is taken out, and it can constitute from same material as electrode pattern 30As, 30Ad, 30Bs, and 30Bd. Further, the lower electrode layer 86 of the capacitor 80 can be consisted of the same materials as the gate electrodes, the source electrodes and the drain electrodes 50Ag, 50As, 50Ad, 50Bg, 50Bs, and 50Bd. Therefore, it is capable to manufacture the capacitor 80, the first TFT element 100Ga and the second TFT element 100Gb at the same process. As a result, it can be said that the flexible semiconductor device 100G can be efficiently produced.

Just as an example, during the process of forming the gate insulating film 10 as shown in FIG. 4(*a*), the dielectric layer 82 of the capacitor 80 may be formed on the metal foil 50 together with the gate insulating film 10. In the process of forming the patterns of extraction electrodes 30*s* and 30*d* shown in FIG. 4(*b*), the top electrode layer 84 of the capacitor 80 may be formed on the dielectric layer 82 together with the patterns of extraction electrodes 30*s* and 30*d*. And then, in the etching process of the metal foil 50 as shown in FIG. 4(*e*), the lower electrode layer 86 of the capacitor may be formed together with the gate electrode, the source electrode and the drain electrode by etching the metal foil 50.

Embodiment 8

Figure 17A:
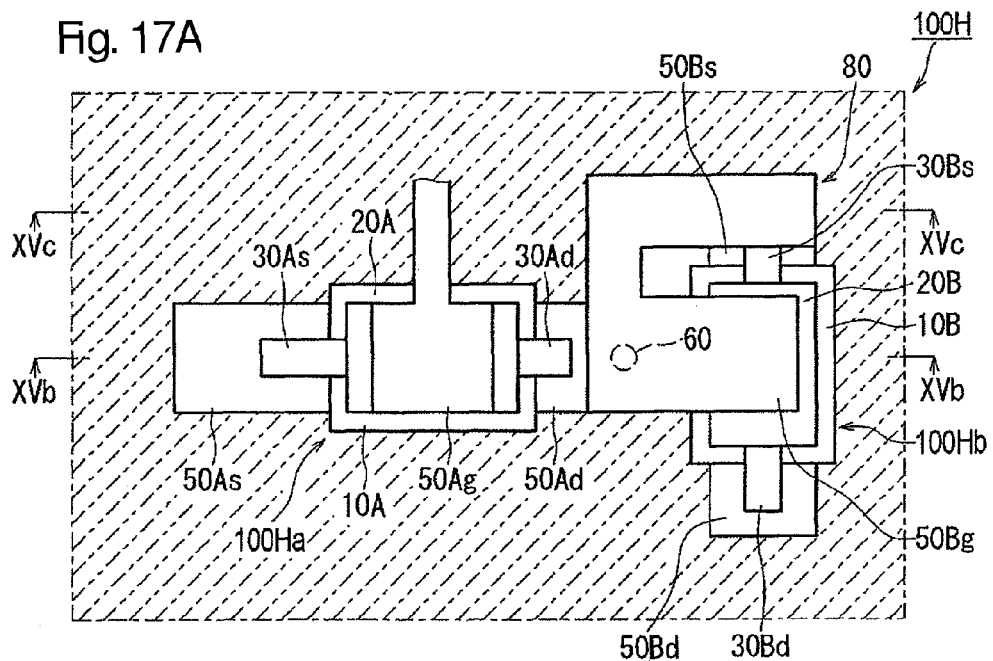
FIG. 17(a) shows a top plan view of the flexible semiconductor device 100H.
Figure 17B:
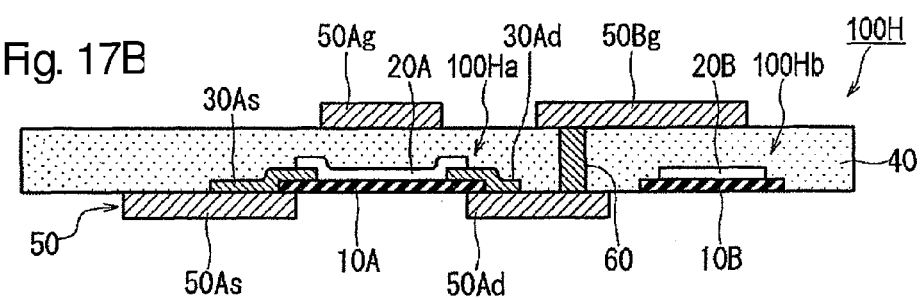
FIG. 17(b) shows a cross sectional view taken along line XVb-XVb in FIG. 17(a)
Figure 17C:
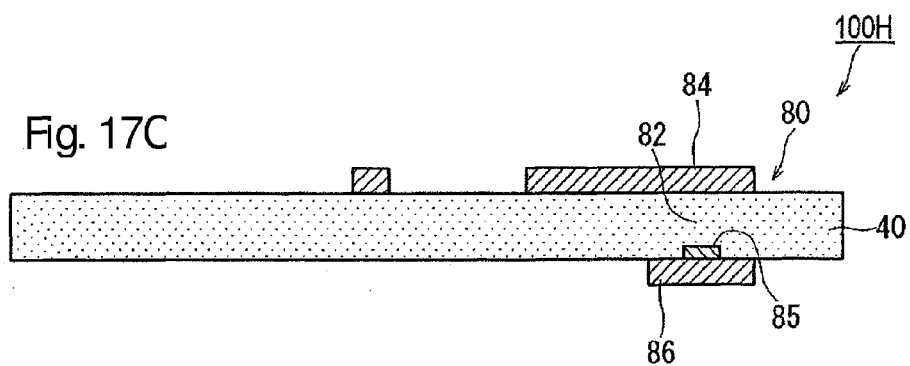
FIG. 17(c) shows a cross sectional view taken along line XVc-XVc in FIG. 17(a).

The flexible semiconductor device which can be preferably mounted on an image display device may be the flexible semiconductor device 100H as shown in FIG. 17. With reference to FIGS. 17(*a*) to 17(*c*), the embodiment of the flexible semiconductor device 100H will be explained. FIG. 17(*a*) is a top plan view of the flexible semiconductor device 100H, FIG. 17(*b*) is a cross sectional view taken along line XVb-XVb of FIG. 17(*a*), and FIG. 17(*c*) is a cross sectional view taken along line XVc-XVc of FIG. 17(*a*).

The flexible semiconductor device mounted on an image display device (e.g. an organic EL display) has at least two TFT elements, each of which comprises a semiconductor layer, a gate insulating film, a gate electrode, a source electrode and a drain electrode. Here, the number of TFTs per pixel is two pieces, and the illustrated flexible semiconductor device 100H includes a first TFT element 100Ha and a second TFT element 100Hb.

In Embodiment 8, the gate electrode 50Ag which constitutes the first TFT element 100Ha and the gate electrode 50Bg which constitutes the second TFT element 100Hb are formed on the same surface plane of the sealing resin layer 40 (i.e. the upper surface of the sealing resin layer 40 in FIG. 17), and also the source electrode 50As and the drain electrode 50Ad which constitute the first TFT element 100Ha and the source electrode 50Bs and the drain electrode 50Bd which constitute the second TFT element 100Hb are formed on the same surface plane of the sealing resin layer 40 (i.e. the lower surface of the sealing resin layer 40 in FIG. 17). The first TFT element 100Ha and the second TFT element 100Hb are electrically interconnected by an interlayer connection member 60 which serves to electrically connect between the upper surface and the lower surface of the sealing resin layer 40 (i.e. between the upper surface plane and the lower surface plane in FIG. 17).

In the illustrated example, the first TFT element 100Ha is a switching transistor whereas the second TFT element 100Hb is a drive transistor. In this case, as shown in FIG. 17(*b*), it is preferred to electrically connect the drain electrode 50Ad of the first TFT element 100Ha (for switching) and the gate electrode 50Bg of the second TFT element 100Hb (for drive) via the interlayer connection member 60.

The flexible semiconductor device 100H comprises a capacitor 80 as shown in FIG. 17(*c*). The capacitor 80 has a capacitance for driving the driving TFT element 100Hb. In the illustrated embodiment, the capacitor 80 is composed of the dielectric layer 82, the top electrode layer 84 and the lower electrode layer 86. More specifically, the top electrode layer 84 of the capacitor 80 is made of the same material as that of the gate electrodes 50Ag and 50Bg which constitute the TFT element and is arranged in parallel with them. The lower electrode layer 86 of the capacitor 80 is made of the same material as that of the source electrodes and the drain electrodes 50As, 50Ad, 50Bs and 50Bd which constitute the TFT element and is arranged in parallel with them. The dielectric layer 82 of the capacitor 80 substantially corresponds to a part the sealing resin layers 40, the part being sandwiched between the top electrode layer 84 and the lower electrode layer 86.

In order to efficiently provide the flexible semiconductor device 100H, the capacitor 80, the first TFT element 100Ha and the second TFT element 100Hb may be produced in the same process. In addition, in the etching process of the metal foil 50 as shown in FIGS. 6(*b*) and 6(*c*), the lower electrode layer 86 of the capacitor 80 may be formed upon forming the source electrode and the drain electrode, whereas in the etching process of the further another metal foil 52, the top electrode layer 84 of the capacitor 80 may be formed upon forming the gate electrode.

As shown in FIG. 17(*c*), a thickness adjusting electrode 85, which serves to adjust the thickness of the dielectric layer 82 of the capacitor 80, may be embedded into the sealing resin layer 40. In the embodiment shown in FIG. 17(*c*), the thickness adjusting electrode 85 is embedded into the lower surface side of the sealing resin layer 40 so that it is located on the upper surface of the lower electrode layer 86. The thickness adjusting electrode 85 can be made of the same material as that of the patterns of extraction electrodes 30As, 30Ad, 30Bs and 30Bd of each component. As a result, the thickness adjusting electrode can be formed in the same process of forming those patterns of extraction electrodes.

Figure 18:
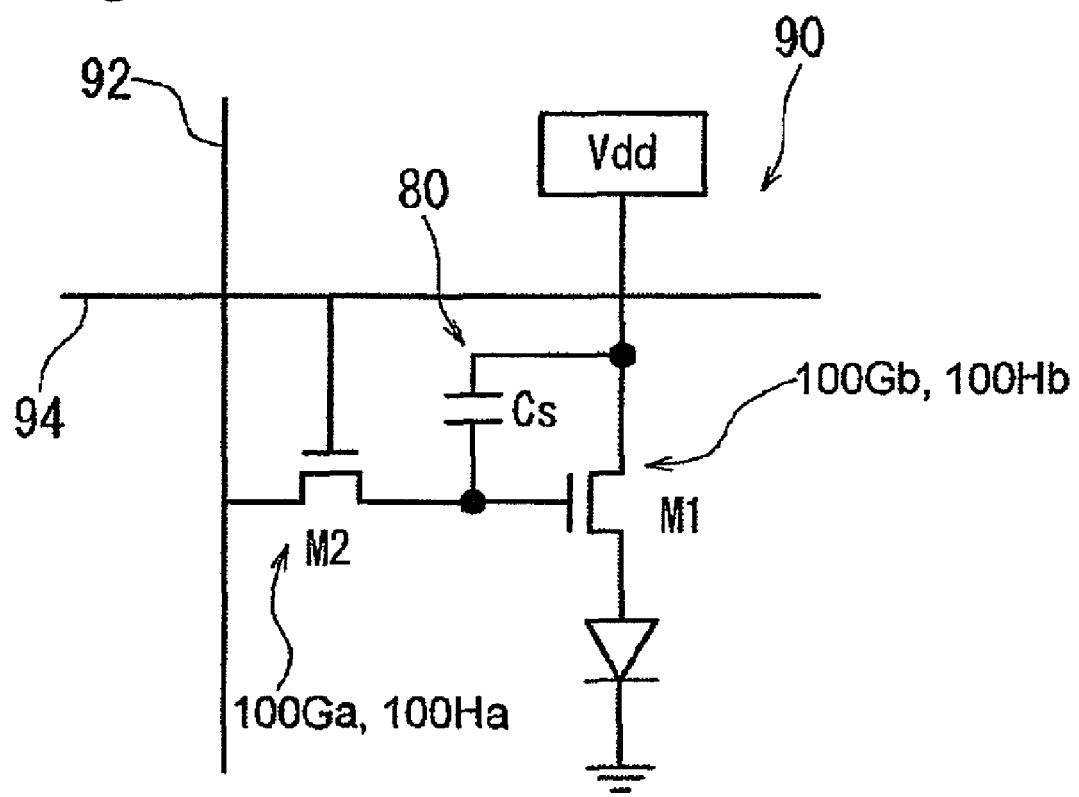
FIG. 18 shows an equivalent circuit diagram of the flexible semiconductor device 100G, 100H.

FIG. 18 shows an equivalent circuit 90 in each of the flexible semiconductor devices 100G and 100H in Embodiments 7 and 8. In FIG. 18, the wiring 92 is a data line and the wiring 94 is a selection line. The flexible semiconductor devices 100G and 100H are formed for every pixel of each image display device. A pixel may comprise not only two TFT elements but also more than three TFT elements, depending on the construction of the display, and thereby the flexible semiconductor devices 100G and 100H can be modified according to such construction.

Embodiment 9

Figure 19A:
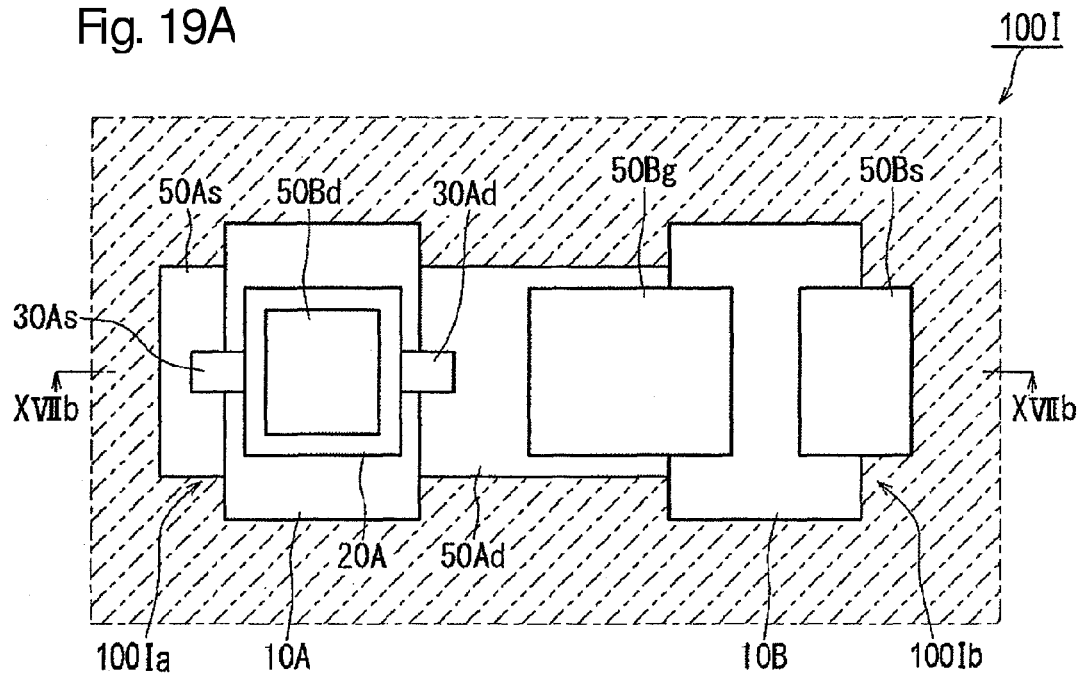
FIG. 19(a) shows a top plan view of the flexible semiconductor device 100I.
Figure 19B:
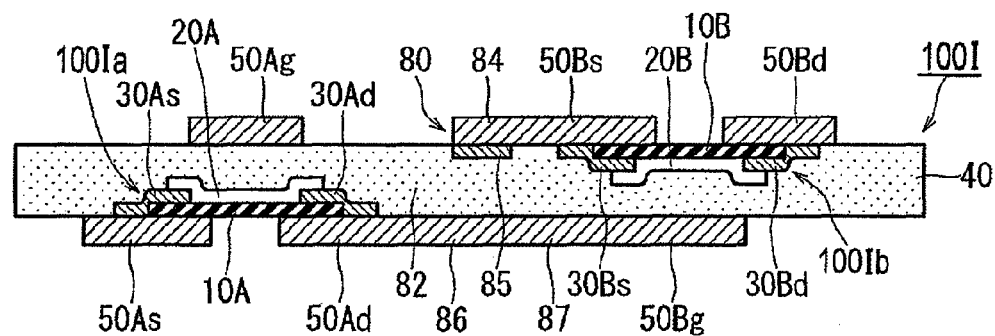
FIG. 19(b) shows a cross sectional view taken along line XVIIb-XVIIb in FIG. 19(a).

Next, another embodiment of the flexible semiconductor device which is mounted on an image display device will be described with reference to FIGS. 19(*a*) and 19(*b*). FIG. 19(*a*) shows a top plan view of the flexible semiconductor device 100I and FIG. 19(*b*) is a cross sectional view taken along line XVIIb-XVIIb of FIG. 19(*a*).

In the construction of the flexible semiconductor device 100I shown in FIGS. 19(*a*) and 19(*b*), the first TFT element is not located on the same surface plane as that of the second TFT element of the sealing resin layer. That is, each TFT element is separately located on each different surface of the sealing resin layer (i.e. one TFT element is located on the upper surface whereas the other TFT element is located on the lower surface in FIG. 19).

Specifically, in the flexible semiconductor device 100I, the gate electrode 50Ag which constitutes the first TFT element 100Ia and also the source electrode 50Bs and the drain electrode 50Bd which constitute the second TFT element 100Ib are located on one side (i.e. the upper surface) of the sealing resin layer 40. On the other hand, the source electrode 50As and the drain electrode 50Ad which constitute the first TFT element 100Ia and also the gate electrode 50Bg which constitutes the second TFT element 100Ib are located on the other side (i.e. the lower surface) of the sealing resin layer 40. The first TFT element 100Ia and the second TFT element 100Ib are electrically interconnected via a wiring.

In the illustrated embodiment, the first TFT element 100Ia is a switching transistor whereas the second TFT element 100Ib is a drive transistor. In this case, it is preferred to electrically interconnect gate electrode 50Bg of the second TFT element (for drive) 100Ib and the drain electrode 50Ad of the first TFT element 100Ia via the wiring 87. This wiring 87 can be formed by etching the metal foil 50 in the way similar to the formation of the gate electrode 50As, the source electrode 50Ad and the drain electrode 50Bg each of which constitutes the TFT element.

Thus, as for the flexible semiconductor device 100I, the first TFT element 100Ia is arranged to oppose to the second TFT element 100Ib across the sealing resin layer 40. Therefore, a floor space of the flexible semiconductor device 100I can be made small compared with the flexible semiconductor device 100G (see FIG. 16) wherein the components 100Ha and 100Hb are located alongside each other on the same surface plane of the sealing resin layer. As a result, the wiring length interconnecting the TFT elements 100Ia and 100Ib can be shortened, and thus the wiring resistance can be decreased. Consequently, a wiring delay which delays rising edge and falling edge of signals can be reduced (or minimized). Partially in a case where the screen size of an image display device becomes large, there is a tendency for the wiring delay to become larger. Accordingly, the effect resulted from adopting the construction of the flexible semiconductor device 100I of this Embodiment 9 can be especially demonstrated.

The flexible semiconductor device 100I may comprise the capacitor 80. The capacitor 80 is composed of the dielectric layer 82, the top electrode layer 84 and the lower electrode layer 86. In this Embodiment 9, the thickness adjusting electrode 85 is formed for the top electrode layer 84 of the capacitor 80.

Figure 20A:
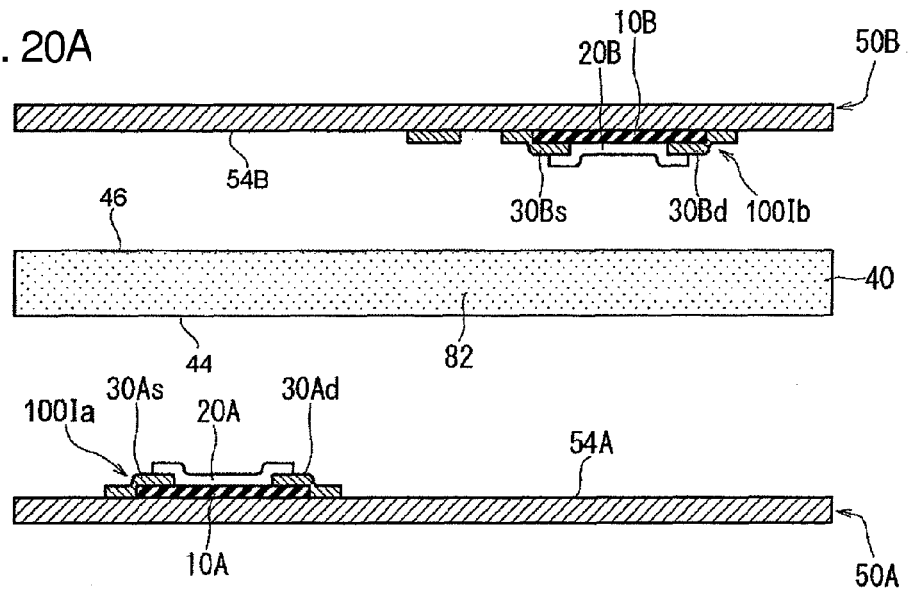
FIGS. 20(a) to 20(c) show a process sectional view, which schematically shows each of manufacturing steps of the flexible semiconductor device 100I of the present invention.
Figure 20B:
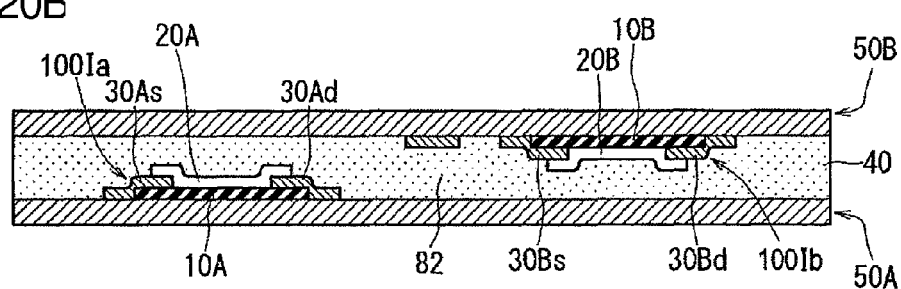
Figure 20C:
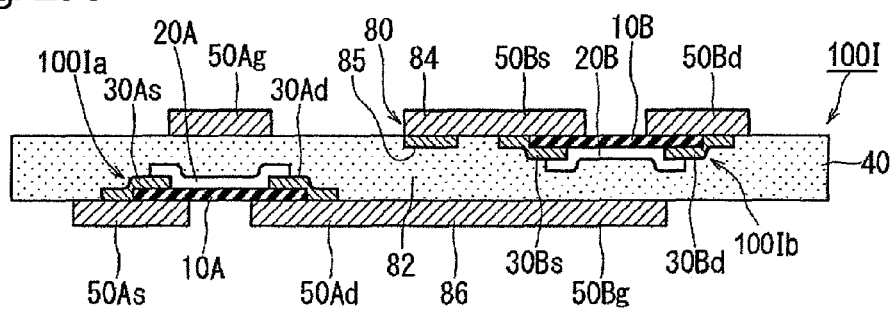

Next, with reference to FIGS. 20(*a*) to 20(*c*), the manufacturing method of the flexible semiconductor device 100I will be explained. FIGS. 20(*a*) to 20(*c*) are process sectional views of the flexible semiconductor device 100I taken along line XVIIb-XVIIb of FIG. 19(*a*).

First, as shown in FIG. 20(*a*), the first metal foil 50A, the second metal foil 50B and one sealing resin film 40 are provided.

Here, the first metal foil 50A is a metal foil by which each electrode can be produced. The first metal foil 50A has a semiconductor layer formation side 54A (i.e. upper surface thereof in FIG. 20) on which a semiconductor layer 20A is stacked via an insulating film 10A.

On the other hand, the second metal foil 50B is a metal foil by which each electrode can be produced. The second metal foil 50B has a semiconductor layer formation side 54B (i.e. lower surface thereof in FIG. 20) on which a semiconductor layer 20B is stacked via an insulating film 10B. It is capable to manufacture the metal foil 50A with the semiconductor layer formation side 54A and metal foil 50B with the semiconductor layer formation side 54B by performing the steps as shown in FIGS. 5(*a*) to 5(*c*), for example.

Next, an embedding process is carried out as shown in FIG. 20(*b*). Specifically, the semiconductor layer formation side 54A (upper surface in FIG. 20) of the first metal foil 50A is laminated onto one surface 44 (lower surface in FIG. 20) of the sealing resin film 40. By doing so, the semiconductor layer 20A and the insulating film 10A which are provided on the semiconductor layer formation side 54A can be embedded into the one surface 44 (lower surface in FIG. 20(*a*)) of the sealing resin 40. In addition, the semiconductor layer formation side 54B (lower surface in FIG. 20) of the second metal foil 50B is laminated onto the other surface 46 (upper surface in FIG. 20) of the sealing resin film 40. By doing so, the semiconductor layer 20B and the insulating film 10B which are provided on the semiconductor layer formation side 54B can be embedded into the other surface 46 (upper surface in FIG. 20(*a*)) of the sealing resin 40.

As illustrated, a lamination of the first metal foil 50A, the sealing resin film 40 and the second metal foil 50B each other may be performed in the same process. That is, each of the first metal foil 50A, the sealing resin film 40 and the second metal foil 50B may be aligned and laminated each other so that each of the semiconductor layers 20A and 20B is sealed, thereby integrating each layers as a single unit as shown in FIG. 20(*b*). Such integration may be performed for example by heating the metal foils 50A and 50B at a predetermined temperature and pressurizing the laminated layers by the roll laminating process, the vacuum laminating process or the heat pressing process and so forth.

After the first metal foil 50A, the sealing resin film 40 and the second metal foil 50B are integrated, the first metal foil 50A is etched as shown in FIG. 20(*c*). The etching of the first metal foil 50A produces the source electrode 50As and the drain electrode 50Ad of the first TFT element 100Ia and the gate electrode 50Bg of the second TFT element 100Ib. On the other hand, the etching of the second metal foil 50B produces the gate electrode 50Ag of the first TFT element 100Ia and the source electrode 50Bs and the drain electrode 50Bd of the second TFT element 100Ib. The etching of the first metal foil 50A and the etching of the second metal foil 50B can be performed in the same process. However, the etching of the first metal foil 50A is not limited to perform in the same process as the etching of the second metal foil 50B, but each of them may be performed in a separate process.

By passing through the above process, the flexible semiconductor device 100I as shown in FIGS. 19(*a*) and 19(*b*) can be obtained.

Embodiment 10

Next, with reference to FIGS. 21(*a*) to 21(*c*), the flexible semiconductor device 100J is explained. FIG. 21(*a*) is a top plan view of the flexible semiconductor device 100J, FIG. 21(*b*) is a cross sectional view showing the Xb-Xb cross section of FIG. 21(*a*), and FIG. 21(*c*) is a cross sectional view showing the Xc-Xc cross section of FIG. 21(*a*).

In the construction of the flexible semiconductor device 100J as shown in FIGS. 21(*a*) to 21(*c*), the first TFT element and the second TFT element are not located alongside each other on the same surface plane of the sealing resin layer, but each one TFT element is separately located on each different surface of the sealing resin layer (the upper surface and the lower surface in FIG. 21) the same as in Embodiment 9.

Specifically, the gate electrode 50Ag, the source electrode 50As and the drain electrode 50Ad which constitute the first TFT element 100Ja are formed on one surface 44 (lower surface) of the sealing resin layer 40. On the other hand, the gate electrode 50Bg, the source electrode 50Bs and the drain electrode 50Bd which constitute the second TFT element 100Jb are formed on the other surface 46 (upper surface) of the sealing resin layer 40. And the first TFT element 100Ja may be electrically connected with the second TFT element 100Jb by an interlayer connection member, which electrically connects a member on the upper surface of the sealing resin layer 40 with another member on the lower surface of the sealing resin layer 40 each other. This interlayer connection member may comprise, for example, an electric conductive paste which is filled in the through-hole, which penetrates from the upper surface to the lower surface of the sealing resin layer 40.

In the illustrated embodiment, the first TFT element 100Ja is a switching transistor, and the second TFT element 100Jb is a drive transistor. In this case, for example, it is preferred to electrically connect the drain electrode 50Ad of the first TFT element (for switch) 100Ja with the gate electrode 50Bg of the second TFT element (for drive) 100Jb via the interlayer connection member 60.

In the flexible semiconductor device 100J, one TFT element 100Ja is arranged on the lower surface 44 of the sealing resin layer 40 and another TFT element 100Jb is arranged on the upper surface 46 of the sealing resin layer 40. By doing so, for example, a floor space of the flexible semiconductor device 100J can be made small compared with the flexible semiconductor device 100G (see FIG. 16) wherein each of the components 100Ga and 100Gb are located alongside each other on the same surface plane of the sealing resin layer.

As illustrated, the capacitor 80 is also formed in the flexible semiconductor device 100J. As illustrated, the capacitor 80 comprises the dielectric layer 82, the top electrode layer 84 and the lower electrode layer 86. In the illustrated embodiment, the lower electrode layer 86 of the capacitor 80 is electrically connected with the drain electrode 50Ad of the switching TFT element 100Ja. The top electrode layer 84 of the capacitor 80 is electrically connected with the source electrode 50Bs of the driving TFT element 100Jb via the interlayer connection member 62.

According to this Embodiment 10, a composite sealing member, which comprises the core member 42 of a film and each of resin layers 40A and 40B each of which is laminated on to each surface of the core material 42, respectively, is used as the sealing resin layer 40. As the core member 42, it may comprise a resin film excellent in dimensional stability. The resin material for the core member 42 includes an epoxy resin, a polyimide (PI) resin, an acrylic resin, a polyethylene terephthalate (PET) resin, a polyethylene naphthalate (PEN) resin, a polyphenylene sulfide (PPS) resin, a polyphenylene ether (PPE) resin and the forth. As the resin layers 40A and 40B, which are laminated on to both surfaces of the core member 42, a resin material which has the properties that the semiconductor layers 20A and 20B can be embedded thereinto and has a flexibility after being cured is preferable. For example, a composite sealing member which comprises a core member 42, onto both surface of which an epoxy resin or PPE resin in an uncured condition is applied, can be used. Thus, the handling property and the dimensional stability of the sealing resin layer 40 can be improved by inserting the core member 42 between the resin layers (embedded layers) 40A and 40B. Therefore, the present invention contributes to the improvement of the productivity of the flexible semiconductor device 100J.

Figure 22A:
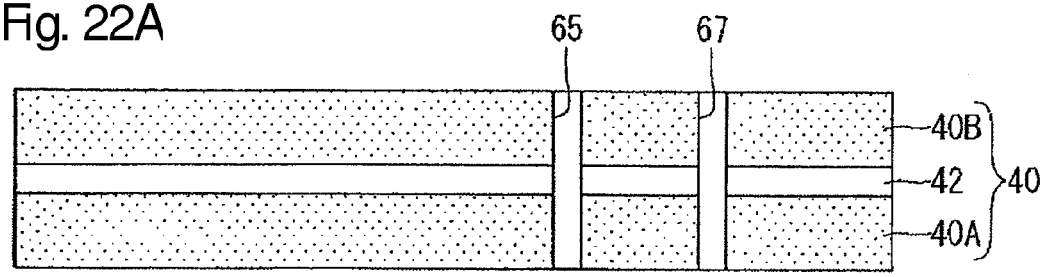
FIGS. 22(a) and 22(b) show a process sectional view of manufacturing steps of the flexible semiconductor device 100J of the present invention.
Figure 22B:
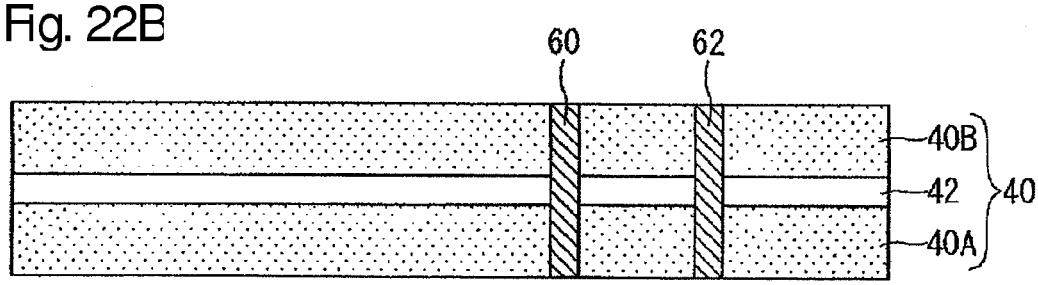
Figure 23A:
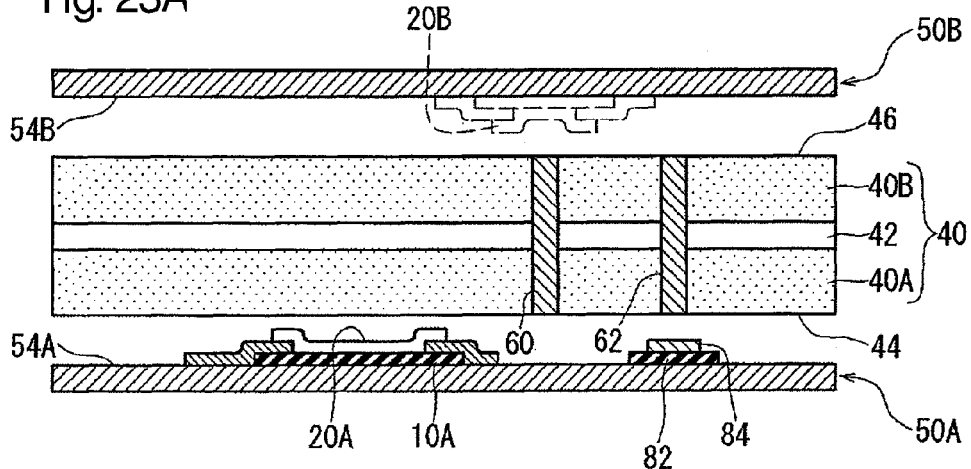
FIGS. 23(a) to 23(c) show a process sectional view, which schematically shows each of manufacturing steps of the flexible semiconductor device 100J of the present invention.
Figure 23B:
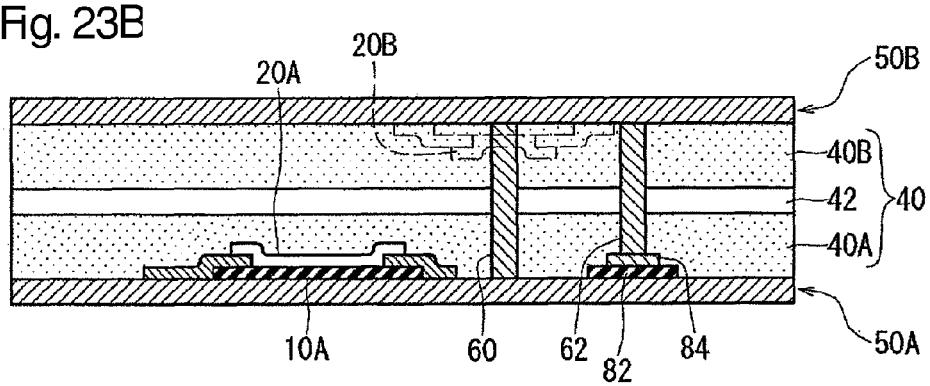
Figure 23C:
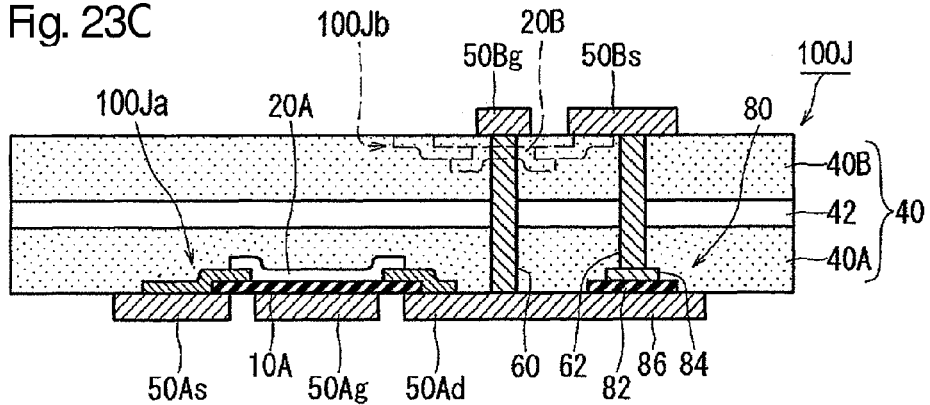

Next, with reference to FIGS. 22(*a*) and 22(*b*) as well as FIGS. 23(*a*) to 23(*c*), the manufacturing method of the flexible semiconductor device 100J is explained. FIGS. 23(a) to 23(c) is a process sectional view of the flexible semiconductor device 100J in Xc-Xc cross section of FIG. 21(a).

First, as shown in FIG. 22(a), the resin layer 40A is laminated on the lower surface of the core member 42 in a film condition and the resin layer 40B is laminated on the upper surface of the core member 42, respectively, thereby producing the sealing resin film 40 having a film condition, which is the composite sealing member. Subsequently, through holes 65 and 67 are formed at predetermined positions of the produced sealing resin film 40. The through holes 65 and 67 can be easily formed by, for example, punching processing or laser radiation and so forth.

After the through holes 65 and 67 are formed, as shown in FIG. 22(b), the through holes 65 and 67 are filled with a conductive paste (for example, conductive paste which comprises silver powder and epoxy resin), thereby forming an interlayer connection members 60 and 62, each of which electrically connects a member on the upper surface of the sealing resin film with another member on the lower surface of the sealing resin film each other. Thus, the sealing resin film having the interlayer connection members 60 and 62 is obtained.

Next, as shown in FIG. 23(a), the first metal foil 50A having the semiconductor layer formation side 54A (upper surface) in which the semiconductor layer 20A was formed is supplied. The second metal foil 50B having the semiconductor layer formation side 54B (lower surface) in which the semiconductor layer 20B was formed is also supplied. Those first metal foil 50A and second metal foil 50B are easily produced, for example, through each of the steps as shown in FIGS. 4(a) to 4(c).

Next, as shown in FIGS. 23(a) and 23(b), the semiconductor layer formation side 54A of the first metal foil 50A is laminated onto one surface 44 of the sealing resin film, thereby embedding the semiconductor layer 20A which constitutes the first TFT element 100Ja into one surface 44 of the sealing resin film 40. At this time, the first metal foil 50A and the sealing resin film 40 are aligned and pressedly bonded so that the semiconductor layer formation side 54A of the first metal foil 50A and the interlayer connection members 60 and 62 are connected.

The semiconductor layer 20B, which constitutes the second TFT element 100Jb, is embedded into the other surface 46 of the sealing resin 40 by laminating the semiconductor layer formation side 54B of the second metal foil 50B onto the another surface of the sealing resin film 40. At this time, the second metal foil 50B and the sealing resin film 40 are aligned and pressedly bonded so that the semiconductor layer formation side 54A of the second metal foil 50B and the interlayer connection members 60 and 62 are connected.

After the first metal foil 50A, the sealing resin film 40 and the second metal foil 50B are integrated, the gate electrode 50Ag, the source electrode 50As and the drain electrode 50Ad which constitute the first TFT element 100Ja are formed by etching the first metal foil 50A as shown in FIGS. 23(b) and 23(c). Thus, the first TFT element 100Ja can be manufactured. In addition, the gate electrode 50Bg, the source electrode 50Bs and the drain electrode 50Bd which constitute the second TFT element 100Jb are formed by etching the second metal foil 50B.

Figure 21A:
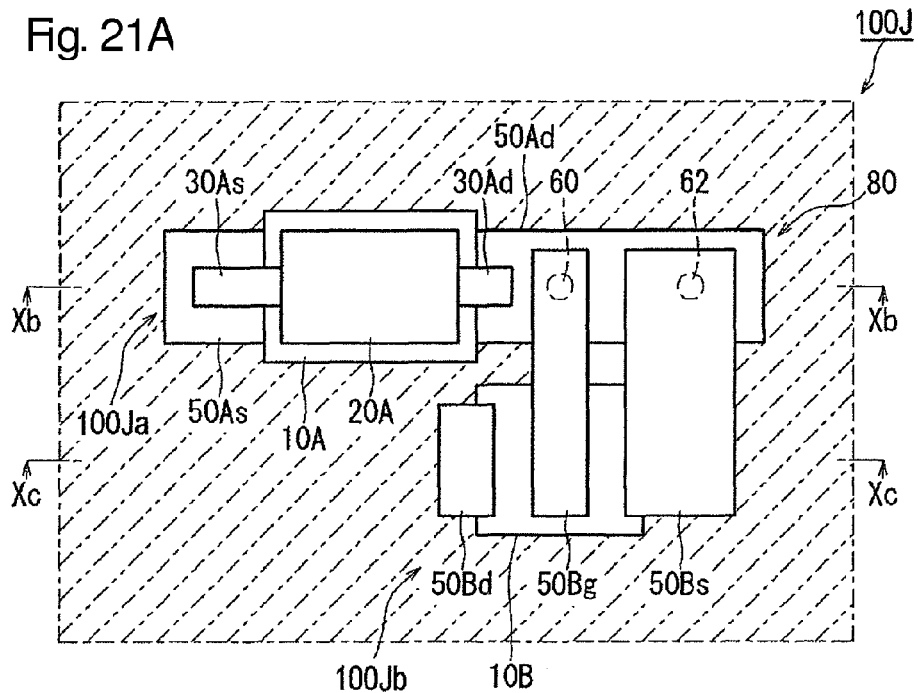
FIG. 21(a) shows a top plan view of the flexible semiconductor device 100J.
Figure 21B:
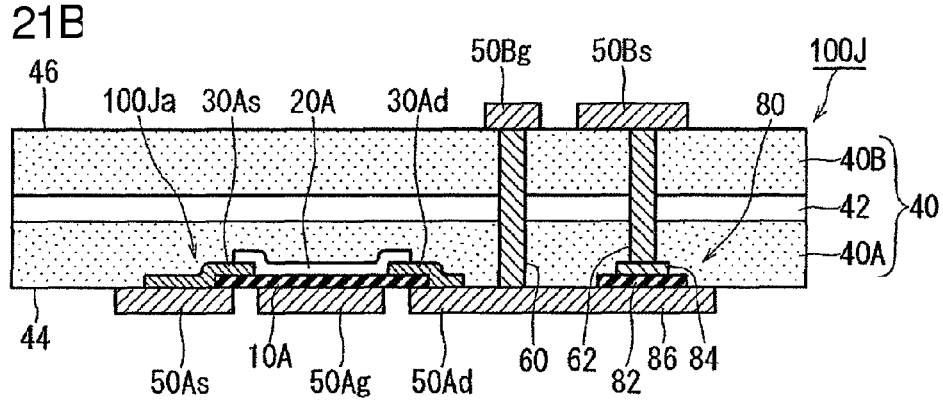
FIG. 21(b) shows a cross sectional view taken along line Xb-Xb in FIG. 21(a)
Figure 21C:
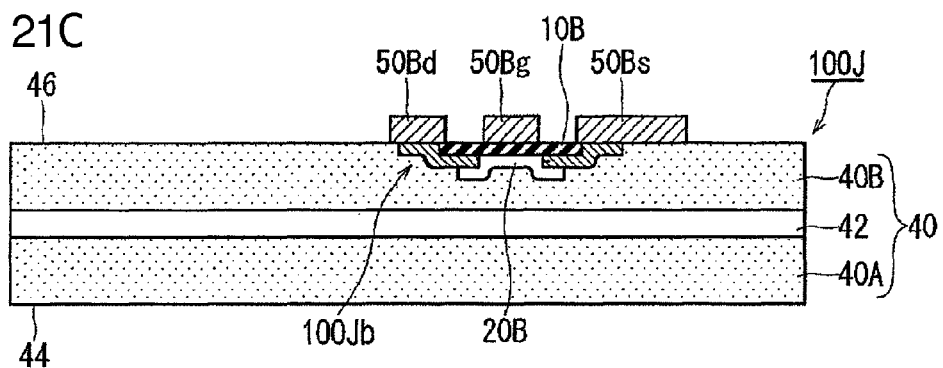
FIG. 21(c) shows a cross sectional view taken along line Xc-Xc in FIG. 21(a).

By passing through the above process, the flexible semiconductor device 100J as shown in FIGS. 21(a) to 21(c) can be obtained.

Embodiment 11

Figure 24:
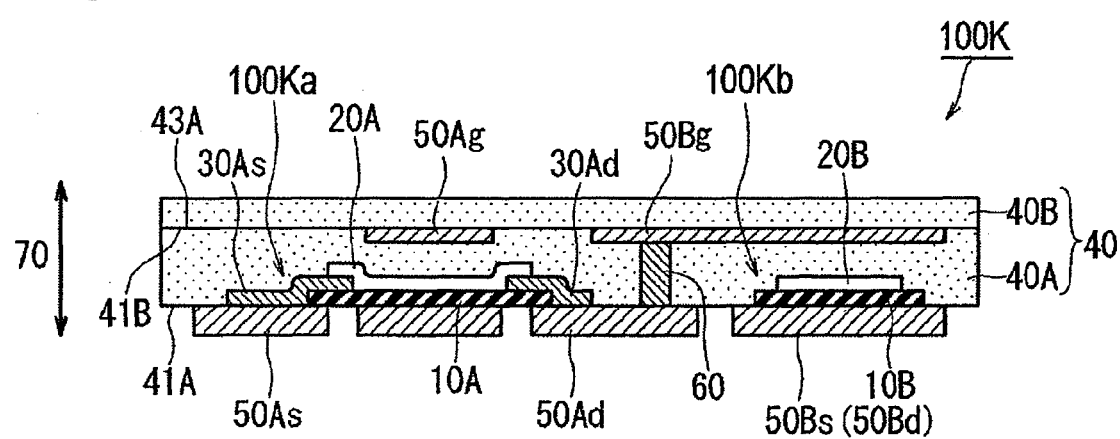
FIG. 24 shows a cross sectional view of the flexible semiconductor device 100K.

Next, the flexible semiconductor device 100K as shown in FIG. 24 is explained. The sealing resin layer 40 of the flexible semiconductor device 100K shown in FIG. 24 has a laminated construction in which the first sealing resin layer 40A and the second sealing resin layer 40B are laminated together. In the illustrated embodiment, the first sealing resin 40A constitutes the lower layer of the sealing resin layer 40, and the second sealing resin 40B constitutes the upper layer of the sealing resin layer 40.

Each of the source electrodes and the drain electrodes 50As, 50Ad, 50Bs and 50Bd, which constitutes each component, is formed on the outside surface 41A (lower surface in FIG. 24) in the laminating direction 70 (or thickness direction of laminated construction) of the first sealing resin layer 40A. On the other hand, the gate electrodes 50Ag and 50Bg, which constitute each component, are formed on the inside surface 41B (lower surface in FIG. 24) in the laminating direction 70 of the second sealing resin layer 40B.

Thus, the distance between the gate electrodes 50Ag, 50Bg and the semiconductor layers 20A and 20B can be reduced by embedding each of the gate electrodes 50Ag and 50B of each component inside the sealing resin layer 40. Therefore, the thickness of the gate insulating film which constitutes a part of the sealing resin layer 40 can be reduced. The first sealing resin layer 40A may be made of the same resin material as the second sealing resin layer 40B or be made of different resin material. However, it is preferable to make the both sealing resin layers of the same material. When the both sealing resin layers are made of the same material, a difference in physical property values such as a thermal expansion coefficient between the resin layers disappears, thereby improving the reliability of a semiconductor device. In the case where the first sealing resin layer 40A and the second sealing resin layer 40B are made of the same material, the border planes 41B and 43A shown in FIG. 24 are substantially absent.

The manufacturing method of the above mentioned flexible semiconductor device 100K is explained with reference to FIGS. 25(a) to 25(c).

Figure 25A:
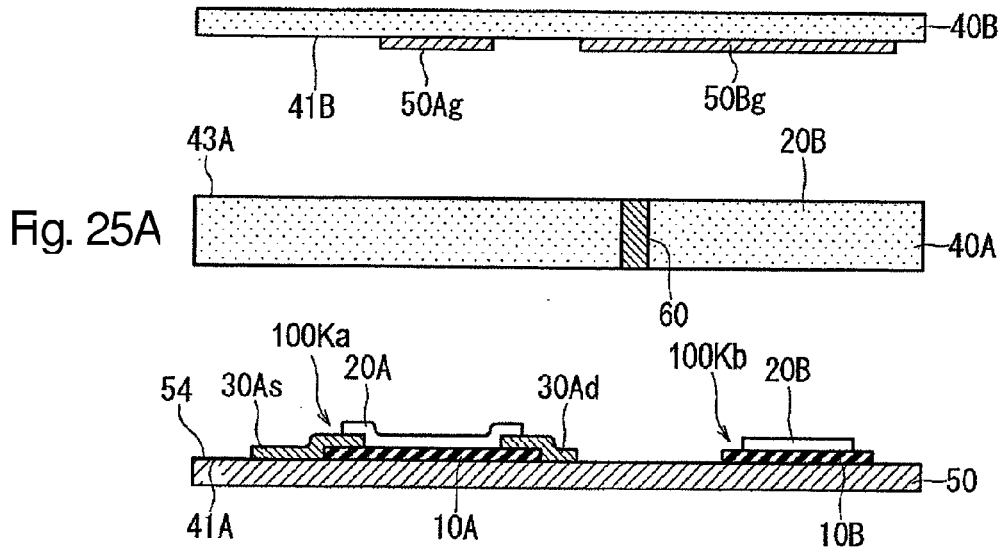
FIGS. 25(a) to 25(c) show a process sectional view, which schematically shows each of manufacturing steps of the flexible semiconductor device 100K of the present invention.

First, as shown in FIG. 25(a), the sealing resin film 40A and the flexible substrate 40B having the wiring layer formation side 41B in which each gate electrode 50Ag, 50Bg which constitutes each component are formed are supplied. On the other hand, the first metal foil 50 having the semiconductor layer formation side 54 in which the semiconductor layers 20A and 20B, each of which constitutes each component, are formed is supplied.

Here, the sealing resin film 40A is a resin film for constituting the first sealing resin layer 40A of the sealing resin layer 40, and the interlayer connection member 60 is formed at the predetermined position.

The flexible substrate 40B is a resin film for constituting the second sealing resin layer 40B of the sealing resin layer 40, and on the surface thereof, each wiring layer each containing the gate electrodes 50Ag and 50Bg, each of which constitutes each component, is formed.

The metal foil 50 is a metal foil in a step prior to the step where each of the source electrodes and the drain electrodes 50As, 50Ad, 50Bs and 50Bd is formed by etching. On the surface of the metal foil 50, each of the semiconductor layers 20A and 20B is formed via the insulating films 10A and 10B.

Figure 25B:
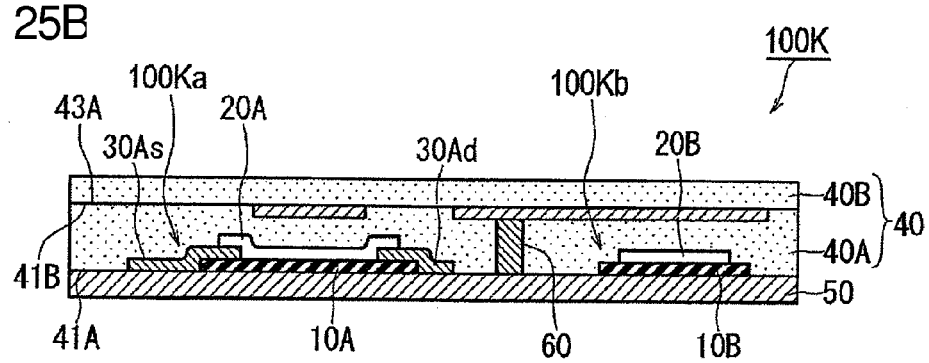
Figure 25C:
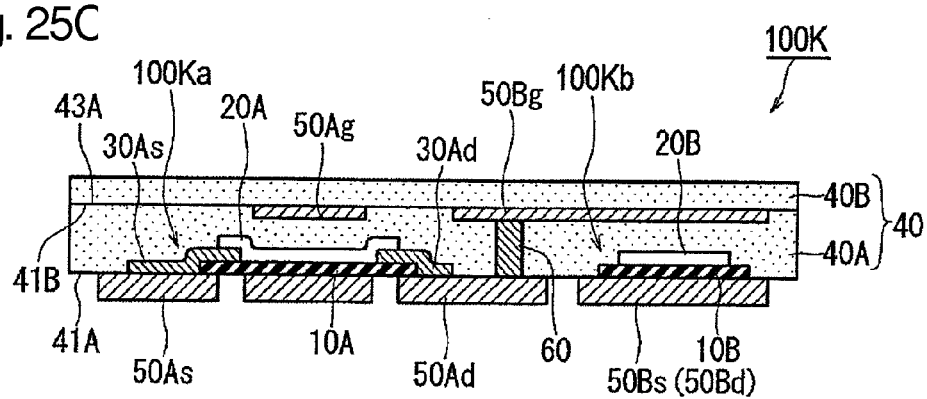

Next, as shown in FIG. 25(b), each of the semiconductor layers 20A and 20B, each of which constitutes each component, is embedded into one surface of the sealing resin film 40A from the surface 41A by laminating the semiconductor layer formation side 54 of the first metal foil 50 onto the surface 41A of the sealing resin film 40A. At this time, the first metal foil 50 and the sealing resin film 40A are aligned and pressedly bonded so that the metal foil 50 and the interlayer connection members 60 are connected.

On the other hand, the wiring layer formation side 41B of the flexible substrate 40B is laminated onto the surface 43A, which is opposite to the surface 41A (namely, the surface in which the source electrode and the drain electrode are formed) where the metal foil 50 is pressedly bonded, of the sealing resin films 40A. By doing so, the wiring layer containing the gate electrodes 50Ag and 50Bg can be embedded into the surface 43A of the sealing resin film 40A. At this time, the flexible substrate 40B and the sealing resin layer 40 are aligned and pressedly bonded, so that a part of the wiring layer formation side 41B and the interlayer connection member 60 are connected.

Thus, the sealing resin film 40A, the flexible substrate 40B and the first metal foil 50 are integrated. Next, as shown in FIG. 25(*c*), each of the source electrodes and the drain electrodes 50As, 50Ad, 50Bs and 50Bd, each of which constitutes each component, is formed by etching the first metal foil 50.

By passing through the above process, the first TFT element 100Ka and second TFT element 100Kb can be manufactured, so that the flexible semiconductor device 100K as shown in FIG. 24 can be obtained.

Embodiment 12

Figure 26:
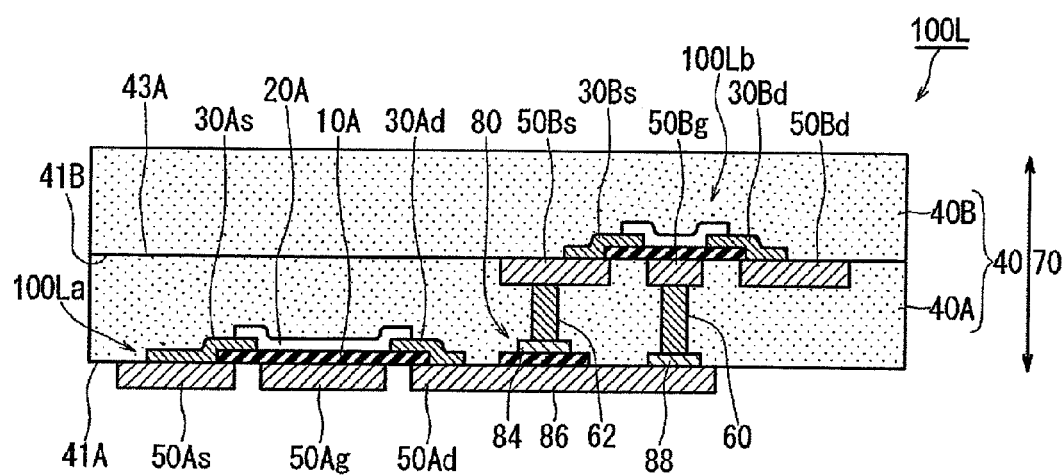
FIG. 26 shows a cross sectional view of the flexible semiconductor device 100L.

Next, the flexible semiconductor device 100L shown in FIG. 26 is explained.

In the flexible semiconductor device 100L shown in FIG. 26, the gate electrode 50Ag, the source electrode 50As and the drain electrode 50Ad, which constitute the first TFT element 100La, are formed on one surface of the sealing resin layers 40. On the other hand, the gate electrode 50Bg, the source electrode 50Bs and the drain electrode 50Bd, which constitute the second TFT element 100Lb, are formed inside of the sealing resin layer 40.

Specifically, gate electrode 50Ag, source electrode 50As, and drain electrode 50Ad which constitute the first TFT element 100La are formed in the surface (a figure lower surface) 41A of the outside in the laminating direction (or thickness direction of laminated construction) 70 of the first sealing resin layer 40A. On the other hand, gate electrode 50Bg, source electrode 50Bs, and drain electrode 50Bd which constitute the second TFT element 100Lb are formed in the surface (a figure lower surface) 41B of the inner side in the laminating direction 70 of the second sealing resin layer 40B.

In the illustrated embodiment, the first TFT element 100La is a switching transistor, and the second TFT element 100Lb is a drive transistor. In this case, it is preferred to electrically connect the gate electrode 50Bg of the second TFT element (for drive) 100Lb and the drain electrode 50Ad of the first TFT element (for switch) 100La with the interlayer connection member 60.

It is capable to make a layered construction of sealing resin layers in which each layer having a TFT element per each layer, respectively, by laminating a plurality of resin layers. Accordingly, the packaging density of TFT elements can be further increased. Therefore, the wiring length for connecting components 100La and 100Lb can be further shortened, and as a result, wiring delay can be effectively reduced.

The flexible semiconductor device 100L as illustrated also has the capacitor 80. The lower electrode layer 86 of the capacitor 80 is electrically connected with the drain electrode 50Ad of the first TFT element (for switch) 100La. In addition, the top electrode layer 84 of the capacitor 80 is electrically connected with the source electrode 50Bs of the second TFT element (for drive) 100Lb with the interlayer connection member 62.

Figure 27A:
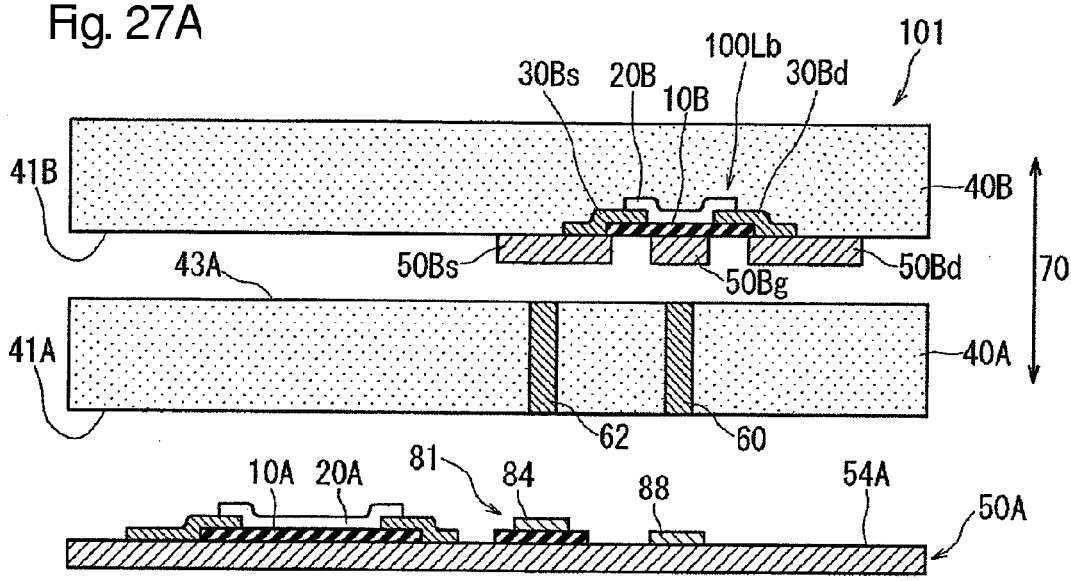
FIGS. 27(a) to 27(c) show a process sectional view, which schematically shows each of manufacturing steps of the flexible semiconductor device 100L of the present invention.
Figure 27B:
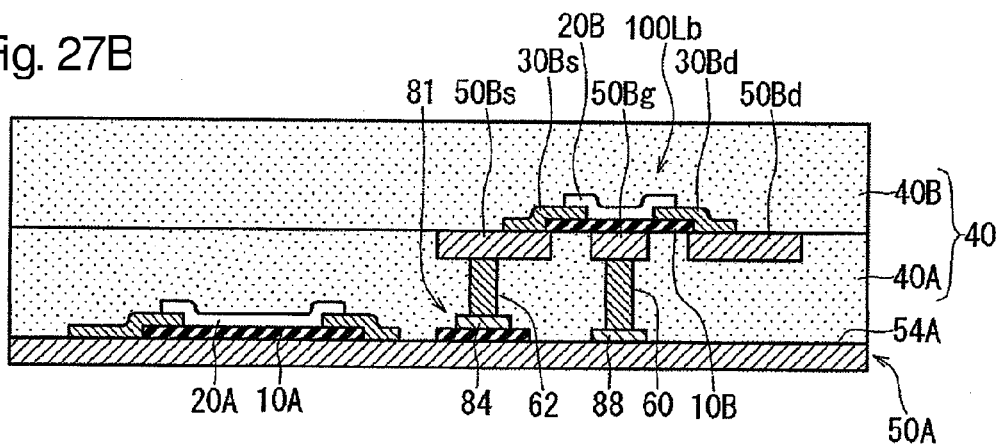
Figure 27C:
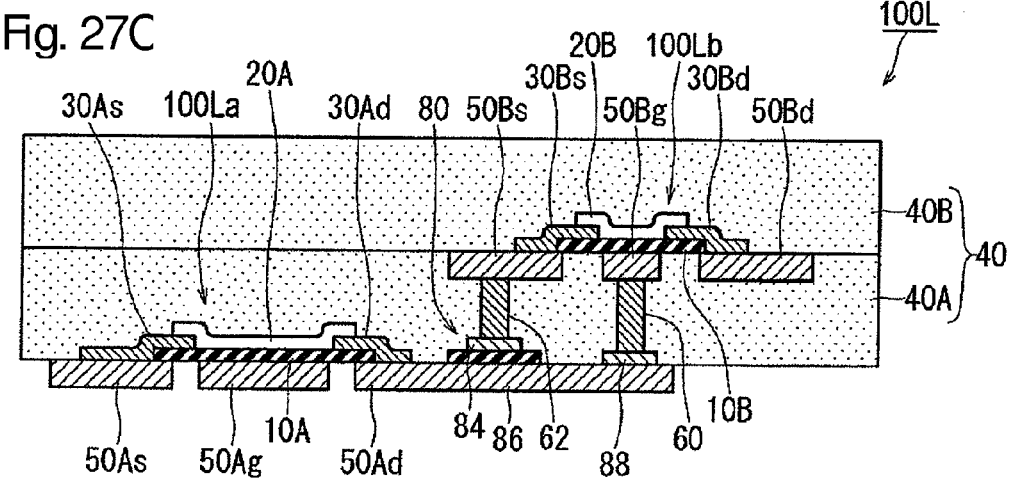

Next, with reference to FIGS. 27(*a*) to 27(*c*), the manufacturing method of the flexible semiconductor device 100L is explained.

First, as shown in FIG. 27(*a*), the first sealing resin film 40A is supplied and the second sealing resin film 40B having the electrode formation side 41B, in which the gate electrode 50Bg, the source electrode 50Bs and the drain electrode 50Bd, which constitute the second TFT element 100Lb, are formed, is supplied. In addition, the metal foil 50A having the semiconductor layer formation side 54A, in which the semiconductor layer 20A, which constitutes the first TFT element 100La, is formed, is also supplied.

Here, the first sealing resin film 40A is a resin film for constituting the first sealing resin layer 40A of the sealing resin 40, and the interlayer connection members 60 and 62 are formed in the predetermined position. Such a resin film 40A can be produced by, for example, through the process shown in FIGS. 22(*a*) and 22(*b*).

The second sealing resin film 40B is a resin film for constituting the second sealing resin 40B of the sealing resin layer 40. The gate electrode 50Bg, the source electrode 50Bs and the drain electrode 50Bd which constitute the second TFT element 100Lb are formed on the surface thereof. In addition, the gate insulating film 10B and the semiconductor layer 20B, which constitute the second TFT element 100Lb, are embedded inside of the second sealing resin film 40B. Such a resin film 40B can be formed by passing through, for example, the processes shown in FIGS. 4(*a*) to 4(*e*).

The metal foil 50A is a metal foil in a step prior to the step where the gate electrode 50Ag, the source electrode 50As and the drain electrode 50Ad are formed by etching. On the surface of the metal foil 50A, the semiconductor layers 20A is formed via the insulating film 10A. Such a metal foil 50A can be formed by passing through, for example, the processes shown in FIGS. 4(*a*) to 4(*c*).

Next, as shown in FIG. 27(*b*), the semiconductor layer formation side 54A of the metal foil 50A is laminated onto one surface 41A of the sealing resin film 40A. Thereby, the semiconductor layer 20A which constitutes the first TFT element 100La is embedded into one surface 41A of the first sealing resin film 40A. At this time, the metal foil 50A and the sealing resin film 40A are aligned and pressedly bonded, so that an electrical connection between the wiring 88 formed on the semiconductor layer formation side 54A and the interlayer connection member 60, as well as an electrical connection between the top electrode layer 84 of the capacitor 80 and the interlayer connection member 62 can be formed.

In addition, the electrode formation side 41B of the second sealing resin film 40B is laminated onto another surface 43A of the first sealing resin film 40A. Thereby, each of the gate electrode 50Bg, the source electrode 50Bs and the drain electrode 50Bd, which constitute the second TFT element 100Lb is embedded into another surface 43A of the first sealing resin film 40A. At this time, the second sealing resin film 40B and the sealing resin film 40A are aligned and pressedly bonded, so that an electrical connection between the gate electrode 50Bg formed on the electrode formation side 41B and the interlayer connection member 60, as well as an electrical connection between the source electrode 50Bs and the interlayer connection member 62 can be formed.

After the first sealing resin film 40A, the second sealing resin film 40B and the metal foil 50A are integrated, as shown in FIGS. 27(*b*) and 27(*c*), the gate electrode 50Ag, the source electrode 50As and the drain electrode 50Ad, each of which constitutes the first TFT element 100La, are formed by etching the metal foil 50A.

By the above processes, the flexible semiconductor device 100L as shown in FIG. 26 can be obtained.

(Image Display Device)

Figure 28:
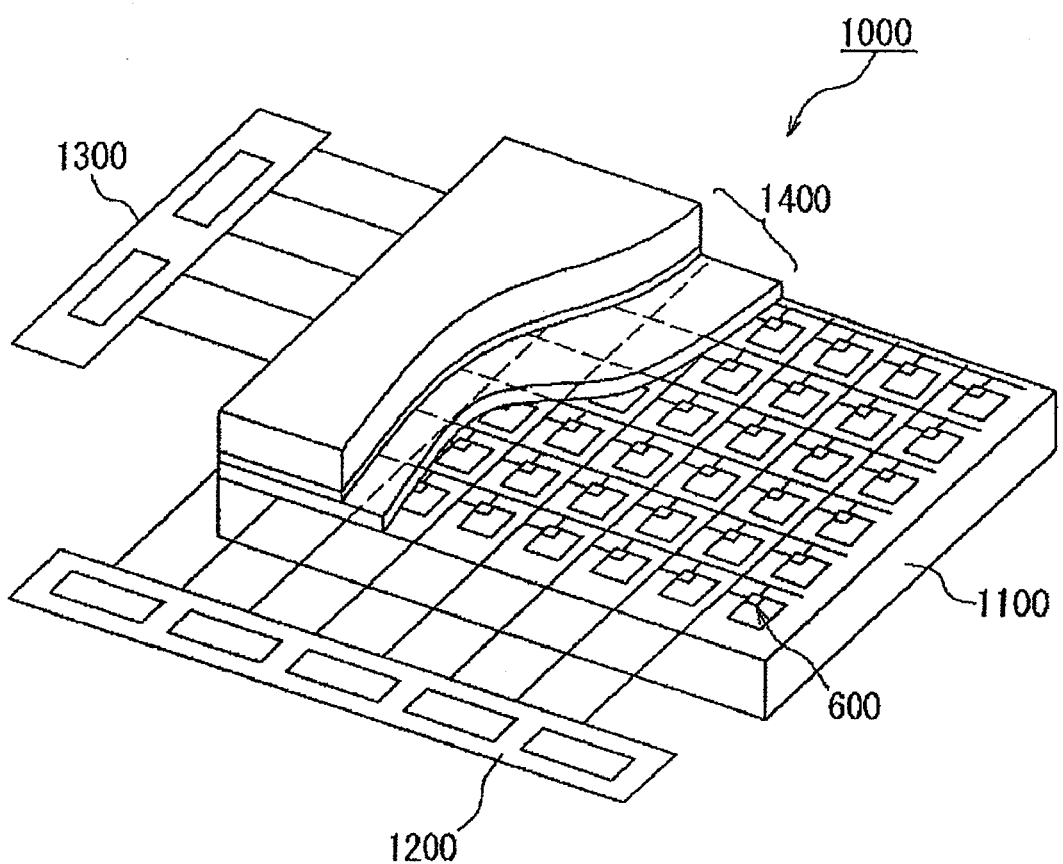
FIG. 28 shows a perspective view showing the overall appearance of an image display device.

Some examples of the image display device, with which various flexible semiconductor devices of the present invention are applied, are described. FIG. 28 is an appearance perspective view showing the appearance of the whole image display device 1000.

The image display device 1000 is, for example, an organic EL display. As shown in FIG. 28, the image display device 1000 comprises a TFT portion 1100, a driver portion (1200, 1300), and an EL portion 1400. The various flexible semiconductor devices of the present invention are contained in each pixel of the TFT portion 1100.

More specifically explained, the flexible semiconductor device 600 is arranged on the reinforcement film (for example, a resin films such as PET and PEN). The flexible semiconductor device 600 is formed under the organic EL devices of the EL section 1400, and each drain electrode of the driving TFT element of the flexible semiconductor device 600 is connected with each organic EL device. Transparent electrodes are formed on the organic EL device. In addition, the protective film (for example, resin films such as PET and PEN) is formed thereon.

Although several embodiments of the present invention are described, a skilled person in the art would easily understand that the present invention is not limited to those embodiments but may also includes the other embodiments including various changes.

Modified Embodiment 1

Figure 29A:
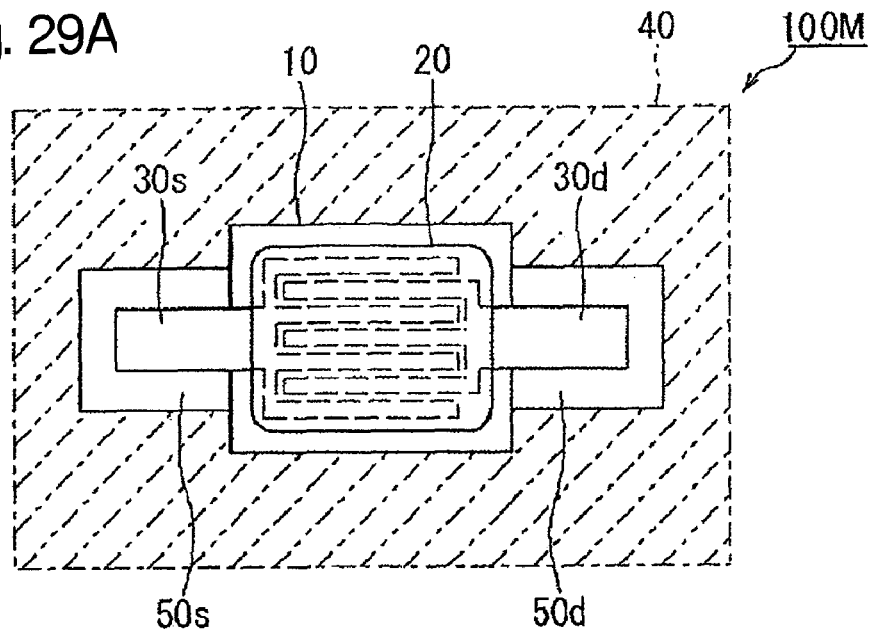
FIGS. 29(a) and 29(b) show a top plan view of the flexible semiconductor device 100M, 100M'.
Figure 29B:
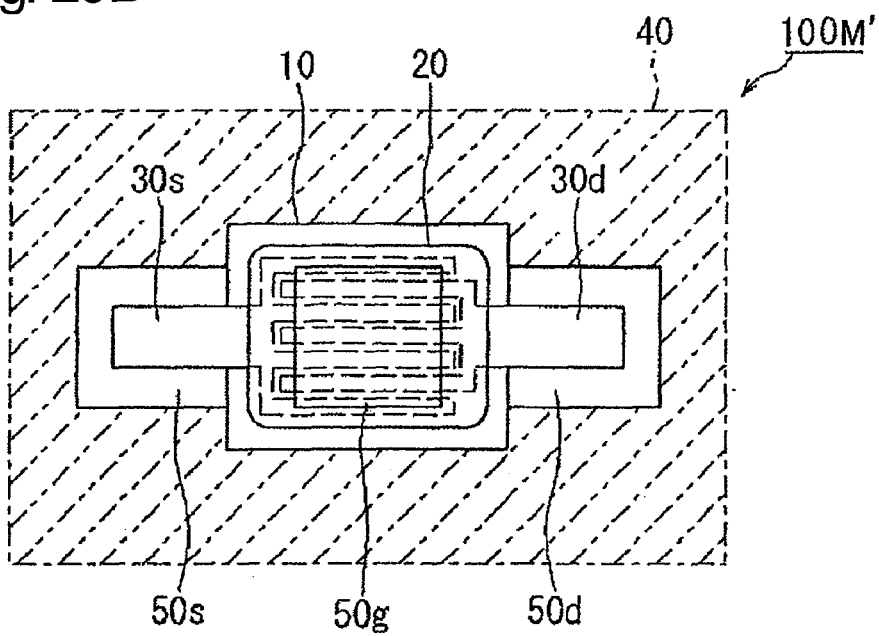

In the flexible semiconductor devices 100M and 100M' as shown in FIGS. 29(a) and 29(b), the shape of the part of each of the source extraction electrode 30s and the drain extraction electrode 30d may have comb tooth shaped portions at the opposing parts thereof. Thus, each shape of the opposing parts of the source extraction electrode 30s and the drain extraction electrode 30d is made to have comb tooth shape, so that the channel width can be increased with maintaining the predetermined dimension. As a result, a high-speed operation can be obtained due to the increased channel width. In the meanwhile, the length of the comb tooth shaped portion (the length of each opposing part of the source extraction electrode 30s and the drain extraction electrode 30d) may be suitably determined according to the required performance of the TFT. For example, in the case where the TFT array for the organic EL display is formed, the length of the comb tooth shaped portion of the driving TFT element may be made longer than the length of the comb tooth shaped portion of the switching TFT element.

Modified Embodiment 2

Figure 30A:
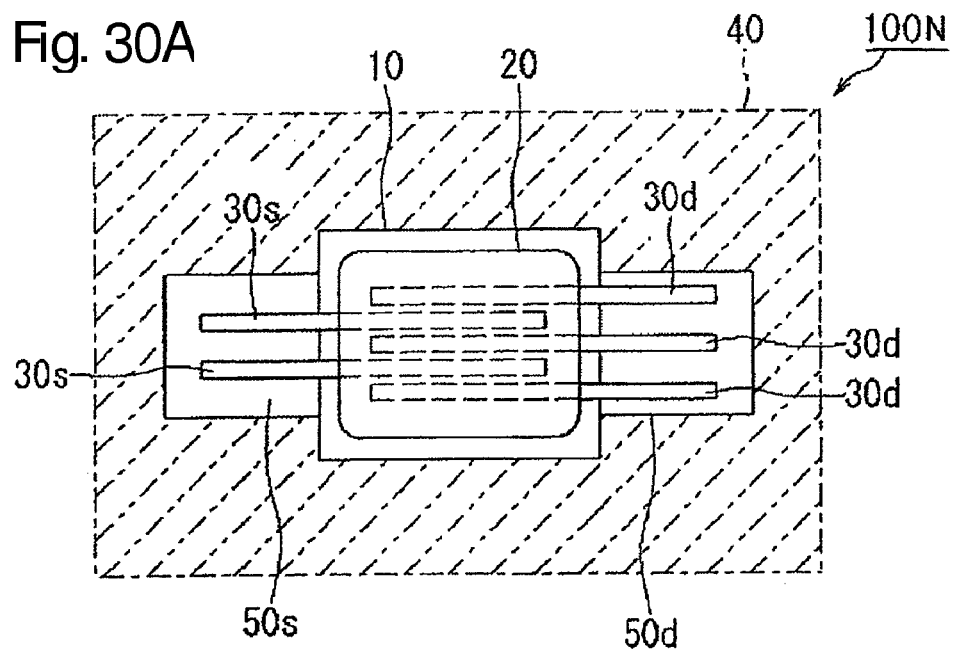
FIGS. 30(a) and 30(b) show a top plan view of the flexible semiconductor device 100N, 100N'.
Figure 30B:
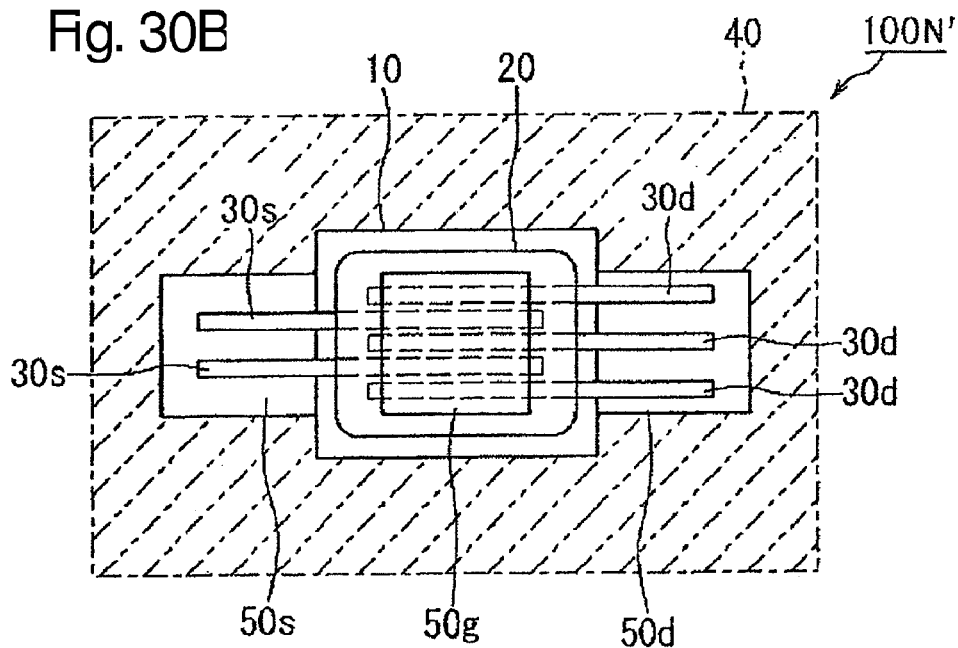

In the flexible semiconductor devices 100N and 100N' as shown in FIGS. 30(a) and 30(b), an embodiment in which the two source extraction electrodes 30s each of which extends straight from the source electrode 50s and the three extraction electrodes 30d each of which extends straight from the drain electrode 50d are arranged in parallel with each other may be applicable. In this embodiment having such shape, the extraction electrodes 30s and 30d may have the comb tooth shape and the channel width can be increased.

Modified Embodiment 3

Figure 31:
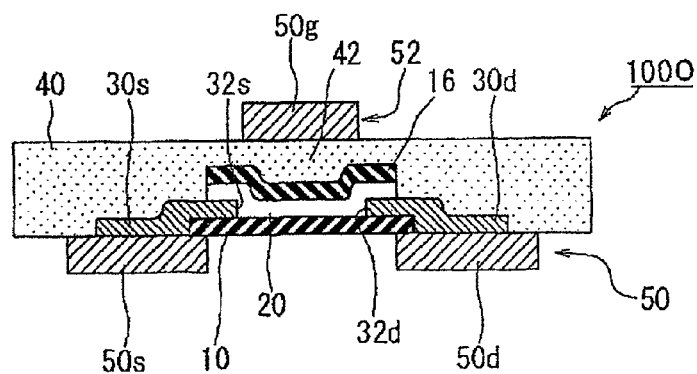
FIG. 31 shows a cross sectional view of the flexible semiconductor device 100O.

In the flexible semiconductor devices 1000 as shown in FIG. 31, a protection layer (further protection layer) 16 may be formed on the semiconductor layer 20. The insulating material which constitutes the protection layer 16 may be the same material as the insulating material of the insulating film 10 which protects the lower surface of the semiconductor layer 20 or may be a different material. Thus, the semiconductor layer 20 can be further isolated from the sealing resin layer 40 by adopting the embodiment in which both sides of the semiconductor layer 20 are covered by two protection layers (the insulating film 10 and the protection layer 16). The above embodiment makes it possible to use inexpensive sealing resins which contain high content of impurity ions, so that the manufacturing cost can be reduced. As a result, degradation of the semiconductor layer 20 resulted from the emanation of steam from the sealing resin layer 40, oxygen, remaining ions and so forth can be prevented.

The protection layer (further protection layer) 16 formed on the semiconductor layer 20 functions also as the gate insulating film. The desirable insulating material, which functions as both the protection layer and the gate insulating film, includes, for example, a tantalic oxide aluminum oxide ($Al_2O_3$), silicon oxide ($SiO_2$), zeolite oxide ($ZrO_2$), titanium oxide ($TiO_2$), yttrium oxide ($Y_2O_3$), lanthanum oxide ($La_2O_3$) and hafnium oxide ($HfO_2$) or nitride of those metals and so forth. It can be said that these inorganic materials are particularly preferable for the material of the gate insulating film in a flexible semiconductor device, since each of them has a dielectric constant higher than that of the insulating material of the resin system.

Modified Embodiment 4

Figure 32:
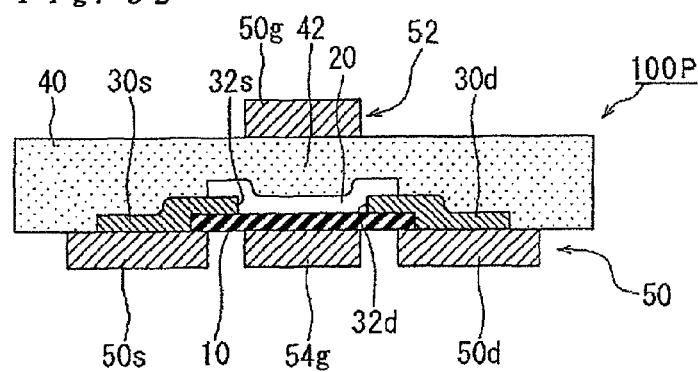
FIG. 32 shows a cross sectional view of the flexible semiconductor device 100P.

As illustrated by the flexible semiconductor device 100P in FIG. 32, the double gate construction may be adopted. That is, in addition to the gate electrode 50g on the semiconductor layer 20, a further gate electrode 54g may be formed via the insulating film 10 under the semiconductor layer 20. The further gate electrode 54g can be formed by etching the metal foil 50 in the way similar to the source electrode 50s and the drain electrode 50d.

If the double gate construction is adopted, more current can be flowed between the source electrode and the drain electrode compared with the case where the number of the gate electrode is one, In addition, when an amount of current flowing through the device having the double gate construction is the same as that in the embodiment where the semiconductor device has single gate electrode, the amount of current flowing through each gate can be relatively reduced. As a result, the gate voltage can be reduced. In addition, it becomes possible to change the threshold voltage of the semiconductor device by independently using the two gate electrodes 50g and 54g, so that it can reduce the variation among the semiconductor device. It is further mentioned that there is a further advantage that various output size and frequency output can be obtained by using one gate electrode for the modulation.

Modified Embodiment 5

Figure 33:
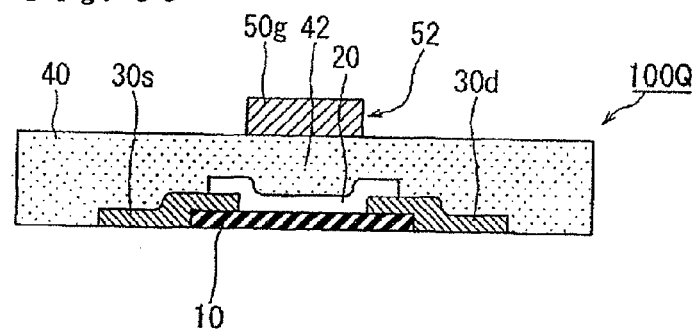
FIG. 33 shows a cross sectional view of the flexible semiconductor device 100Q.

As illustrated by the flexible semiconductor device 100Q in FIG. 33, a construction having none of the source electrode 50s and the drain electrode 50d is also considered. That is, the patterns of source extraction electrode 30s and the patterns of drain extraction electrode 30d may be exposed from the surface (lower surface in FIG. 33) of the sealing resin layer 40 by removing the metal foil 50 (the source electrode 50s and the drain electrode 50d) during the producing process. According to the flexible semiconductor device adopting the above construction, the thickness of the whole device can be reduced by the thickness of the source electrode 50s and the drain electrode 50d. In the meanwhile, removal of the metal foil 50 (the source electrode 50s and the drain electrode 50d) may be performed by etching process.

Figure 34:
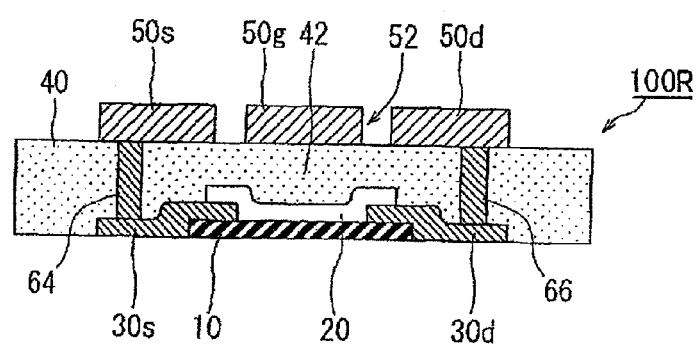
FIG. 34 shows a cross sectional view of the flexible semiconductor device 100R.

The flexible semiconductor device 100Q may be further modified as illustrated by FIG. 34. In the flexible semiconductor device 100R illustrated in FIG. 34, the source electrode 50s and the drain electrode 50d are formed on the surface opposite to the surface where the patterns of extraction electrodes 30s and 30d expose (the lower surface of the sealing resin layer 40 in FIG. 34). That is, the source electrode 50s and the drain electrode 50d are formed on the same surface as the gate electrode 50g. In this case, the source electrode 50s is electrically connected with the patterns of extraction electrodes 30s with the interlayer connection member 64, which electrically connects a member on the upper surface of the sealing resin layer 40 with another member on the lower surface of the sealing resin layer 40 each other. In addition, the drain electrode 50d is electrically connected with the patterns of extraction electrodes 30d with the interlayer connection member 66.

Modified Embodiment 6

Figure 35:
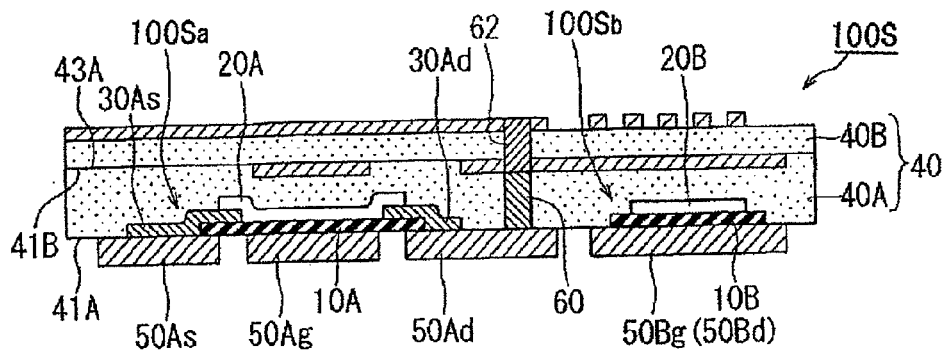
FIG. 35 shows a cross sectional view of the flexible semiconductor device 100S.

In the case of the flexible semiconductor device 100S as illustrated in FIG. 35, a wiring layer may be formed not only on the lower surface 41B of the flexible substrate 40B but also on the upper surface 43B thereof. In this case, the wiring layer on the lower surface 41B may electrically connect with the wiring layer on the upper surface 43B with the interlayer connection member 62, which electrically connects a member on the upper surface of the flexible substrate 40B with another member on the lower surface of the flexible substrate 40B each other.

When such a construction is adopted, re-wiring or extraction of electrodes can be performed by using the wiring layer on the upper surface 43B of the flexible substrate 40B, so that it provides high convenience.

In general, the present invention as described above comprises the following embodiments:

Embodiment 1: A flexible semiconductor device having flexibility comprising
an insulating film,
a source electrode and a drain electrode each of which is formed by etching a metal foil located on a lower surface of the insulating film,
a semiconductor layer partially formed on the upper surface of the insulating film,
patterns of extraction electrodes each of which electrically connects each of the source electrode and the drain electrode with the semiconductor layer,
a sealing resin layer which seals the patterns of extraction electrodes and the semiconductor layer, and
a gate electrode formed on a surface opposite to the surface of the sealing resin layer, in which surface the source electrode and the drain electrode are formed Embodiment 2: The flexible semiconductor device according to the embodiment 1, wherein a part sandwiched between the semiconductor layer and the gate electrode in the sealing resin layer functions as the gate insulating film.

Embodiment 3: The flexible semiconductor device according to the embodiment 1 or 2, wherein a protection layer comprising an insulating material which covers the semiconductor layer is formed over the semiconductor layer.

Embodiment 4: The flexible semiconductor device according to any one of the embodiments 1 to 3, which further comprised a capacitor and an electrode layer of the capacitor is formed by etching the metal foil.

Embodiment 5: The flexible semiconductor device according to any one of the embodiments 1 to 4 having at least two TFT elements, each of which comprises the semiconductor layer, the insulating film, the gate electrode, the source electrode and the drain electrode.

Embodiment 6: The flexible semiconductor device according to the embodiment 5, wherein, among the at least two TFT elements, the drain electrode and the source electrode constituting the first TFT element and the drain electrode and the source electrode constituting the second TFT element are formed on one surface of the sealing resin layer, and the gate electrode constituting the first TFT element and the gate electrode constituting the second TFT element are formed on another surface of the sealing resin layer.

Embodiment 7: The flexible semiconductor device according to the embodiment 6, wherein the first TFT element and the second TFT element are electrically connected with each other by an interlayer connection member which electrically connects the upper surface and the lower surface of the sealing resin layer.

Embodiment 8: The flexible semiconductor device according to the embodiment 5, wherein among the at least two TFT elements, the gate electrode constituting the first TFT element and the drain electrode and the source electrode constituting the second TFT element are formed on one surface of the sealing resin layer, and the source electrode and the drain electrode constituting the first TFT element and the gate electrode constituting the second TFT element are formed on another surface of the sealing resin layer.

Embodiment 9: The flexible semiconductor device according to the embodiment 8, wherein the first TFT element and the second TFT element are electrically connected via wiring formed by etching the metal foil.

Embodiment 10: A method for manufacturing a flexible semiconductor device having flexibility comprising the steps of:
supplying a metal foil;
forming an insulating film on a surface of the metal foil,
forming one or more patterns of extraction electrodes on a surface of the metal foil,
forming a semiconductor layer on the insulating film so that the semiconductor layer contacts with the patterns of extraction electrodes,
forming a sealing resin layer on the metal foil so that the metal foil covers the semiconductor layer and the patterns of extraction electrodes,
forming a source electrode and a drain electrode by etching the metal foil, and
forming a gate electrode on the surface opposite to the surface in which the source electrode and the drain electrode are formed.

Embodiment 11: A method for manufacturing a flexible semiconductor device having flexibility comprising the steps of:
supplying a metal foil;
forming an insulating film on a surface of the metal foil,
forming a semiconductor layer on the insulating film,
forming one or more patterns of extraction electrodes on a surface of the metal foil so that the patterns of extraction electrodes contact with the semiconductor layer,
forming a sealing resin layer on the metal foil so that the metal foil covers the semiconductor layer and the patterns of extraction electrodes,
forming a source electrode and a drain electrode by etching the metal foil, and forming a gate electrode on the surface opposite to the surface in which the source electrode and the drain electrode are formed.

Embodiment 12: A method for manufacturing a flexible semiconductor device having flexibility comprising the steps of:

supplying a metal foil having one surface which is covered with an insulating film, forming a semiconductor layer on the insulating film, forming an opening, through which the metal foil located below is exposed, by etching a part of the insulating film, forming one or more patterns of extraction electrodes on the metal foil, which is exposed through the opening, so that the patterns of extraction electrodes contact with the semiconductor layer, forming a sealing resin layer on the metal foil so that the sealing resin layer covers the patterns of extraction electrodes and the semiconductor layer, forming a source electrode and a drain electrode by etching the metal foil, forming a gate electrode on the surface opposite to the surface in which the source electrode and the drain electrode are formed.

Embodiment 13: The method for manufacturing a flexible semiconductor device having flexibility according to any one of the embodiments 10 to 12, wherein formation of the gate electrode is performed by forming a further metal foil on the surface opposite to the surface in which the source electrode and the drain electrode are formed, and forming a gate electrode by etching the further metal foil.

Embodiment 14: The method for manufacturing a flexible semiconductor device having flexibility according to any one of the embodiments 10 to 12, wherein supplying a flexible substrate having a wiring layer formation side in which the wiring layer containing the gate electrode is formed, and embedding the wiring layer formation side of the flexible substrate into the surface of the sealing resin layer, which surface is opposite to the surface where the source electrode and the drain electrode are formed, by laminating the flexible substrate onto the sealing resin layer.

Embodiment 15: The method for manufacturing a flexible semiconductor device having flexibility according to any one of the embodiments 10 to 14, wherein the patterns of extraction electrodes is exposed from the surface of the sealing resin layer by removing the metal foil.

Embodiment 16: The method for manufacturing a flexible semiconductor device having flexibility according to any one of the embodiments 10 to 15, wherein the step of forming the semiconductor layer comprises forming a protection layer comprising an insulating material so that the protection layer covers the semiconductor layer.

Embodiment 17: The method for manufacturing a flexible semiconductor device having flexibility according to any one of the embodiments 10 to 16, wherein the step of forming the semiconductor layer comprises the steps of depositing a semiconductor material onto the insulating layer, and heat-treating the deposited semiconductor material.

Embodiment 18: The method for manufacturing a flexible semiconductor device having flexibility according to the embodiment 17, wherein the step of heat-treating comprises at least one of a thermal annealing treatment and a laser annealing treatment and a crystallization of the deposited semiconductor material is performed by the heat-treatment.

Embodiment 19: The method for manufacturing a flexible semiconductor device having flexibility according to any one of the embodiments 10 to 18, wherein the formation step of the semiconductor material is performed through a high temperature process wherein the process temperature is not less than 400° C.

Embodiment 20: The method for manufacturing a flexible semiconductor device having flexibility according to any one of the embodiments 10 to 19, wherein the step of etching the metal foil comprises forming the source electrode and the drain electrode and forming the electrode layer of a capacitor by etching the metal foil.

Embodiment 21: The method for manufacturing a flexible semiconductor device having flexibility according to the embodiment 13, wherein the step of etching the further metal foil comprises forming the gate electrode and the electrode layer of a capacitor by etching the further metal foil.

Embodiment 22: A method for manufacturing a flexible semiconductor device having a first TFT element and a second TFT element comprising the steps of:

providing a first metal foil having a semiconductor layer formation side on which a semiconductor layer constituting the first TFT element is formed, a second metal foil having a semiconductor layer formation side on which a semiconductor layer constituting the second TFT element is formed and a sealing resin film, laminating the semiconductor layer formation side of the first metal foil onto the one surface of the sealing resin film, thereby embedding the semiconductor layer constituting the first TFT element into one surface of the sealing resin film, laminating the semiconductor layer formation side of the second metal foil onto the another surface of the sealing resin film, thereby embedding the semiconductor layer constituting the second TFT element into another surface of the sealing resin layer, forming the source electrode and the drain electrode constituting the first TFT element and the gate electrode constituting the second TFT element by etching the first metal foil, forming the gate electrode constituting the first TFT element and the source electrode and the drain electrode constituting the second TFT element by etching the second metal foil.

Embodiment 23: The manufacturing method of a flexible semiconductor device according to the embodiment 22, wherein an interlayer connection member is formed in the sealing resin film, which member electrically connects the upper surface and the lower surface of the sealing resin layer.

Embodiment 24: The manufacturing method of a flexible semiconductor device according to the embodiment 22 or 23, wherein both of etching of the first metal foil and etching of the second metal foil are performed in the same process.

Embodiment 25: The manufacturing method of a flexible semiconductor device according to any one of the embodiments 22 to 24, wherein both of the lamination of the first metal foil and the lamination of the second metal foil are performed in the same process.

Embodiment 26: A flexible semiconductor device having flexibility comprising;

a gate insulating film, a source electrode and a drain electrode which are formed by etching a metal foil located on the lower surface of the gate insulating film, a semiconductor layer formed on the upper surface of the gate insulating film, one or more patterns of extraction electrodes which electrically connect each of the source electrode and the drain electrode with the semiconductor layer, a sealing resin layer which seals the one or more patterns of extraction electrodes and the semiconductor layer, and a gate electrode formed from a metal foil that was laminated on the lower surface of the gate insulating film by etching the metal foil, thereby located on the lower surface of the gate insulating film.

Embodiment 27: The flexible semiconductor device according to the embodiment 26, wherein the lower surface of the gate electrode and each of the lower surfaces of the source electrode and the drain electrode are located on a plane flush with each other.

Embodiment 28: The flexible semiconductor device according to the embodiment 26 or 27 further comprising a capacitor, wherein the lower surface of a dielectric layer of the capacitor and the lower surface of the gate insulating film are located on a plane flush with each other.

Embodiment 29: The flexible semiconductor device according to the embodiment 28, wherein the lower electrode layer of the capacitor is formed by etching the metal foil.

Embodiment 30: The flexible semiconductor device according to any one of the embodiments 26 to 29, wherein the flexible semiconductor device comprises at least two TFT elements, each of which comprises the semiconductor layer, the gate insulating film, the gate electrode, the source electrode and the drain electrode.

Embodiment 31: The flexible semiconductor device according to the embodiment 30, wherein the gate electrode, the source electrode and the drain electrode constituting the first TFT element and the gate electrode, the source electrode and the drain electrode constituting the second TFT element are formed on the same plane of the sealing resin layer.

Embodiment 32: The flexible semiconductor device according to the embodiment 31, wherein the first TFT element and the second TFT element are electrically connected with each other by a wiring, which is formed by etching the metal foil.

Embodiment 33: The flexible semiconductor device according to the embodiment 30, wherein the gate electrode, the source electrode and the drain electrode constituting the first TFT element are formed on one surface plane of the sealing resin layer and the gate electrode, the source electrode and the drain electrode constituting the second TFT element are formed on the other surface plane of the sealing resin layer.

Embodiment 34: The flexible semiconductor device according to the embodiment 33, wherein the first TFT element and the second TFT element are electrically connected with each other by an interlayer connection member which electrically connects the upper surface and the lower surface of the sealing resin layer.

Embodiment 35: The flexible semiconductor device according to the embodiment 33 or 34, wherein the sealing resin layer comprises a core member in a film condition and resin layers laminated on both surfaces of the core member.

Embodiment 36: The flexible semiconductor device according to the embodiment 30, wherein the gate electrode, the source electrode and the drain electrode which constitute the first TFT element are formed on one surface of the sealing resin layer and the gate electrode, the source electrode and the drain electrode which constitute the second TFT element are formed inside of the sealing resin layer.

Embodiment 37: The flexible semiconductor device according to the embodiment 36, wherein the sealing resin layer has a laminated construction formed by laminating a first sealing resin layer and a second sealing resin layer, the gate electrode, the source electrode and the drain electrode which constitutes the first TFT element are formed on the outside surface of the first sealing resin layer in the laminating direction and the gate electrode, the source electrode and the drain electrode which constitutes the second TFT element are formed on the inside surface of the second sealing resin layer in the laminating direction (that is, on the plane flush with the interface between the first sealing resin layer and the second sealing resin layer).

Embodiment 38: The flexible semiconductor device having flexibility according to the embodiment 37, wherein the first TFT element and the second TFT element are electrically connected with each other by an interlayer connection member which electrically connects the upper surface and the lower surface of the first sealing resin layer.

Embodiment 39: The method of manufacturing a flexible semiconductor device having flexibility comprising the steps of:
(a) supplying a metal foil,
(b) forming a gate insulating film on the metal foil,
(c) forming a semiconductor layer on the gate insulating film,
(d) forming a sealing resin layer on the metal foil so that the sealing resin layer covers the semiconductor layer, and
(e) forming a gate electrode, a source electrode and a drain electrode by etching the metal foil.

Embodiment 40: The method of manufacturing a flexible semiconductor device according to the embodiment 39, wherein the step (c) further comprises depositing a semiconductor material onto the gate insulating layer, and heat-treating the deposited semiconductor material.

Embodiment 41: The method of manufacturing a flexible semiconductor device according to the embodiment 40, wherein the step of heat-treating comprises at least one of a thermal annealing treatment and a laser annealing treatment and a crystallization of the deposited semiconductor material is performed by the heat-treatment.

Embodiment 42: The method of manufacturing a flexible semiconductor device according to any one of the embodiments 39 to 41, wherein the steps (b) to (c) are performed by a high temperature process including steps having a process temperature not less than 400° C.

Embodiment 43: The method of manufacturing a flexible semiconductor device according to any one of the embodiments 39 to 42 comprising, after the step (c), a step of forming at least two patterns of extraction electrodes on the metal foil so that the patterns of extraction electrodes contact with the semiconductor layer.

Embodiment 44: The method of manufacturing a flexible semiconductor device according to any one of the embodiments 39 to 42 comprising, after the step (b), a step of forming at least two patterns of extraction electrodes on the metal foil, and
the step (c) comprising forming the semiconductor layer so that the semiconductor layer contacts with the formed patterns of extraction electrodes.

Embodiment 45: The method of manufacturing a flexible semiconductor device according to the embodiment 43 or 44, wherein the step (e) comprises forming the source electrode and the drain electrode so that each electrode connects with each of the at least two formed patterns of extraction electrodes, respectively.

Embodiment 46: The method of manufacturing a flexible semiconductor device according to any one of the embodiments 39 to 45, wherein the step (b) comprises forming the dielectric layer of a capacitor together with the gate insulating film on the metal foil.

Embodiment 47: The method of manufacturing a flexible semiconductor device according to any one of the embodiments 39 to 45, wherein the step (e) comprises forming the lower electrode layer of the capacitor together with formation of the gate electrode, the source electrode and the drain electrode by etching the metal foil.

Embodiment 48: The method of manufacturing a flexible semiconductor device having flexibility comprising the steps of:

supplying a metal foil one surface of which is covered with an insulating film;

forming a semiconductor layer on the insulating film;

forming an opening, through which the metal foil located below is exposed, by removing a part of the insulating film;

forming one or more patterns of extraction electrodes on the metal foil which is exposed through the openings so that the patterns of extraction electrodes contact with the semiconductor layer;

forming the gate electrode, the source electrode and the drain electrode by etching the metal foil.

Embodiment 49: A manufacturing method of a flexible semiconductor device according to the embodiment 48, wherein formation of the semiconductor layer includes a step of depositing a semiconductor material on the upper surface of the insulating film, and a step of subjecting the deposited semiconductor material to a heat-treatment.

Embodiment 50: A manufacturing method of the flexible semiconductor device according to the embodiment 49, wherein the heat-treatment comprises at least one of thermal annealing treatment and the laser annealing treatment and a crystallization of the deposited semiconductor material is performed by the heat-treatment.

Embodiment 51: A manufacturing method of a flexible semiconductor device according to any one of the embodiments 48 to 50, wherein the formation process of the semiconductor layer is performed in the high temperature process wherein the process temperature is not less than 400° C.

Embodiment 52: The method of manufacturing a flexible semiconductor device having a first TFT element and a second TFT element comprising the steps of:

supplying a first metal foil having a semiconductor layer formation side in which the semiconductor layer which constitutes the first TFT element is formed, a second metal foil having a semiconductor layer formation side in which the semiconductor layer which constitutes the second TFT element is formed, and a sealing resin film;

laminating the semiconductor formation side of the first metal foil onto one side of the sealing resin film, thereby embedding the semiconductor layer constituting the first TFT element into the sealing resin film from one side thereof;

laminating the semiconductor formation side of the second metal foil onto the other side of the sealing resin film, thereby embedding the semiconductor layer constituting the second TFT element into the sealing resin film from the other side thereof;

etching the first metal foil thereby the gate electrode, the source electrode and the drain electrode which constitute the first TFT element is formed;

etching the second metal foil thereby the gate electrode, the source electrode and the drain electrode which constitute the second TFT element is formed.

Embodiment 53: The method of manufacturing a flexible semiconductor device according to embodiment 52, wherein the sealing resin film comprises a core member in a film condition and resin layers laminated on both surfaces of the core member.

Embodiment 54: The method of manufacturing a flexible semiconductor device according to embodiment 52 or 53, wherein an interlayer connection member, which electrically connects the upper surface and the lower surface of the sealing resin layer, is formed in the sealing resin film.

Embodiment 55: The method of manufacturing a flexible semiconductor device according to any one of embodiment 52 to 54, wherein both of etching of the first metal foil and etching of the second metal foil are performed in the same process.

Embodiment 56: The method of manufacturing a flexible semiconductor device according to any one of embodiment 52 to 55, wherein both of the lamination of the first metal foil and the lamination of the second metal foil are performed in the same process.

Embodiment 57: The method of manufacturing a flexible semiconductor device according to any one of embodiment 52 to 56, wherein each of the first metal foil and the second metal foil, which has the semiconductor layer formation side, is produced through the steps of (a) to (c) according to embodiment 39.

Embodiment 58: The method of manufacturing a flexible semiconductor device having a first TFT element and a second TFT element comprising the steps of:

supplying a first sealing resin film, a second sealing resin film having an electrode formation side in which the gate electrode, the source electrode, and the drain electrode which constitute the second TFT element, and a metal foil having a semiconductor layer formation side in which the semiconductor layer which constitutes the first TFT element is formed;

laminating the semiconductor formation side of the metal foil onto one side of the first sealing resin film, thereby embedding the semiconductor layer constituting the first TFT element into the first sealing resin film from one side thereof;

laminating the electrode formation side of the second sealing resin film onto the other side of the first sealing resin film, thereby embedding the gate electrode, the source electrode, and the drain electrode which constitute the second sealing resin film into the first sealing resin film from the other side thereof;

etching the metal foil, thereby forming the gate electrode, the source electrode, and the drain electrode which constitute the first TFT element.

Embodiment 59: The method of manufacturing a flexible semiconductor device according to embodiment 58, wherein an interlayer connection member which electrically connects the upper surface and the lower surface of the sealing resin layer is formed in the first sealing resin film.

Embodiment 60: The method of manufacturing a flexible semiconductor device according to embodiment 59, wherein during the lamination step of the second seal resin film, any electrode selected from the group consisting of the gate electrode, the source electrode and the drain electrode formed on the electrode formation side is laminated onto the interlayer connection member so that the selected electrode is connected with the interlayer connection member.

Embodiment 61: The method of manufacturing a flexible semiconductor device according to any one of the embodiments 58 to 60, wherein both of the lamination of the metal foil and the lamination of the second sealing resin film are performed in the same process.

Embodiment 62: The method of manufacturing a flexible semiconductor device according to any one of the embodiments 58 to 60, wherein the metal foil having the semiconductor layer formation side is produced through the process of steps (a) to (c) in the embodiment 39.

Embodiment 63: The method of manufacturing a flexible semiconductor device according to any one of the embodiments 58 to 60, wherein the second sealing resin film having the electrode formation side is produced through the process of steps (a) to (e) in the embodiment 39.

INDUSTRIAL APPLICABILITY

Figure 36:
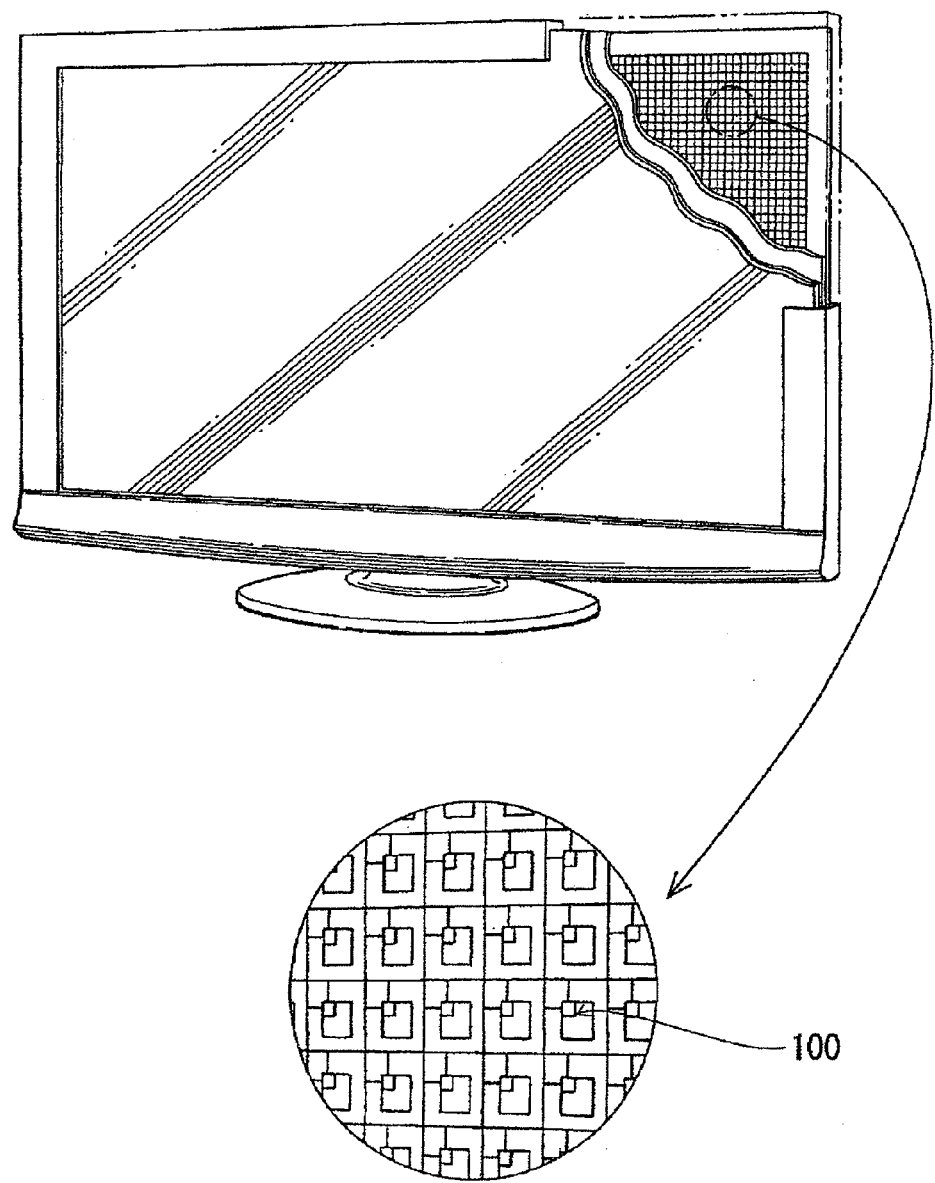
FIG. 36 shows an example of a product (an image display part of a television) wherein the flexible semiconductor device of the present invention is used.
Figure 37:
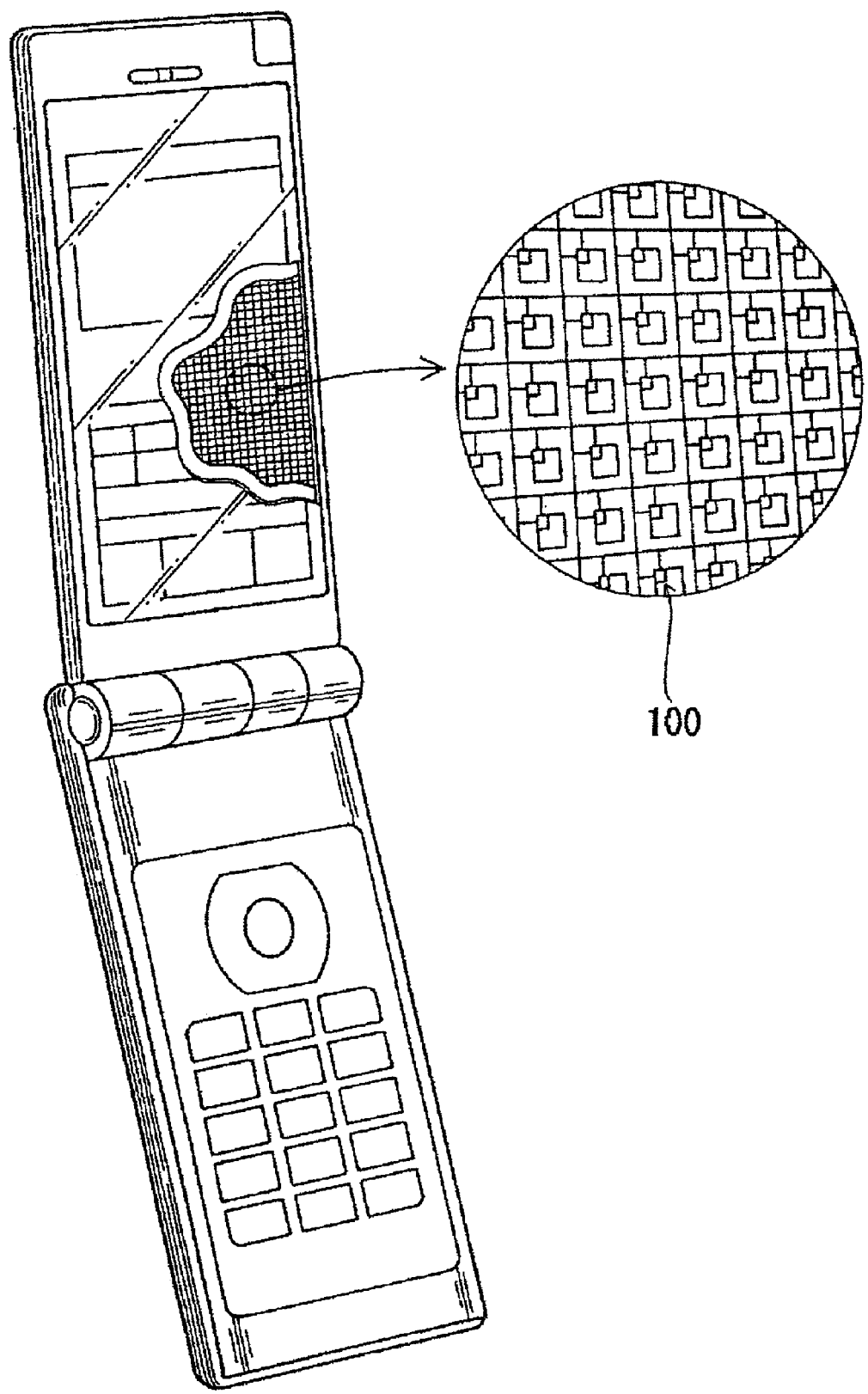
FIG. 37 shows an example of a product (an image display section of a cellular phone) wherein the flexible semiconductor device of the present invention is used.
Figure 38:
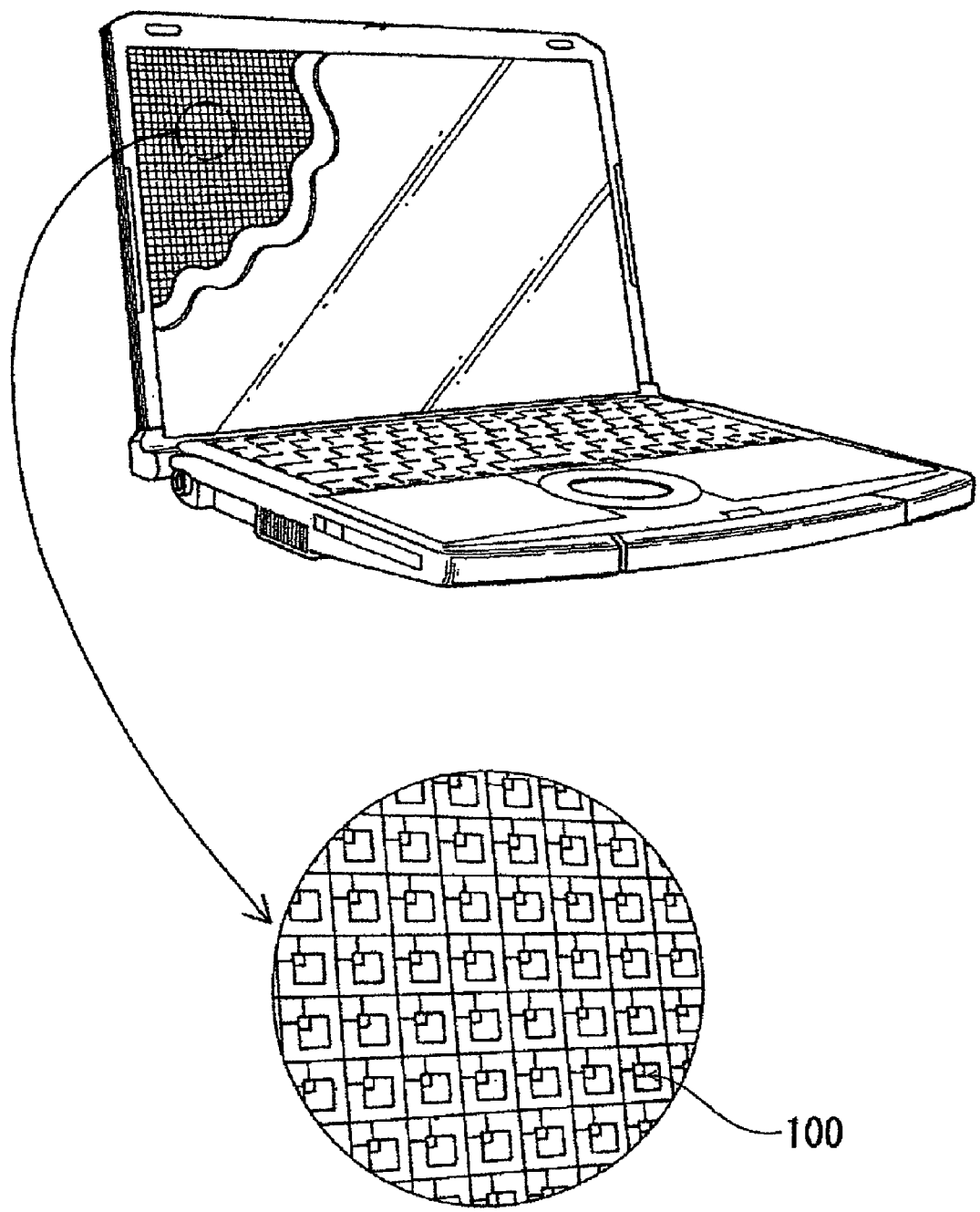
FIG. 38 shows an example of a product (an image display section of a mobile personal computer or a laptop computer) wherein the flexible semiconductor device of the present invention is used.
Figure 39:
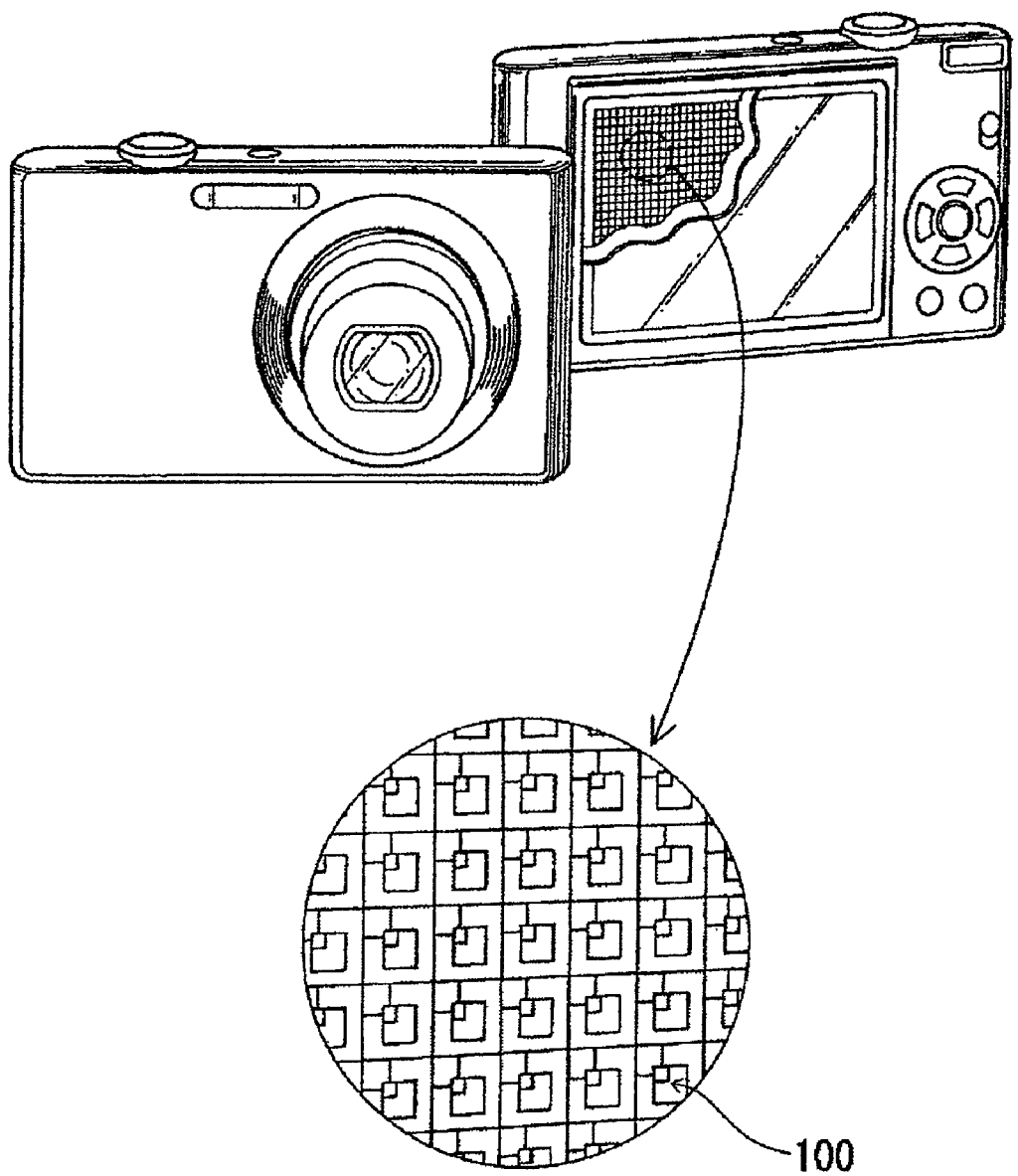
FIG. 39 shows an example of a product (an image display section of a digital still camera) wherein the flexible semiconductor device of the present invention is used.
Figure 40:
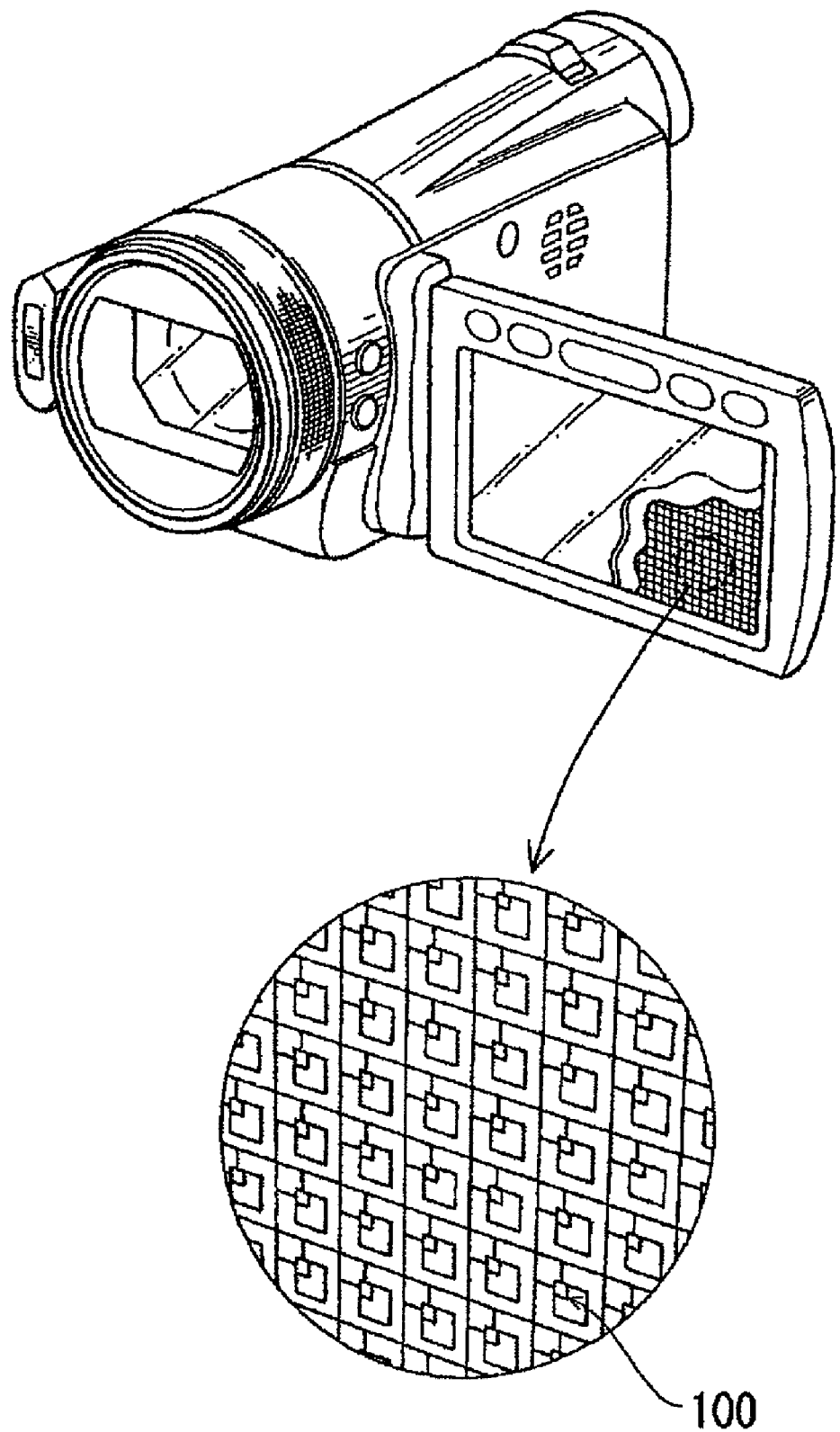
FIG. 40 shows an example of a product (an image display section of a camcorder) wherein the flexible semiconductor device of the present invention is used.
Figure 41:
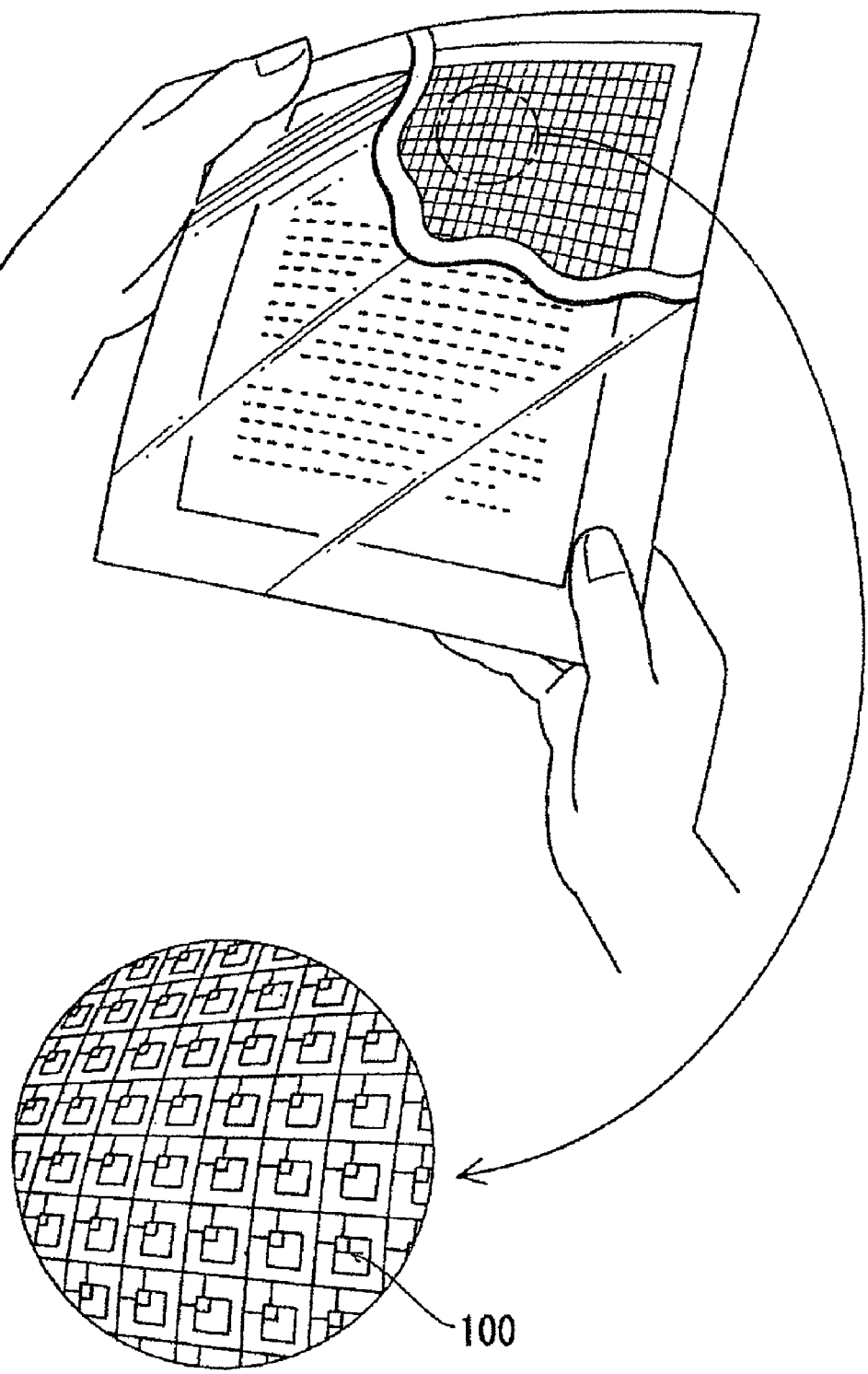
FIG. 41 shows an example of a product (an image display section of an electronic paper) wherein the flexible semiconductor device of the present invention is used.

The method for manufacturing the flexible semiconductor device of the present invention is excellent in the productivity of a flexible semiconductor device. The obtained flexible semiconductor device can also be used for various image displays, and can also be used for an electronic paper and a digital paper and so forth. For example, the flexible semiconductor device can be used for the image display section of a television as shown in FIG. 36, the image display section of a cellular phone as shown in FIG. 37, the image display section of a mobile personal computer or a notebook computer as shown in FIG. 38, the image display section of a digital still camera and a camcorder as shown in FIGS. 39 and 40, and the image display section of an electronic paper as shown in FIG. 41 and so forth. The flexible semiconductor device obtained from the manufacturing method of the present invention can also be adapted for various applications, for example, an RF-ID, a memory, an MPU, a solar battery, a sensor and so forth, in which application of printed electronics technology is currently considered.

A CROSS-REFERENCE OF RELATED APPLICATION

The present application claims the priority under Paris Convention based on the Japan patent application No. 2008-200766 (filing date: Aug. 4, 2008, title of the invention: flexible semiconductor device and the method of manufacturing the same) and the Japan patent application No. 2008-200767 (filing date: Aug. 4, 2008, title of the invention: flexible semiconductor device and the method of manufacturing the same), the whole contents of which are incorporated herein by reference.

EXPLANATION OF REFERENCE NUMERALS 10, 12 insulating film (gate insulating film)
15 opening
16 protection layer, insulating film
17 opening
20 semiconductor layer
30d pattern of drain extraction electrode
30s pattern of source extraction electrode
32s extended part
32d extended part
40 sealing resin layer, sealing resin
41a outside surface (the first sealing resin)
41b inside surface (the second sealing resin)
42 gate insulating film (a part of the sealing resin), core member
43a inside surface (the first sealing resin)
50 metal foil
50a the first metal foil
50b the second metal foil
50d drain electrode
50g gate electrode
50s source electrode
52 further metal foil
54 upper surface (metal foil)
54a semiconductor layer formation side
54b semiconductor layer formation side
54g gate electrode
60, 62 interlayer connection member
65 through hole
70 laminating direction
80 capacitor
82 dielectric layer
84 top electrode layer
85 adjusting electrode
86 lower electrode layer
88 wiring
90 equivalent circuit
92 wiring
94 wiring
100 flexible semiconductor device
100A flexible semiconductor device
100B flexible semiconductor device
100C flexible semiconductor device
100D flexible semiconductor device
100E flexible semiconductor device
100F flexible semiconductor device
100G flexible semiconductor device
100H flexible semiconductor device
100I flexible semiconductor device
100J flexible semiconductor device
100K flexible semiconductor device
100L flexible semiconductor device
100M,M' flexible semiconductor device
100N,N' flexible semiconductor device
100P flexible semiconductor device
100Q flexible semiconductor device
100R flexible semiconductor device
100S flexible semiconductor device
600 flexible semiconductor device

The invention claimed is:

1. A method for manufacturing a flexible semiconductor device comprising the steps of:
   (i) forming an insulating film on the upper surface of a metal foil,
   (ii) forming one or more patterns of source/drain extraction electrodes on the upper surface of the metal foil,
   (iii) forming a semiconductor layer on the insulating film so that the semiconductor layer contacts with the patterns of extraction electrodes,
   (iv) forming a sealing resin layer on the upper surface of the metal foil so that the sealing resin layer covers the semiconductor layer and the patterns extraction electrodes, and
   (v) forming an electrode by etching the metal foil
   wherein the above metal foil is used as a substrate for the insulation film, the extraction electrode pattern, the semiconductor layer and the sealing resin layer each of which is formed in any of the steps (i) to (iv), and the above metal foil is used also as the constituent material of the above electrode in the step (v).

2. The method for manufacturing the flexible semiconductor device according to claim 1, wherein the semiconductor layer formed in the above step (iii) is subjected to a heat-treatment.

3. The method for manufacturing the flexible semiconductor device according to claim 2, wherein the heat-treatment is performed by a thermal annealing treatment and/or a laser annealing treatment.

4. The method for manufacturing the flexible semiconductor device according to claim 1, wherein the step (iii) of forming the semiconductor layer is carried out through a high temperature process having a temperature range from 400° C. to 1000° C.

5. The method for manufacturing the flexible semiconductor device according to claim 1, wherein each of a source electrode and a drain electrode is formed by etching the above metal foil in the step (v).

6. The method for manufacturing the flexible semiconductor device according to claim 5, wherein a gate electrode is formed by etching the above metal foil in the step (v), thereby each of the source electrode, the drain electrode and the gate electrode is formed to be located on a surface plane flush with each other.

7. The method for manufacturing the flexible semiconductor device according to claim 5 further comprising a step of
(vi) forming a gate electrode so that the gate electrode is located on a surface plane which is not flush with the surface plane of the source electrode and the drain electrode, wherein the gate electrode is formed by supplying a further metal foil on the upper surface of the sealing resin layer and etching the further metal foil.

8. The method for manufacturing the flexible semiconductor device according to claim 1, wherein an electrode layer of a capacitor is further formed by etching the metal foil.

9. A method for manufacturing a flexible semiconductor device comprising the steps of:
(i) forming an insulating film on the upper surface of a metal foil,
(ii)' forming a semiconductor layer on the insulating film,
(iii)' forming one or more patterns of source/drain extraction electrodes on the upper surface of the metal foil so that the patterns of extraction electrodes contact with the semiconductor layer,
(iv) forming a sealing resin layer on the upper surface of the metal foil so that the sealing resin layer covers the semiconductor layer and the patterns extraction electrodes, and
(v) forming an electrode by etching the metal foil
wherein the above metal foil is used as a substrate for the insulation film, the extraction electrode pattern, the semiconductor layer and the sealing resin layer each of which is formed in any of the steps (i) to (iv), and the above metal foil is used also as the constituent material of the above electrode in the step (v).

10. A method for manufacturing a flexible semiconductor device comprising at least two TFT elements each of which comprises an insulating film, a semiconductor layer, a gate electrode, a source electrode, a drain electrode and one or more patterns of source/drain extraction electrodes, the method comprising the steps of:
(a) supplying a first metal foil having a TFT element formation side on which a semiconductor layer, an insulating film and one or more patterns of source/drain extraction electrodes constituting a first TFT element are formed wherein the semiconductor layer is provided on the insulating film so that the semiconductor layer is in contact with the extraction electrodes, a second metal foil having a TFT element formation side on which a semiconductor layer, an insulating film and one or more patterns of source/drain extraction electrodes constituting a second TFT element are formed wherein the semiconductor layer is provided on the insulating film so that the semiconductor layer is in contact with the extraction electrodes, and a sealing resin film;
(b) laminating the TFT element formation side of the first metal foil onto one side of the sealing resin film, thereby embedding the semiconductor layer, the insulating film and the extraction electrodes constituting the first TFT element into the sealing resin film from one side thereof;
(c) laminating the TFT element formation side of the second metal foil onto the other side of the sealing resin film, thereby embedding the semiconductor layer, the insulating film and the extraction electrodes constituting the second TFT element into the sealing resin film from the other side thereof; and
(d) etching the first metal foil and the second metal foil, thereby forming an electrode of the first TFT element and an electrode of the second TFT element;
wherein the first metal foil is used as a substrate for the semiconductor layer, the insulating film and the extraction electrodes constituting the first TFT element during the above steps (a) to (c), and used also as a constituent material for the electrode of the first TFT element during the above step (d); and
wherein the second metal foil is used as a substrate for the semiconductor layer, the insulating film and the extraction electrodes constituting the second TFT element during the above steps (a) to (c), and used also as a constituent material for the electrode of the second TFT element during the above step (d).

11. The method for manufacturing the flexible semiconductor device according to claim 10, wherein, in the step (d), a drain electrode and a source electrode constituting the first TFT element and a gate electrode constituting the second TFT element are formed by etching the first metal foil, and a gate electrode constituting the first TFT element and a drain electrode and a source electrode constituting the second TFT element are formed by etching the second metal foil.

12. The method for manufacturing the flexible semiconductor device according to claim 10, wherein, in the step (d), a drain electrode, a source electrode and a gate electrode constituting the first TFT element are formed by etching the first metal foil; and
a drain electrode, a source electrode and a gate electrode constituting the second TFT element are formed by etching the second metal foil.

* * * * *